United States Patent
Tanimoto

(10) Patent No.: US 6,658,635 B1
(45) Date of Patent: Dec. 2, 2003

(54) STATIC-DYNAMIC TIMING ANALYSIS METHOD AND STORAGE MEDIUM

(75) Inventor: Tadaaki Tanimoto, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/482,877

(22) Filed: Jan. 14, 2000

(30) Foreign Application Priority Data

Jan. 14, 1999 (JP) .......................................... 11-007429
Mar. 31, 1999 (JP) .......................................... 11-090558

(51) Int. Cl.$^7$ .............................................. G06F 9/45
(52) U.S. Cl. ............................................................ 716/6
(58) Field of Search ............................................. 716/6

(56) References Cited

U.S. PATENT DOCUMENTS 5,579,510 A * 11/1996 Wang et al. .................... 716/6
5,650,938 A * 7/1997 Bootehsaz et al. ............. 716/6

* cited by examiner

Primary Examiner—John F. Niebling
Assistant Examiner—Stacy Whitmore
(74) Attorney, Agent, or Firm—Antonelli, Terry, Stout & Kraus, LLP

(57) ABSTRACT

The timing for a mixed circuit of a synchronous circuit and an asynchronous circuit classifies the synchronous circuit into a cyclic circuit and an acyclic circuit, and the asynchronous circuit into a cyclic circuit and an acyclic circuit. The cyclic circuit of the synchronous circuit and the cyclic circuit of the asynchronous circuit thus classified are subjected to a static timing analysis, whereas the acyclic circuit of the synchronous circuit and the acyclic circuit of the asynchronous circuit thus classified are subjected to a dynamic timing analysis. As a result, the timing analysis can be made considering a hazard of the synchronous circuit, and the circuit to be operated in response to a signal, as can be virtually deemed as a clock, is subjected to the static timing analysis so that the analyzing operation can be made efficient.

12 Claims, 35 Drawing Sheets

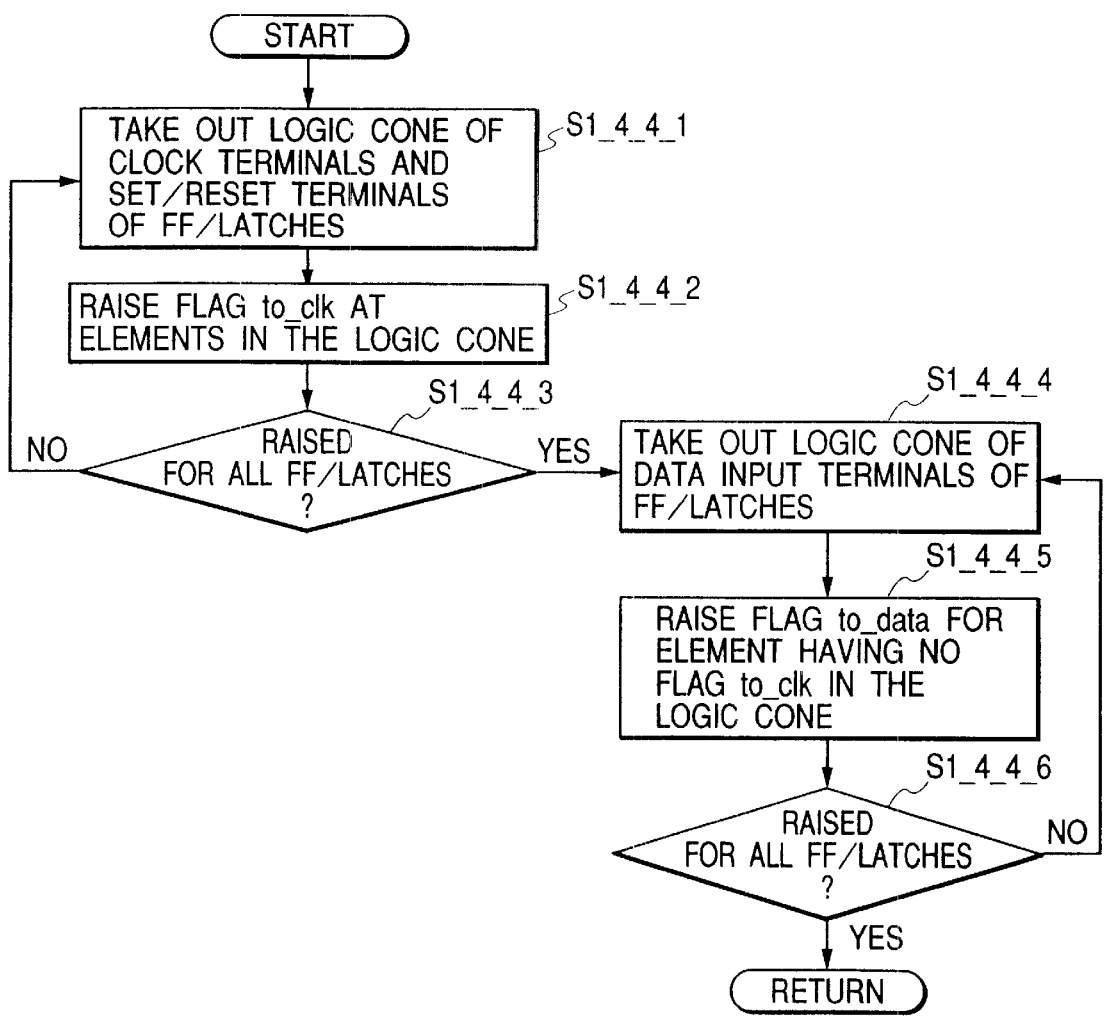

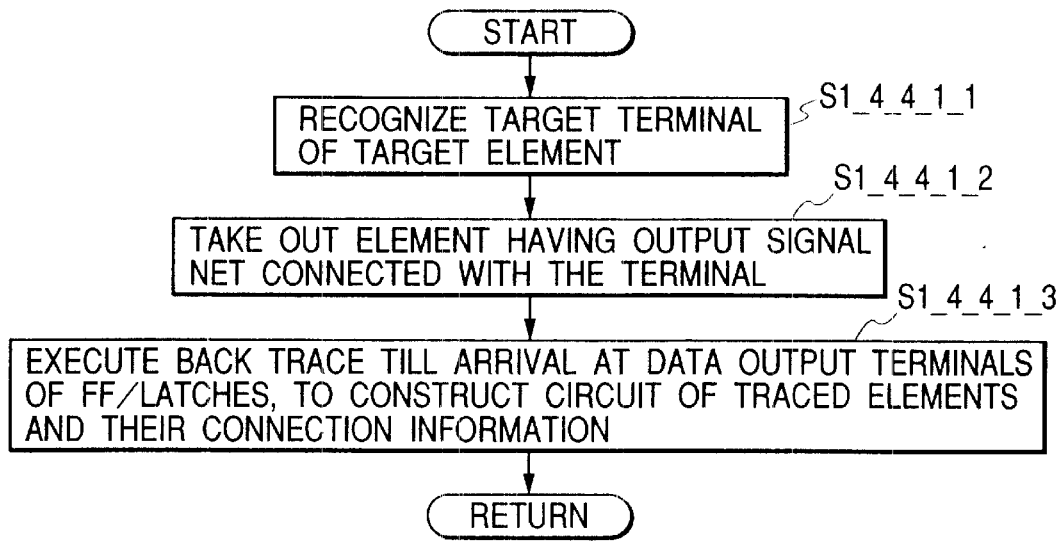
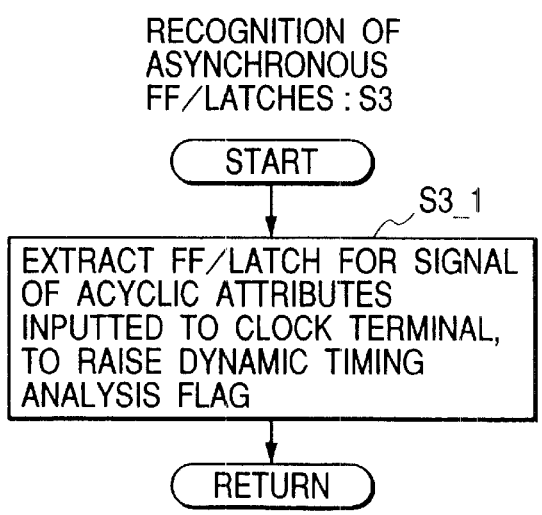
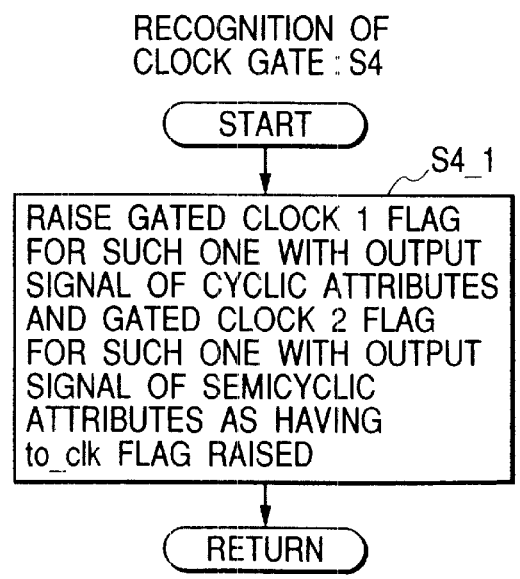

EXAMPLE OF COUNTER CANDIDATE CIRCUIT

EXAMPLE OF ATTRIBUTE CALCULATION CIRCUIT

EXAMPLE OF SORTING CIRCUIT

EXAMPLE OF LOGIC CONE CIRCUIT

EXAMPLE 1 OF CLOCK SELECTING CIRCUIT

EXAMPLE 2 OF CLOCK SELECTING CIRCUIT

EXAMPLE OF ASYNCHRONOUS FLIP-FLOP · LATCH CIRCUIT

FIG. 37

| | | CLOCK | |
|---|---|---|---|
| | | CYCLIC | ACYCLIC |
| CIRCUIT | SYNCHRONOUS | ① SIGNAL TRANSFERS BETWEEN FLIP-FLOP FED AT CLOCK TERMINALS WITH SIGNALS FROM EXTERNAL CLOCK INPUT TERMINALS AND LATCH | CIRCUIT HAVING POSSIBILITY OF GENERATING GLITCH OR HAZARD IN CLOCK SIGNAL AS CIRCUIT CONSTRUCTION ① ② |
| | ASYNCHRONOUS | SIGNAL TRANSFER BETWEEN FLIP-FLOP FED WITH CLOCK INTERNALLY GENERATED, GATED CLOCK OR CLOCK TO BE VERTICALLY SET WITH CLOCK, AND LATCH | OTHERS ④ |
| ANALYSIS | | STATIC TIMING ANALYSIS ③ | DYNAMIC TIMING ANALYSIS |

FIG. 38

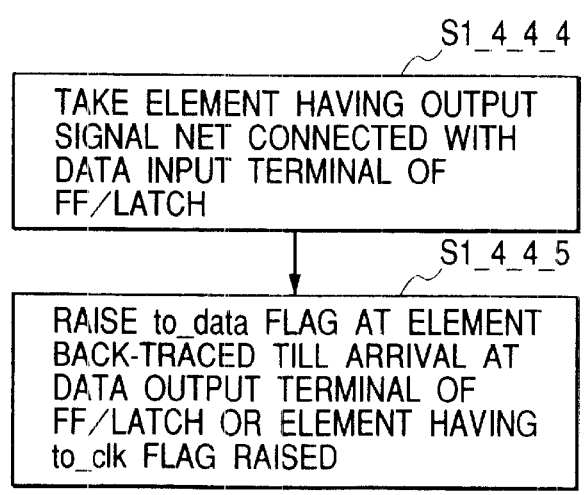

STATIC-DYNAMIC TIMING ANALYSIS METHOD AND STORAGE MEDIUM

BACKGROUND OF THE INVENTION

The present invention relates to a designing analysis technique of an electric/electronic circuit (e.g., not only an electric circuit or a semiconductor integrated circuit but also an electronic circuit packaging the semiconductor integrated circuit) and, more particularly, to a static-dynamic timing analysis division sharing a static analysis and a dynamic analysis for a circuit to be subjected to the designing analysis (a circuit to be analyzed), a timing analysis method, and a storage medium stored with a program for causing a computer to execute the analysis method.

In the timing analysis of the electric/electronic circuit, a static timing analysis or both a dynamic timing analysis and a static timing analysis can be adopted in place of the dynamic timing analysis so as to improve the operating efficiency of the timing analysis.

The analysis flow adopting the aforementioned static timing analysis and dynamic timing analysis can be exemplified by a flow shown in FIG. 2. In FIG. 2: numeral 21 designates a circuit connection information to be analyzed; numeral 22 a timing designation and clock designation information of input/output signals; numeral 23 a conventional static timing analysis device; numeral 24 a signal information (pattern); numeral 25 a dynamic timing analysis device; and numeral 26 a circuit design phase. For the static timing analysis made in the static timing analysis device 23, basically, the signal information of the individual circuit elements by a simulation is not required, but the timing and clock designations 22 of the input/output signals are performed to find out the slowest path (or critical path) between latches, and a setup timing analysis is made on whether or not the signal transmission on that critical path is better in time than the clock cycle. In the static timing analysis, moreover, the fastest path is found out among the latches, and a hold timing analysis is made on whether or not next data are to be fetched at the timing of the same clock. In the dynamic timing analysis made in the dynamic timing analysis device 25, the signal information (or test pattern), as designated by 24, of the individual circuit elements by the simulation is required, and the circuit connection of the analyzed circuit is activated for the simulation by inputting the signal information to the input terminals of the circuit connection information, as designated by 21.

The timing analysis system for the electric/electronic circuit of the prior art is disclosed in Japanese Patent Laid-Open Nos. 198723/1998, 44590/1995 and 50499/1997, for example.

The technique, as disclosed in Japanese Patent Laid-Open No. 198723/1998, warrants the timing only by the static timing analysis for such one of the electric/electronic circuits as is provided in a mixed manner with a synchronous circuit synchronizing with a specific clock signal and an asynchronous circuit having no specific clock or failing to synchronize with the specific clock signal.

Japanese Patent Laid-Open No. 50449/1998 provides a technique for discriminating a synchronous circuit portion and an asynchronous circuit portion from a synchronous/asynchronous mixed circuit to make the static timing analysis for the discriminated synchronous circuit portion and the dynamic timing analysis for the discriminated asynchronous circuit portion.

In this technique of the publication, however, there is made neither a hazard (or spike noise) analysis for warranting the normal circuit operation at the synchronous circuit portion nor the application of the static timing analysis to the asynchronous circuit portion.

The circuit analysis system, as disclosed in Japanese Patent Laid-Open No. 44590/1995, decides whether or not a spike noise generating circuit is present in the circuit to be analyzed. However, the system is defective in that the analysis method is low in reliability.

SUMMARY OF THE INVENTION

In the timing analysis technique of the electric/electronic circuit, the static timing analysis of the prior art analyzes the timing of only a synchronous circuit of a designated clock. This makes it essential to designate the clocks individually. In the case of a hazard analysis for warranting the normal circuit operation at the synchronous circuit portion, moreover, the hazard analysis has to be made for the dynamic timing analysis by searching the portions individually. For the hazard analysis, it is insufficient to use the circuit analysis system, as disclosed in Japanese Patent Laid-Open No. 44590/1995.

Therefore, the timing analysis cannot be made unless it is possible to designate the clocks or to extract the circuit portion which may cause a hazard.

In this regard, we have clarified that when there is in an object circuit a clock generating circuit constructed of a circuit capable of being deemed as an arbitrary counter circuit, there arises a problem that it takes a long time to prepare the information for designating the clock and the instruction information for the setup analysis and hold analysis of the clock gate which has been frequently used in resent years for lowering the electric power. It has also been found that the analysis on whether or not the instruction information is correctly given for the aforementioned setup analysis and hold analysis cannot be made without analyzing the static timing analysis results to discriminate the pseudo errors manually thereby to take a number of steps for the analyses.

Moreover, the user has been required for inefficient works to select a circuit portion needing the hazard analysis of the synchronous circuit portion and to perform another operation for the circuit portion. It is less efficient to analyze the circuit portion requiring the hazard analysis manually. Even when the dynamic timing analysis method is used, there is required an inefficient work to teach the dynamic timing analysis device the circuit portion requiring the hazard analysis. It is thought that even the use of the circuit analysis system disclosed in Japanese Patent Laid-Open No. 44590/1995 is insufficient for pointing out the circuit portion requiring the hazard analysis.

An object of the invention is to provide a static-dynamic timing analysis method capable of making a highly reliable timing analysis efficiently and a storage medium stored with a program for causing a computer to execute the method.

Another object of the invention is to provide a static-dynamic timing analysis method capable of performing the extraction of the clock information of a synchronous/asynchronous mixed circuit efficiently and a storage medium stored with a program for causing a computer to execute the method.

Still another object of the invention is to provide a static-dynamic timing analysis method capable of performing the timing analysis considering the hazard occurrence probability in the synchronous/asynchronous mixed circuit efficiently and a storage medium stored with a program for causing a computer to execute the method.

A further object of the invention is to provide a static-dynamic timing analysis method capable of performing a highly reliable timing analysis considering the clock information and the hazard occurrence probability in the synchronous/asynchronous mixed circuit efficiently and a storage medium stored with a program for causing a computer to execute the method.

The foregoing and other objects and novel features of the invention will become apparent from the following description to be made with reference to the accompanying drawings.

BRIEF DESCRIPTION OF THE DRAWINGS

FIG. 8 is a flow chart showing one example of the internal operation of step S1_4_4 of FIG. 7;

FIG. 9 is a flow chart showing one example of the internal operation of Step S1_4_4_1 of FIG. 8;

FIG. 10 is a flow chart showing one example of the internal operation of Step S3 of FIG. 4;

FIG. 11 is a flow chart showing one example of the internal operation of Step S4 of FIG. 4;

FIG. 37 is an explanatory diagram showing a fundamental concept in its entirety on the divisions of a static timing analysis and a dynamic timing analysis for a synchronous/asynchronous mixed circuit by the static-dynamic timing analysis system according to the invention;

FIG. 38 is an explanatory diagram showing the steps of operations which can be replaced by those of Steps S1_4_4_4 and S1_4_4_5 of FIG. 8;

Figure 1:
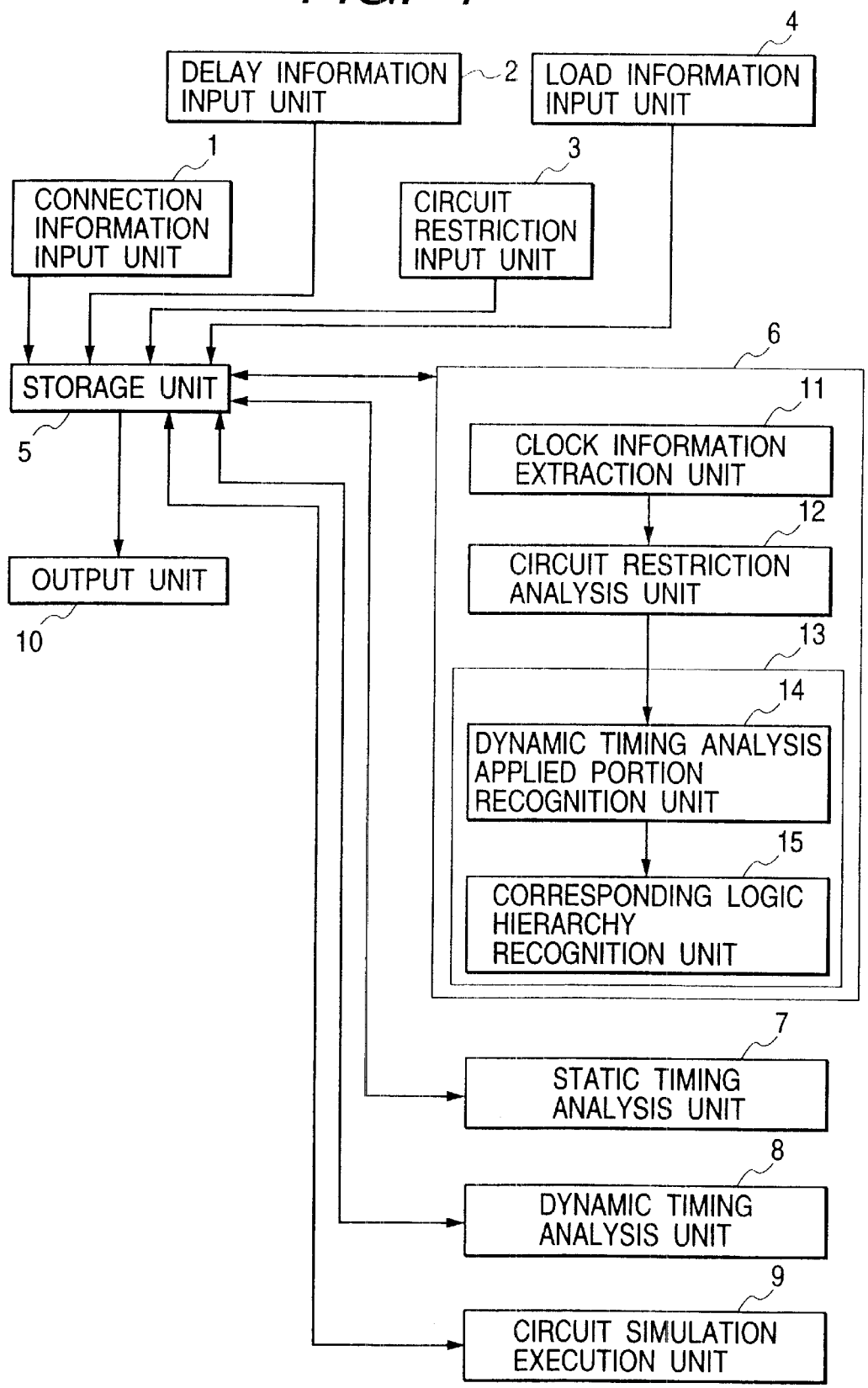
FIG. 1 is a block diagram showing one example of a static-dynamic timing analysis system in its entirety according to the invention.
Figure 2:
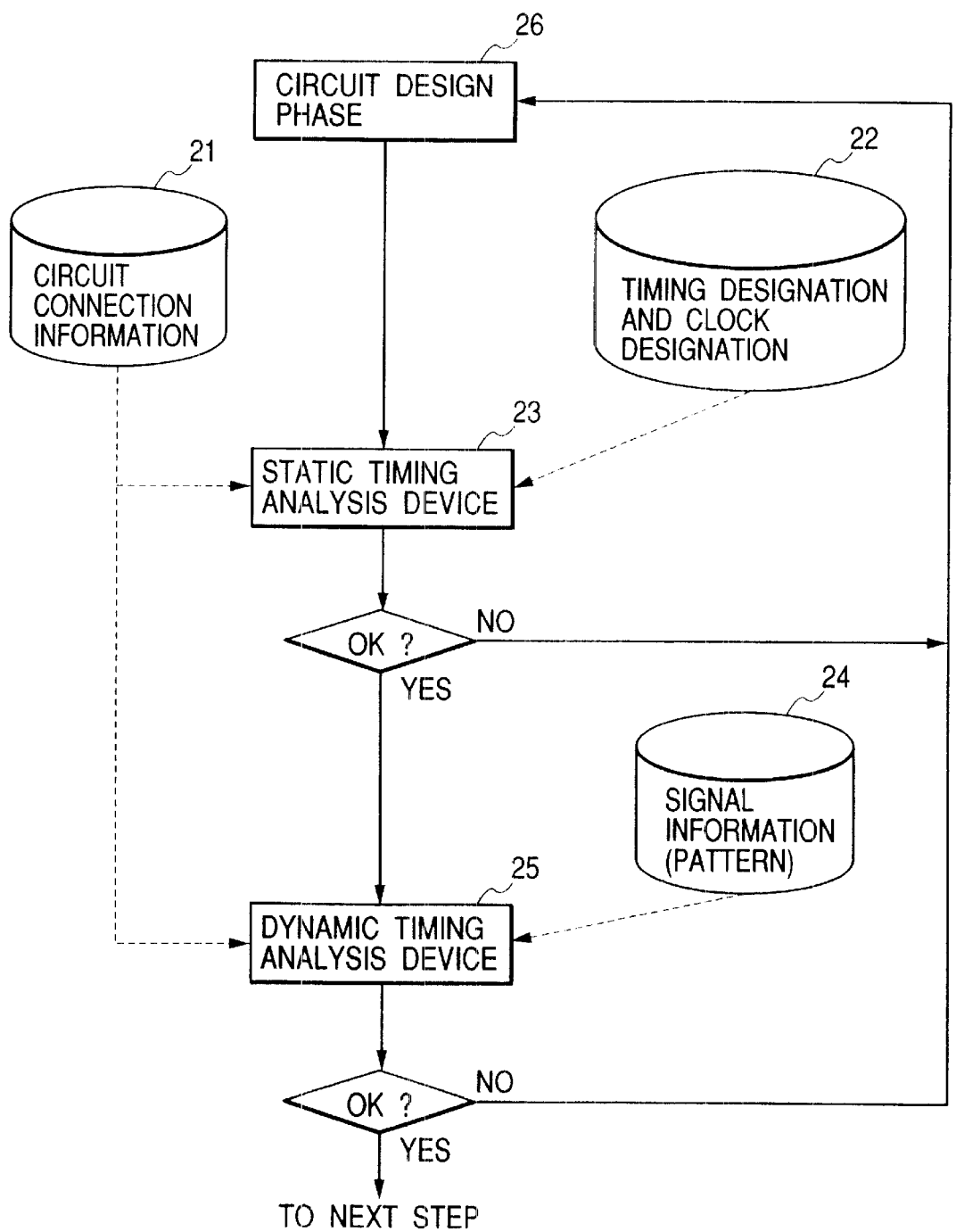
FIG. 2 is a flow chart showing the operations of one example of a static-dynamic timing analysis system, as has been examined by us, in its entirety.

Representatives of the invention to be disclosed herein will be briefly described in the following.

Specifically, the timing analysis of the prior art for the synchronous/asynchronous mixed circuit is made, as shown in FIG. 37, such that the static timing analysis is assigned to the synchronous circuits (①, ②) whereas the dynamic timing analysis is assigned to the asynchronous circuits (③, ④). In the static-dynamic timing analysis circuit according to the invention, the cyclic/acyclic points of view are introduced into the synchronous/asynchronous circuits, as exemplified in FIG. 37. Specifically, the synchronous/asynchronous mixed circuit is classified into the synchronous circuit and the asynchronous circuit from the view point of whether or not it is synchronized with a clock signal defined uniquely by the aforementioned external clock terminals, clock tree and so on. The aforementioned synchronous circuit is classified into the cyclic circuit (①) and the acyclic circuit (②), and the aforementioned asynchronous circuit is classified into the cyclic circuit (③) and the acyclic circuit (④). Moreover, the cyclic circuit (①) of the synchronous circuit and the cyclic circuit (③) of the asynchronous circuit are subjected to the static timing analysis, and the acyclic circuit (②) of the synchronous circuit and the acyclic circuit (④) of the asynchronous circuit are subjected to the dynamic timing analysis. In short, in the synchronous/asynchronous mixed circuit, all the synchronous circuits that are operated in synchronism with the clock signal specified uniquely by the external clock terminal, clock tree and so on are not subjected to the static timing analysis, but the circuit portion which may cause a hazard or the like is extracted and is subjected as the acyclic operation circuit portion (the acyclic circuit) in the synchronous circuit to the dynamic timing analysis. In the synchronous/asynchronous mixed circuit, on the other hand, all the asynchronous circuits that neither use nor are operated in synchronism with the clock signal specified uniquely by the external clock terminal, clock tree and so on are not subjected to the dynamic timing analysis, but the circuit portion which is fed with a signal, e.g., a stroke signal or a gated clock capable of being deemed as a virtual clock signal is extracted and is subjected as the cyclic operation circuit portion (the cyclic circuit) in the asynchronous circuit to the static timing analysis. From the view points thus far described, the static-dynamic timing analysis method according to the invention will be described in more detail.

[1] The static-dynamic timing analysis method has a static-dynamic timing analysis dividing operation by a static-dynamic timing analysis division unit (6) for determining the application of the static timing analysis or the dynamic timing analysis to an object circuit of the timing analysis. This static-dynamic timing analysis dividing operation includes a clock information recognizing operation to discriminate counter means (circuit means for generating a synchronous signal) in the object circuit and to discriminate the clock information in the object circuit (at S6) on the basis of the information (at S1_3) of the discriminated counter means. This clock information recognizing operation is performed in a clock information recognition unit (11). By the aforementioned clock information recognizing operation, the information of the internally generated clock can be automatically recognized from the clock information to the external input pin fed with the clock signal, from the information of the external input pin fed with a set or reset signal, and from the information of the flip-flop or latch elements to be used for the synchronous/asynchronous set/reset or the synchronous/asynchronous load of the counter in the object circuit. As a result, it is easy to discriminate the synchronous circuit and the asynchronous circuit of the object circuit.

[2] In the item [1], the aforementioned clock information recognizing operation is based on the information discriminated thereby to discriminate (at S3) from the object circuit the asynchronous transfer path between the synchronous circuit portion and the asynchronous circuit portion and the asynchronous transfer path between the synchronous circuit portions. In short, what is extracted is the circuit portion which requires no timing analysis. Since the aforementioned asynchronous transfer path is recognized, the data transfer path (i.e., the asynchronous transfer path requiring the timing analysis) through the flip-flops and latches fed with the acyclic signal in the object circuit as the clock, and the data transfer path (i.e., the asynchronous transfer path requiring no timing analysis) between the flip-flops and latches fed with the signals asynchronous from each other, i.e., the signals incapable of defining the phase difference between the foregoing signals when the power is ON can be recognized as the different asynchronous transfer paths.

[3] In the item [1], the aforementioned clock information recognizing operation is based on the information discriminated thereby to recognize (at S4) the logic elements constructed the gated clock in the object circuit. When the signal having two or more clock attributes is inputted to the logic elements constructing the recognized gated clock (FIG. 31, FIG. 32), it is decided (at S9) whether or not it is necessary to execute the setup analysis and the hold analysis of the gated clock, and it is decided (at S10) what of the input signals having the aforementioned clock attributes the setup analysis and the hold analysis of the gated clock are to be executed with respect to. As a result, the instruction information for the setup/hold analyses of the gated clock by the static timing analysis can be prepared to execute all the setup/hold analyses of the gated clock by the static timing analysis.

Figure 36:
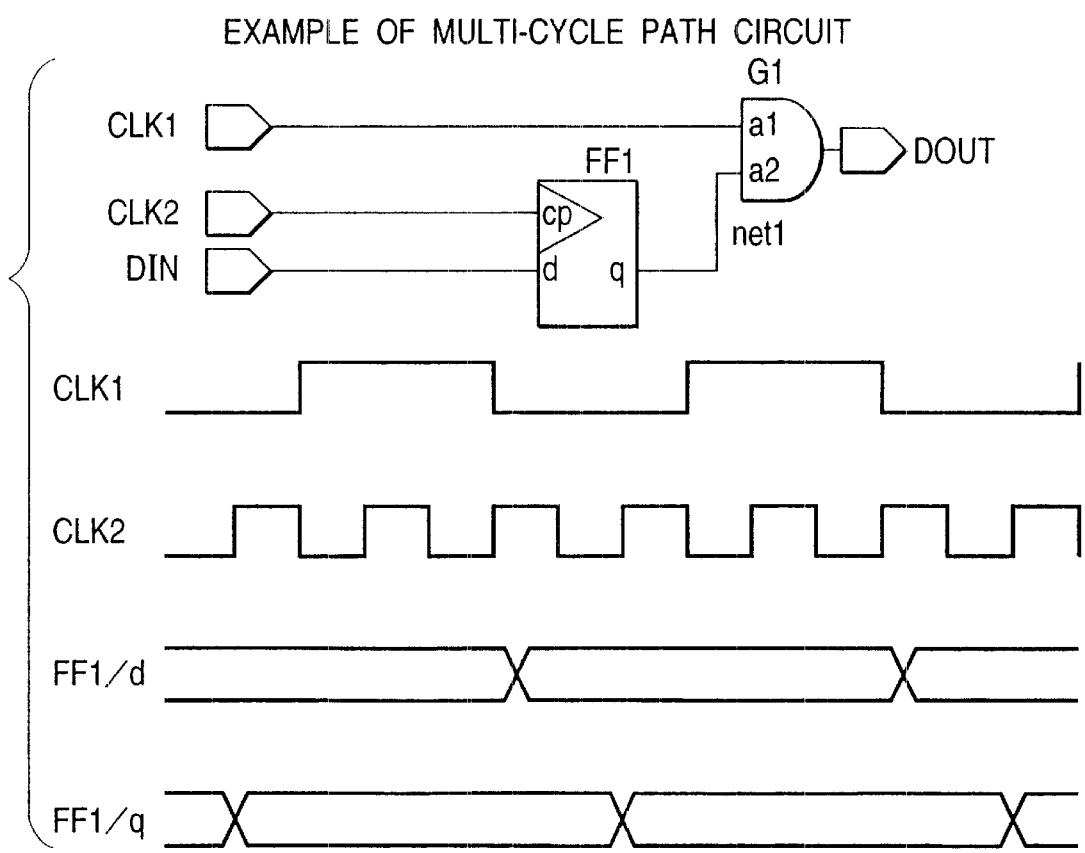
FIG. 36 is a circuit diagram of a multicycle-path circuit as an example of the object circuit.

[4] In the item [1], the aforementioned clock information recognizing operation is based on the information discriminated thereby to discriminate (at S4) the logic elements constructing the gated clock in the object circuit and to discriminate (at S9) whether or not the input signal with no clock attribute and to the logic elements constructing the discriminated gated clock belongs to a multi-cycle path, as exemplified in FIG. 36. Since the multi-cycle path of the input signal with no clock attribute and to the logic elements constructing the gated clock is thus recognized, it is possible to execute the setup/hold analyses of the gated clock by the static timing analysis from which the pseudo error has been eliminated in advance.

[5] In the item [1], the aforementioned clock information recognizing operation is based on the aforementioned information discriminated thereby to discriminate (at S2) the logic elements constructing the selection logic of the clock in the object circuit. In the recognizing of the data transfer path between the flip-flops and the latches, therefore, it is possible to analyze in advance the combination of the clocks to be fed to the flip-flops and the latches at the two ends of the aforementioned data transfer path.

[6] In the item [1], the aforementioned static-dynamic timing analysis dividing operation is further based on the information discriminated in the clock information recognizing portion thereby to decide whether or not a virtual clock can be defined with respect to the flip-flops and latches which are fed at their terminals with a signal other than the clock, and to set (at S7) the virtual clock with respect to such flip-flops and latches fed at their clock terminals with the signal other than the clock as decided capable to define the virtual clock. Thus, the virtual clock is set by deciding whether or not the virtual clock can be defined with respect to the flip-flops and latches which are fed at their terminals with the signal other than the clock, so that the static timing analysis can also be applied to the asynchronous circuit. In other words, the asynchronous circuit is classified into the cyclic circuit and the acyclic circuit so that the static timing analysis can be applied to the cyclic circuit. As a result, it is possible to reduce the number of analyzing steps drastically. If the virtual clock is set to make the setup time and the hold time the most strict, moreover, the static timing analysis for the aforementioned asynchronous circuit can be made under the most strict condition.

[7] In the item [1], the aforementioned static-dynamic timing analysis dividing operation further includes an applying circuit portion recognizing operation to discriminate a static timing analysis applying circuit portion and a dynamic timing analysis applying circuit portion in the object circuit on the basis of the information discriminated by said clock information recognizing operation.

This operation is performed at the applying circuit portion recognition unit (13). Since the static timing analysis applying circuit portion and the dynamic timing analysis applying circuit portion can be thus discriminated, it is possible to execute the recognition of the circuit portion requiring the hazard analysis at the synchronous circuit portion and the dynamic timing analysis to that circuit portion.

[8] In the item [7], the aforementioned applying circuit portion recognizing operation recognizes (at S11) the dynamic timing analysis applying circuit portion so far as to cover the appearance of the flip-flop along the transmission path of the signals to the discriminated dynamic timing analysis applying circuit portion which is discriminated by the discrimination unit for discriminating the static timing analysis applying circuit portion and the dynamic timing analysis applying circuit portion. As a result, the dynamic timing analysis of the dynamic timing analysis applying circuit portion can be executed without considering the signal delay time in the data transfer path to the dynamic timing analysis applying circuit portion from the static timing analysis applying circuit portion.

[9] In the item [7], the aforementioned applying circuit portion recognizing operation discriminates (at S11) the correspondence between the dynamic timing analysis applying circuit portion, which is discriminated by the recognition unit for discriminating the static timing analysis applying circuit portion and the dynamic timing analysis applying circuit portion, and the logic hierarchy in the object circuit. Since the correspondence between the dynamic timing analysis applying circuit portion and the logic hierarchy in the object circuit is thus discriminated, it is possible to recognize the logic hierarchy to execute the dynamic timing analysis. As a result, the input signal information to each logic hierarchy, as prepared at the logic analyzing time, can be diverted to execute the dynamic timing analysis thereby to expect the reduction in the number of analyzing steps.

[10] In the item [1], the aforementioned applying circuit portion recognizing operation: discriminates (at S11_8_1) the flip-flops and latches outside of the aforementioned dynamic timing analysis applying circuit portion along the transmission path of the signal from the flip-flop, as the closest to the input terminals and the output terminals of the static timing analysis applying circuit portion discriminated thereby, in the dynamic timing analysis applying circuit portion; and adjusts (at S11_8_2) the propagation delay of the clock signal to the flip-flop and latch discriminated by the aforementioned recognition unit, such that the dynamic timing analysis can be made merely by applying it as the propagation delay of the clock signal to the aforementioned dynamic timing analysis applying circuit portion and the flip-flops and latches in the aforementioned dynamic timing analysis applying circuit portion at the time of feeding the object circuit with only the delay information. As a result, by feeding the delay information to only the dynamic timing analysis applying circuit portion, it is possible to execute the dynamic timing analysis of the entire object circuit and to divert the input signal information of the entire object circuit, as prepared at the logic analyzing time. Thus, it is possible to expect the reductions in the time period for and the step number of the analyses.

[11] Especially, an analysis method noting the discrimination of the asynchronous transfer path comprises a static-dynamic timing analysis dividing operation to decide which of a static timing analysis or a dynamic timing analysis is to be applied to an object circuit for the timing analysis, and the aforementioned static-dynamic timing analysis dividing operation includes a clock information recognizing operation to discriminate a counter portion in the object circuit and to discriminate the clock information in the object circuit on the basis of the information of the discriminated counter portion. Moreover, the aforementioned clock information recognizing operation performs an asynchronous transfer path extracting operation (at S5) to discriminate an asynchronous transfer path with a synchronous circuit portion and an asynchronous circuit portion in the object circuit and an asynchronous transfer path between synchronous circuit portions individually on the basis of the aforementioned discriminated information. Moreover, the aforementioned asynchronous transfer path extracting operation: admits the passage of an in-element path from a clock terminal to a data output terminal so as to recognize elements constructing an asynchronous transfer path; recognizes an operation to express a clock path passing from an external terminal through the element having admitted the aforementioned passage in a graph joining clock sources, an operation (at S5_1) to grasp a set of elements using the clock sources of the graph, and a data transfer between the elements using the clock sources of the aforementioned graph as clock sources and the elements not using the clock sources of the aforementioned graph as clock sources, as an asynchronous transfer for each of the aforementioned recognized graphs; recognizes the aforementioned path as the asynchronous transfer at all times if the elements of the path recognized as the asynchronous transfer use the apexes of the graphs different before and after the selection logic as the clock sources; and recognizes (at S5_2) the aforementioned path as the asynchronous transfer in accordance with the selected state of the selection logic if the elements of the path recognized as the asynchronous transfer use the apexes of the graphs identical before and after the selection logic as the clock sources.

As compared with the method for grasping the clock path by making divisions for every clock selection logics as in the multiplexer, the asynchronous transfer path extracting operation has less operation data by a computer so that the memory capacity necessary for the computer to operate and prepare the table can be reduced to complete the data processing quickly.

By storing and providing the program for causing the computer to execute the aforementioned static-dynamic timing analysis method in a computer-readable storage medium such as the floppy disk or the CD-ROM, the aforementioned static-dynamic timing analysis method can be easily practiced.

The storage medium is exemplified by storing a program for causing the computer to execute: a first operation to discriminate a counter unit in an object circuit to be subjected to a timing analysis; a second operation to discriminate clock information in the object circuit on the basis of the information of the discriminated counter portion; a third operation to discriminate a static timing analysis applying circuit portion and a dynamic timing analysis applying circuit portion in the object circuit on the basis of the discriminated clock information; a fourth operation to perform the static timing analysis on the basis of the result of the aforementioned third operation; and a fifth operation to perform the dynamic timing analysis on the basis of the result of the aforementioned third operation.

A storage medium according to another aspect of the invention is stored with the program for causing a computer to execute: an operation to extract such a synchronous circuit portion in a synchronous/asynchronous mixed circuit of the synchronous circuit and an asynchronous circuit as may cause an acyclic malfunction, and to make a dynamic timing analysis of the circuit portion as an acyclic circuit; and an operation to extract such an asynchronous circuit portion in the aforementioned synchronous/asynchronous mixed circuit as may be fed with a signal capable of being deemed as a virtual clock signal, and to make a static timing analysis of the aforementioned circuit portion as a cyclic circuit.

A storage medium according to still another aspect of the invention is recorded with a program for causing a computer to execute: classifying, for a synchronous/asynchronous mixed circuit for a clock signal, a synchronous circuit into a cyclic circuit and an acyclic circuit and an asynchronous circuit into a cyclic circuit and an acyclic circuit; making a static timing analysis for the cyclic circuit of the synchronous circuit and the cyclic circuit of the asynchronous circuit; and making a dynamic timing analysis for the acyclic circuit of the synchronous circuit and the acyclic circuit of the asynchronous circuit.

DESCRIPTION OF THE PREFERRED EMBODIMENTS

<<Construction of Static-Dynamic Timing Analysis Device>>

FIG. 1 shows one example of a static-dynamic timing analysis device. In FIG. 1, reference numeral 5 designates a storage unit constructed of semiconductor storage elements and so on, and numeral 1 designates a connection information input unit for storing the storage unit 5 with the connection information of an object circuit, i.e., the information on the kinds of the elements constructing the object circuit and their connection states containing external input/output pins. Numeral 2 designates a delay information input unit for inputting the delay information of the individual elements, timing restriction information and so on and for storing them in the storage unit 5. Numeral 3 designates a circuit restriction input unit for storing the storage unit 5 with the circuit restrictions for preventing any hazard from being caused, that is, the information on the restrictions on the kinds of elements constructing an input logic function to such terminals, e.g., the clock terminal and the asynchronous set/reset terminal of a flip-flop in the object circuit as may highly probably cause an erroneous action of the circuit when a hazard signal is inputted, and on their connection states containing the external input/output pins. Numeral 4 designates a load information input unit for inputting the resistance/capacity/inductance intrinsic to a circuit to be analyzed, and the resistance/capacity/inductance of the lines on the packaging substrate of the analyzed circuit and for storing them in the storage unit 5.

A static-dynamic timing analysis division unit 6 recognizes a clock tree in the object circuit, a clock generating circuit constructed of a circuit, as can be deemed as an arbitrary counter, the waveform of an internally generated clock, elements constructing a clock gate, elements constructing a clock selecting logic and an asynchronous flip-flop/latch, and stores them in the storage unit 5. On the other hand, the static-dynamic timing analysis division unit 6 analyzes whether or not the circuit construction satisfies the circuit restriction, as given in the circuit restriction input unit 3, for preventing any hazard from being caused, and stores the analysis result in the storage unit 5. Moreover, the static-dynamic timing analysis division unit 6: defines a clock waveform for such one of the asynchronous flip-flops/latches discriminated as is decided to cause no hazard in the signal to the clock terminal and stores it in the storage unit 5; discriminates a dynamic timing analysis applying portion in the object circuit and stores it in the storage unit 5; recognizes the correspondence between the discriminated dynamic timing analysis applying portion and the logic hierarchy in the object circuit and stores it in the storage unit 5; and calculates the construction ratio between the static timing analysis applying portion and the dynamic timing analysis applying portion in each logic hierarchy and stores it in the storage unit 5.

Numeral 7 designates a static timing analysis unit for performing the timing analysis of a circuit portion other than the dynamic timing analysis applying portion, as discriminated by static-dynamic timing analysis division unit, by a static timing analysis method. Numeral 8 designates a dynamic timing analysis unit for performing the timing analysis of the dynamic timing analysis applying portion, as discriminated by the static-dynamic timing analysis division unit 6, by a dynamic timing analysis method. Numeral 9 designates a circuit simulation execution unit for executing a circuit simulation by adding the resistance/capacity/inductance intrinsic to the package, as given by the load information input unit 3, and the resistance/capacity/inductance of the line on the board substrate to the clock tree accompanied by the arranging/wiring information after discriminated.

In the storage unit 5, there are written the individual timing analysis results by both the static timing analysis unit 7 and the dynamic timing analysis unit 8, and the circuit simulation execution result by the circuit simulation execution unit. As shown in FIG. 1, on the other hand, this device is provided with an output unit 10 for outputting the timing analysis result and the circuit simulation execution result to be stored in the storage unit 5.

The static-dynamic timing analysis division unit 6 forming a main portion of this device is provided with a clock information extraction unit 11, a circuit restriction analysis unit 12 and a circuit division unit 13. Moreover, this circuit division unit 13 is provided with a dynamic timing analysis applying portion recognition unit 14 and a corresponding logic hierarchy recognition unit 15.

The clock information extraction unit 11 outputs the object circuit information with the clock information and the asynchronous flip-flop/latch information to the circuit restriction analysis unit 8 and the storage unit 5 by propagating the information such as the waveform of the clock from the external clock pin of the object circuit and by recognizing the clock generating circuit constructed of an arbitrary counter in the object circuit, recognizing the elements constructing the clock gate and the elements constructing the selecting logic of the clock and recognizing the waveform of the clock internally generated by executing the simulation.

On the other hand, the output unit 10 outputs the object circuit information with the clock information and the asynchronous flip-flops/latches to be stored in the storage unit 5.

The circuit restriction analysis unit 12 outputs the circuit restriction analysis result to the circuit division unit 13 and the storage unit 5 by analyzing whether or not the circuit construction satisfies the circuit restriction given by the circuit restriction input unit 3 for preventing the hazard from being caused, and outputs the asynchronous clock waveform information to the circuit division unit 13 and the storage unit 5 by defining the clock waveform with respect to such one of the discriminated asynchronous flip-flops/latches as has been decided to cause no hazard in the signal to the clock terminal.

On the other hand, the output unit 10 outputs the circuit restriction analysis result and the asynchronous clock waveform information to be stored in the storage unit 5.

The dynamic timing analysis applying portion recognition unit 14 discriminates the static timing analysis applying portion and the dynamic timing analysis applying portion in the object circuit, and outputs the static timing analysis applying portion information, i.e, the information on the static timing analysis applying circuit portion to the storage unit 5 and the dynamic timing analysis applying portion information, i.e, the information on a dynamic timing analysis applying circuit portion to the corresponding logic hierarchy recognition unit 15 and the storage unit 5.

The corresponding logic hierarchy recognition unit 15 outputs the corresponding logic hierarchy information to the storage unit 5 by recognizing the correspondence between the discriminated dynamic timing analysis applying portion and the logic hierarchy in the object circuit, and outputs the logic hierarchy construction ratio information to the storage unit 5 by calculating the construction ratio between the static timing analysis applying portion and the dynamic timing analysis applying portion in each logic hierarchy. On the other hand, the corresponding logic hierarchy information and the logic hierarchy construction ratio information to be stored in the storage unit 5 are outputted by the output unit 10. This construction ratio is utilized for evaluating the re-usability as the design resources.

The static timing analysis unit 7 performs the timing analysis on the basis of the static timing analysis applying portion information outputted to the storage unit 5, and outputs the result to the storage unit 5.

The dynamic timing analysis unit 8 performs the timing analysis on the basis of the dynamic timing analysis applying portion information outputted to the storage unit 5, and outputs the result to the storage unit 5.

The circuit simulation execution unit 9 recognizes the object circuit information with the clock information, as accompanied by the arranging/wiring information, from the arranged/wired result on the basis of the object circuit information with the clock information, as outputted to the storage unit 5, and executes the circuit simulation on the basis of the resistance/capacity/inductance intrinsic to the package, as stored in the storage unit 5, and the resistance/capacity/inductance of the line on the board substrate and outputs the result to the storage unit 5.

<<Processing Procedure of Static-Dynamic Timing Analysis Device Unit>>

Figure 4:
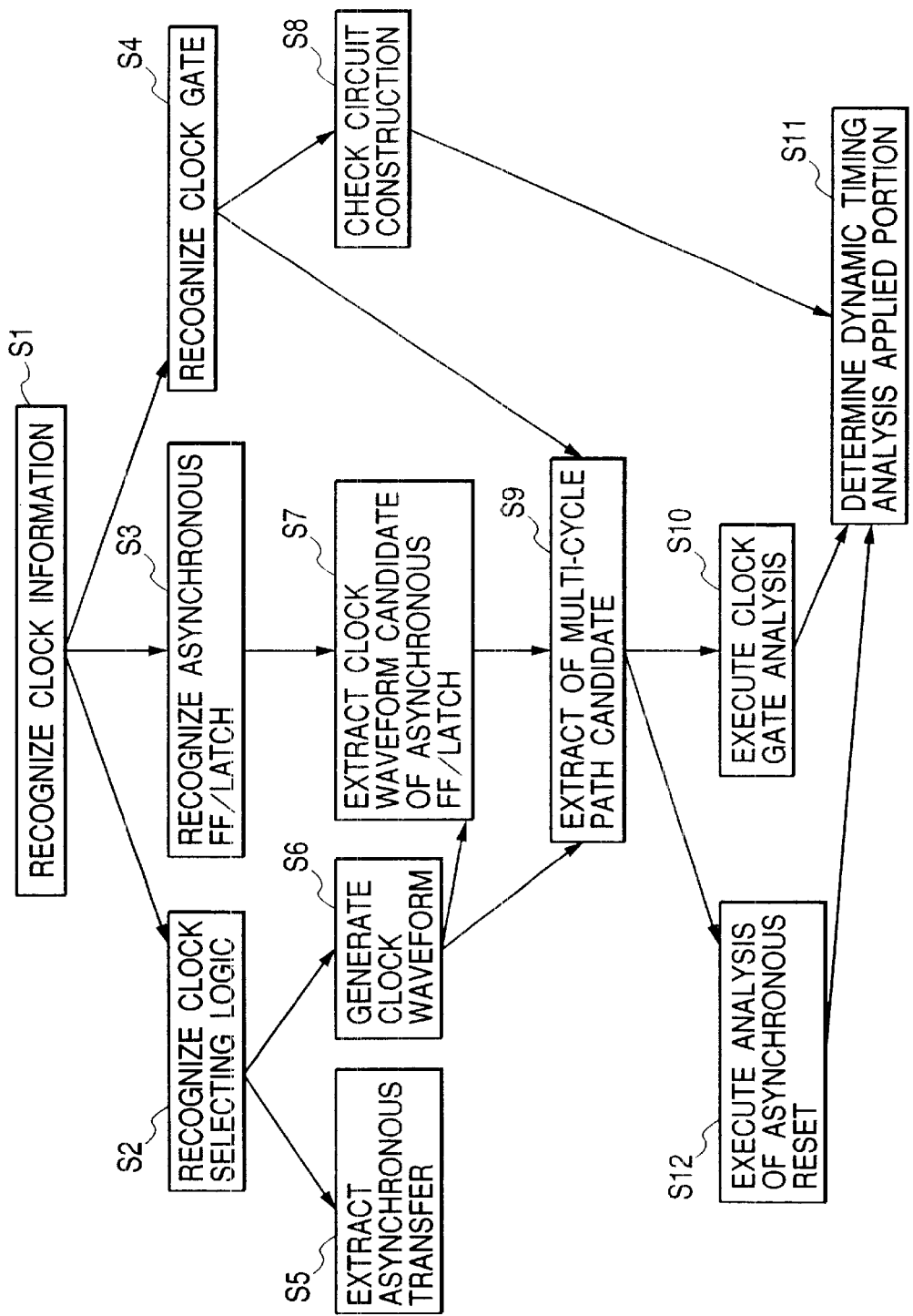
FIG. 4 is a flow chart showing one example of the operations of the static-dynamic timing analysis system, from a view point other than that of FIG. 3, according to the invention.

FIG. 4 is a flow chart showing a processing procedure by the device of FIG. 1. When the processing is started, as shown in FIG. 4, the clock information in the object circuit is recognized at first Step S1.

Next, on the basis of the clock information extracted at Step S1, the logic elements constructing the selecting logic of the clock, the flip-flops and the latches fed at their clock terminals with the acyclic signals, and the logic elements constructing the clock gate are recognized at Steps S2, S3 and S4, respectively. Here, in the accompanying drawings, the letters "FF" indicate the flip-flop, and the letters "Latch" indicate the latch.

At Step S5, a data transfer path between the flip-flops and the latches fed with the mutually asynchronous clocks is recognized on the basis of the clock information and the logic elements constructing the selecting logic of the clock.

At Step S6, on the basis of the clock information and the information of the logic elements constructing the selecting logic of the clock, the connection information of the circuit of only the elements to generate the clock or to be propagated by the clock is generated to narrow the portion for generating the clock. After this, the clock waveform is recognized at the clock generating portion by simulating the connection information of the circuit which is newly constructed by the logic simulator.

The operations of the foregoing Steps S1 to S6 are executed at the clock information extraction unit 11.

At Step S7, on the basis of the clock waveform information, a clock waveform candidate is defined with respect to the flip-flops and the latches which are fed at their clock terminals with the acyclic signals.

At Step S8, it is examined whether or not the circuit construction of the logic elements constructing the clock gate and the circuit construction of the logic elements to appear on the path to the enable terminal of a tristate buffer satisfy predetermined conditions.

At Step S9, on the basis of the clock waveform information and the information of the logic elements constructing the clock gate, it is decided whether or not the input signal path other than the clock to the logic elements constructing the clock gate may be a multi-cycle path.

The operations of the foregoing Steps S7 to S9 are executed in the circuit restriction analysis unit 12.

At Step S10, on the basis of the clock waveform information, the information of the logic elements constructing the clock gate and the information of the aforementioned multi-cycle path, the gated clock analysis is executed by the static timing analysis device. This Step S10 is executed at the static timing analysis unit 7.

At Step S12, the analysis of the asynchronous reset is executed.

Finally at Step S11, the applying portion of the dynamic timing analysis is determined on the basis of a circuit construction violation, a timing violation portion in the gated clock analysis, and the information of the flip-flops and the latches fed at their clock terminals with an acyclic signal having failed to be defined by the clock. This Step S11 is executed at the circuit division unit 13.

Figure 3:
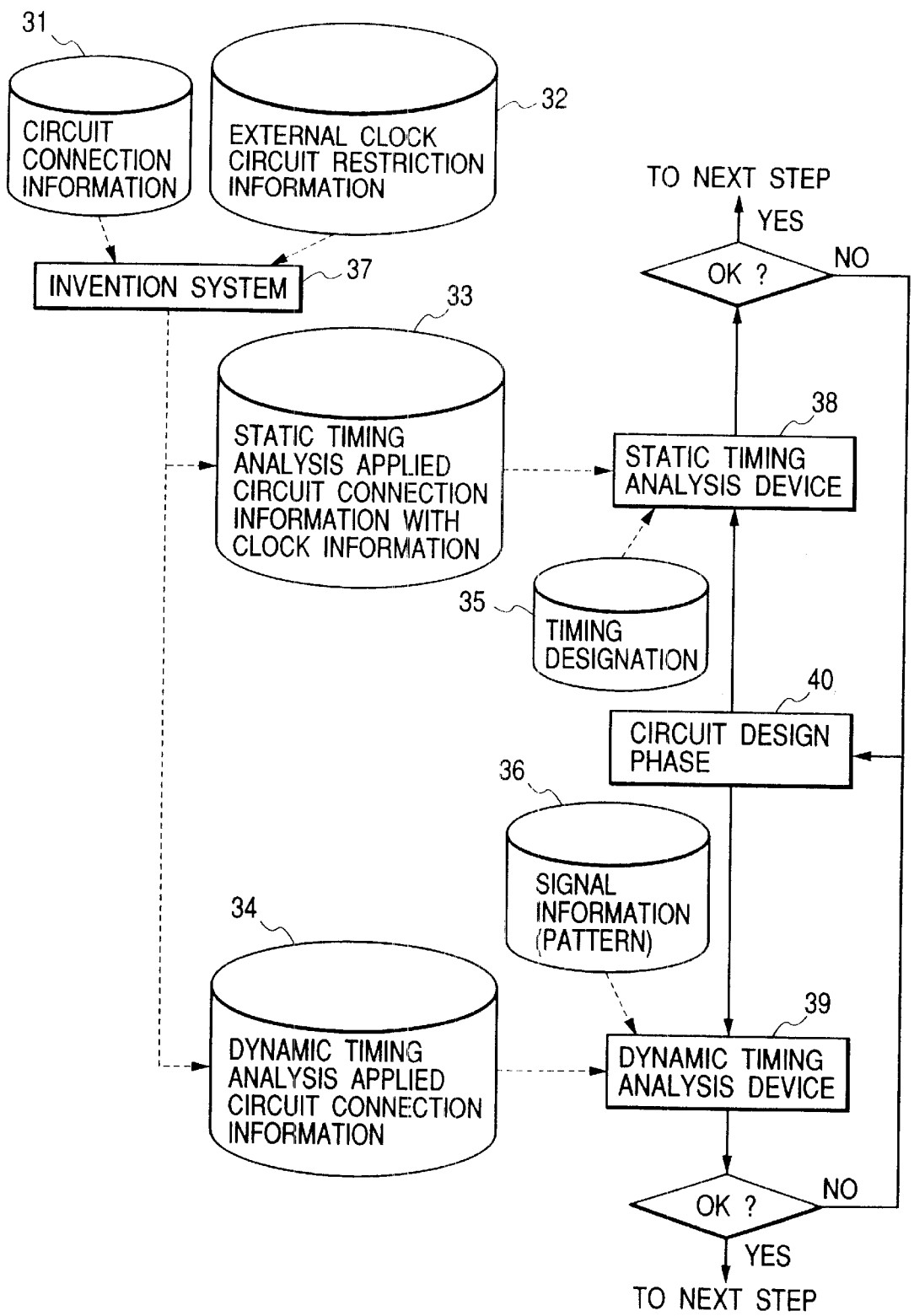
FIG. 3 is a flow chart showing one example of the operations of the static-dynamic timing analysis system in its entirety according to the invention.
Figure 5:
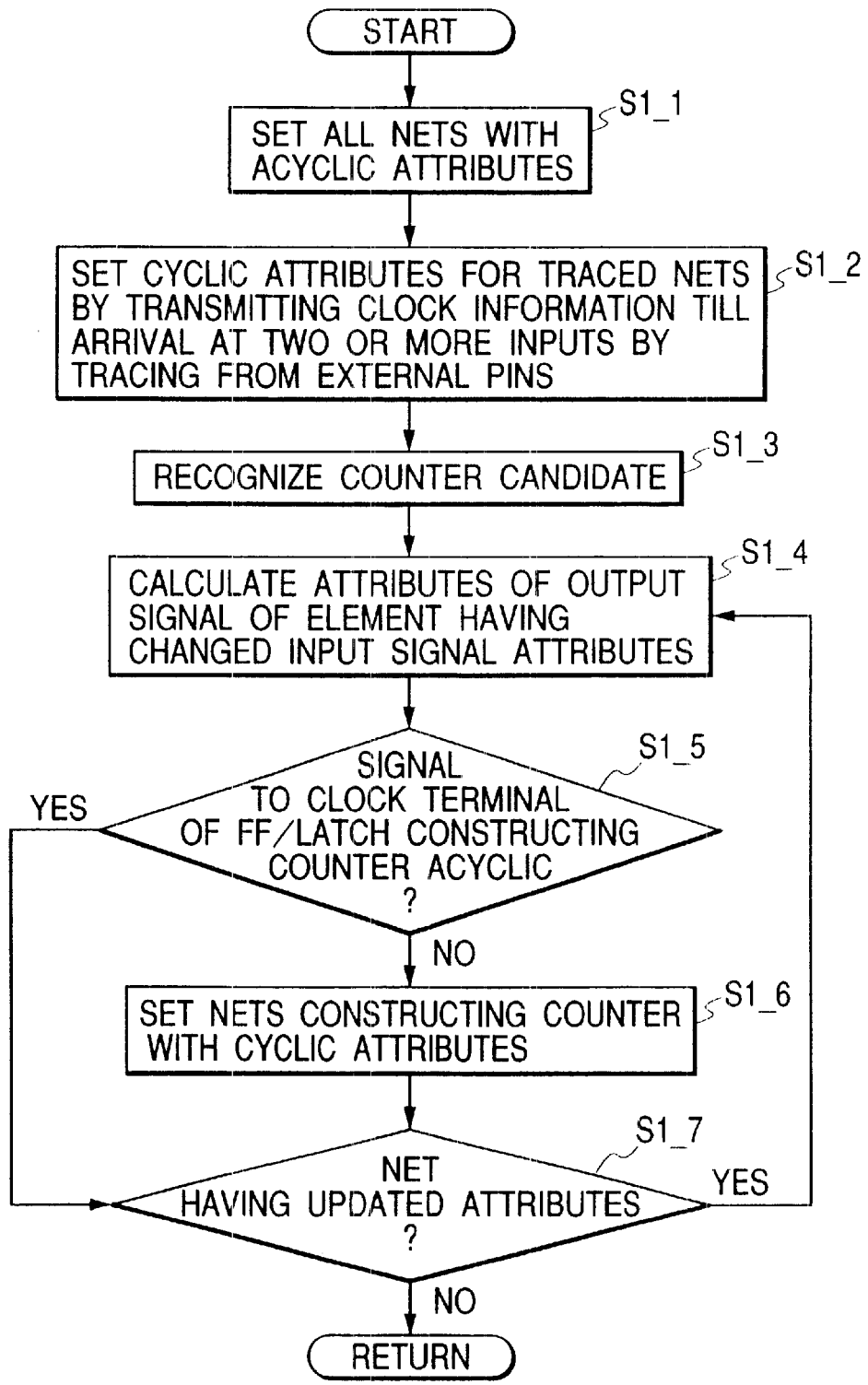
FIG. 5 is a flow chart showing one example of the internal operation of Step S1 of FIG. 4.

FIG. 5 is a flow chart showing the entirety of an internal processing flow of Step S1 of the processing procedure to be executed by the device of FIG. 1. When the procedure is started, as shown in FIG. 3, the acyclic attributes are set at first Step S1_1 for all the nets in the object circuit.

Next, at Step S1_2, the tracing is performed from the external clock pins to propagate the clock information till arrival at the input terminals of the elements of two or more inputs. Thus, the traced nets are set with the cyclic attributes. This is because the nets to the two or more inputs of the elements are naturally cyclic.

At Step S1_3, the counter candidates are recognized, and at Step S1_4, the attributes of the output signal nets of the elements having changed the attributes of the input signal nets are calculated to set the output signal nets of the elements with the calculated result.

At next Step S1_5, it is decided whether or not the attributes of the input signal nets to the clock terminals of the flip-flops and the latches constructing the recognized counter attributes are acyclic. The routine shift to Step $S1_{13}$ 7, if acyclic, but to Step S1_6 if not acyclic.

At Step S1_6, the counter candidates, for which the attributes of the input signal nets to the clock terminals of the flip-flops and the latches are not acyclic, are recognized again as the counter, and all the input/output signal nets of the elements constructing the counter are set with the cyclic attributes. The routine shifts to Step S1_7.

At Step S1_7, it is decided whether or not there are nets having updated attributes. The routine shifts to Step S1_4, if YES, but ends if NO.

Figure 6:
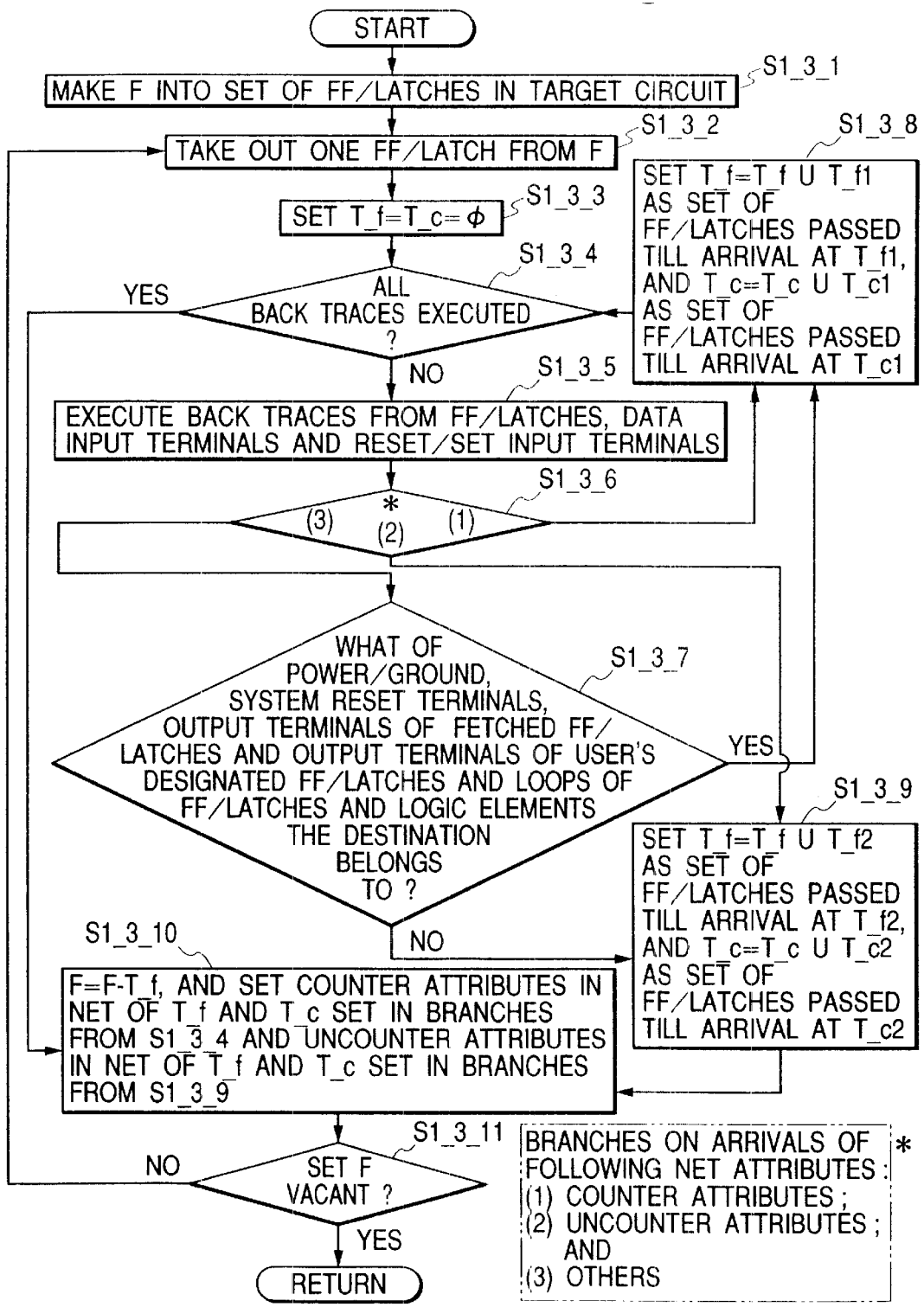
FIG. 6 is a flow chart showing one example of the internal operation of Step S1_3 of FIG. 5.

FIG. 6 is a flow chart showing a flow of the internal operation of Step S1_3. When the operation of Step S1_3 is started, all the flip-flops and latches in the object circuit are recognized at first Step S1_3_1, and their set is made into F.

Next, at Step S1_3_2, one of the flip-flops or the latches in the object circuit is taken out. At Step S1_3_3, a set T_f of the flip-flops and latches and a set T_c of the logic elements are set to empty sets.

Next, at Step S1_3_4, it is decided whether or not all the back traces from that terminal have been ended. The routine shifts to Step S1_3_10, if ended, but to Step S1_3_6 if not.

At Step S1_3_5, the back traces are executed from the data input terminals and the set/reset terminals of the flip-flops or the latches, as taken out at Step S1_3_2. The back traces are to follow the signal paths backward of the signals to be fed to the terminals of the starting point.

At Step S1_3_6, the attributes of the net reached at the back tracing time are discriminated. The routine shifts to Step S1_3_8, if the counter attributes, to step S1_3_9, if the uncounter attributes, and to Step S1_3_7 if neither the counter attributes nor the uncounter attributes. These counter attributes and uncounter attributes are attributes to be set at Step S1_3_10.

At Step S1_3_7, it is decided what of the power/ground, the external system reset terminals, the data output terminals of the flip-flops or the latches taken out at Step S1_3_2, the data output terminals of the flip-flops or the latches designated by the user, and the loops of the flip-flops or the latches and the logic elements the destination of the back trace belongs to. The routine shifts to Step S1_3_8, if YES, and to Step S1_3_9 if NO.

At Step S1_3_8: the set of flip-flops and latches passed during the execution of the back trace is designated by T_f1, and the set T_f is replaced by T_fUT_f1; the set of logic elements passed during the execution of the back trace is designated by T_c1, and the set T_c is replaced by T_cUT_c1; and the routine shifts to Step S1_3_4. The sum of sets T_f and T_c, as obtained by repeating Steps S1_3_5, S1_3_6, S1_3_7 and S1_3_8, is the counter candidate.

At Step S1_3_9: the set of flip-flops and latches passed during the execution of the back trace is designated by T_f2, and the set T_f is replaced by T_f2; the set of logic elements passed during the execution of the back trace is designated by T_c2, and the set T_c is replaced by T_c2; and the routine shifts to Step S1_3_10.

Next, at Step S1_3_10, the set F is replaced by F-T_f, the nets of T_f and T_c set at the branch from Step S1_3_4 are set with the counter attributes whereas the nets of T_f and T_c set at the branch from Step S1_3_9 are set with the uncounter attributes.

At Step S1_3_11, it is decided whether or not the set F is empty. The routine shifts to Step S1_3_2, if not empty, and is ended if empty. Thus, the elements of the counter attributes for the counter candidates are recognized.

Figure 7:
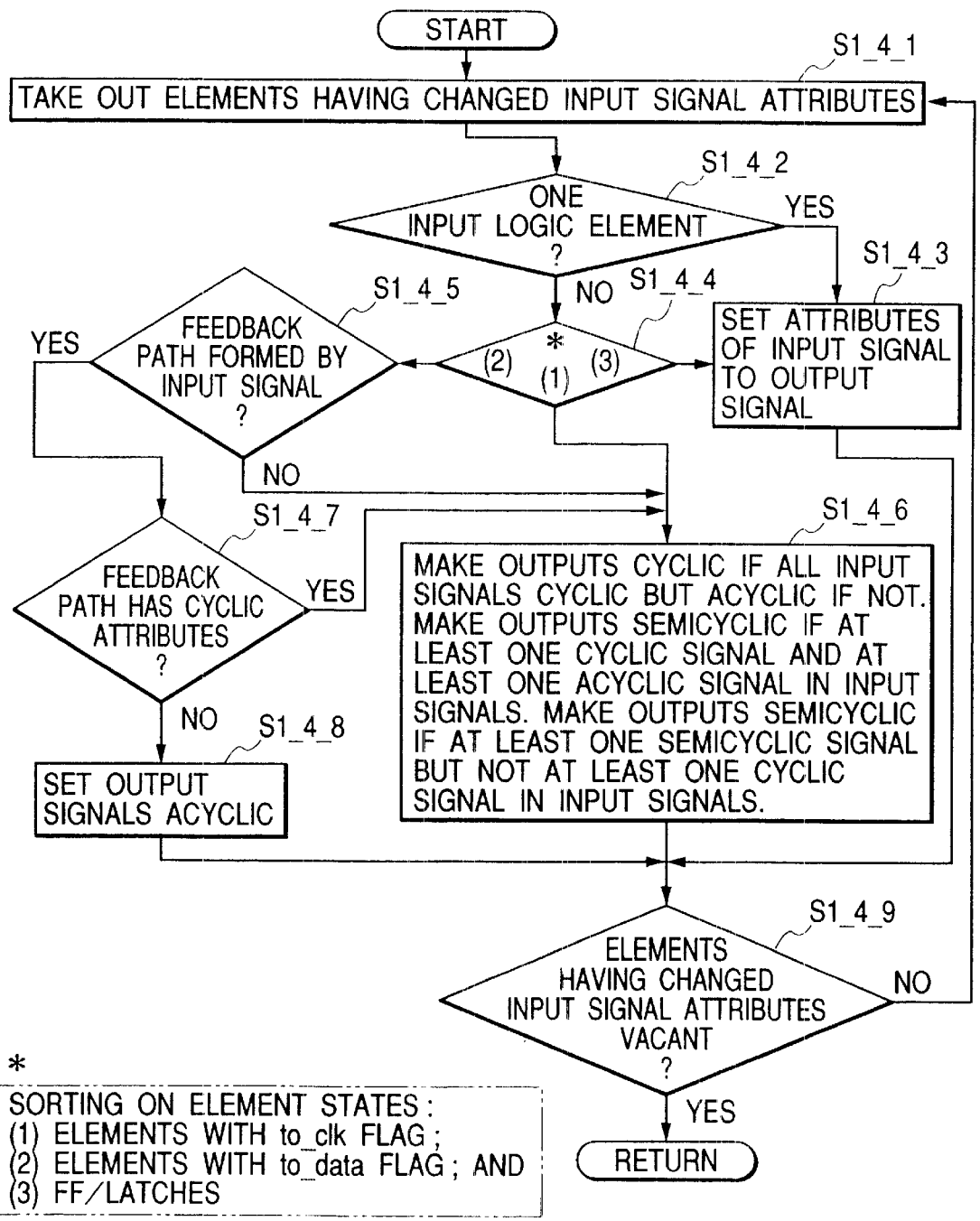
FIG. 7 is a flow chart showing one example of the internal operation of Step S1_4 of FIG. 5.

FIG. 7 is a flow chart showing a flow of the internal operation of Step S1_4. When the operation of Step S1_4 is started, one element having the attributes of the input signal net changed is taken at first Step S1_4_1 from the object circuit.

Next, it is decided at Step S1_4_2 whether or not the taken-out element is a one-input element. The routine shifts to Step S1_4_3, if the one-input element, but to Step S1_4_4 if not.

At Step S1_4_3, the output signal net is set with the attributes of the input signal net, and the routine shifts to Step S1_4_9.

At Step S1_4_4, it is decided what of (1) elements with a to_clk flag (i.e., elements having outputs connected with the clock input terminal) raised, (2) elements with a to_data flag (i.e., elements having outputs connected with the data input terminal but not the to_clk flag raised) raised, and (3) the flip-flops/latches the element having changed the attributes of the input signal net belongs to. The routine shifts to Step S1_4_6, if (1), to Step S1_4_5, if (2), and to Step S1_4_3 if (3).

At Step S1_4_6, for the elements having changed the attributes of the input signal net, the attributes of the output signal net are set cyclic, if all the attributes of the input signal net are cyclic, acyclic, if all are acyclic, semicyclic, if at least one cyclic attribute net and at least one acyclic attribute net are in the input signal net (if at least one input is the clock signal and if at least one input is data, for example), and semicyclic if at least one semicyclic attribute net but not any cyclic attribute net is in the input signal net. The routine shifts to Step S1_4_9.

At Step S1_4_5, it is decided whether or not the input signals of the elements having changed the attributes of the input signal net form a feedback path. The routine shifts to Step S1_4_7, if the feedback path is formed, but to Step S1_4_6 if not.

At Step S1_4_7, it is decided whether or not the attributes of the net forming the feedback path with the input signals of the elements having changed the attributes of the input signal net are cyclic. The routine shifts to Step S1_4_6, if cyclic, but to Step S1_4_8 if not.

At Step S1_4_8, the output signal net of that element is set with acyclic attributes, and the routine shifts to Step S1_4_9.

At Step S1_4_9, it is decided whether or not the element having changed the attributes of the input signal net is empty. The routine shifts to Step S1_4_1, if not empty, but is ended if empty.

FIG. 8 is a flow chart showing a flow of the internal operation of Step S1_4_4. When the operation of Step S1_4_4 is started, the logic cone of the clock terminals and the set/reset terminals of the flip-flops and the latches in the object circuit is taken out at first Step S1_4_4_1.

Next, at Step S1_4_4_2, the to_clk flag is raised for all the elements in the logic cone. This logic cone means a logic circuit in which the noted element is present up to the data output terminals of the flip-flops and the latches.

At Step S1_4_4_3, it is decided whether or not all the flip-flops and the latches in the object circuit are processed. The routine shifts to Step S1_4_4_4, if YES, but to Step S1_4_4_1 if NO.

At Step S1_4_4_4, there are taken out the data terminals of the flip-flops and the latches and the logic cone in the object circuit.

Next, at Step S1_4_4_5, the to_data flag is raised for all the elements having no to_clk flag raised in the logic cone.

At Step S1_4_4_6, it is decided whether or not all the flip-flops and the latches in the object circuit have been processed. The routine shifts to Step S1_4_4_1, if NO, but is ended if YES.

Here, the operations of Steps S1_4_4_4 and S1_4_4_5 in FIG. 8 can be replaced by those of FIG. 38.

FIG. 9 is a flow chart showing a flow of the internal operation of Step S1_4_4_1. When the operation of the Step S1_4_4_1 is started, the object terminal of the object element is recognized at first Step S1_4_4_1_1 from the object circuit.

Next at Step S1_4_4_1_2, the element having the output signal net connected with that terminal is taken out.

At Step S1_4_4_1_3, the back trace is executed from the input terminal of the element taken out at the preceding Step, till arrival at the data output terminals of the flip-flops and the latches, to construct a circuit of the traced element and its connection information and to store it as the logic cone, and the operation is ended.

FIG. 10 is a flow chart showing a flow of the internal operation of Step 3. When the operation of Step S3 is started, at Step S3-1, the flip-flop and the latch, for which the net of the acyclic attributes is the input signal of the clock terminal, are recognized from the object circuit, and the operation is ended by raising the dynamic timing analysis flag for that element.

FIG. 11 is a flow chart showing a flow of the internal operation of Step S4. When the operation of Step S4 is started, at Step S4_1, a gated clock 1 flag is raised for the logic element having the to_clk flag raised and having the output signal net of the cyclic attributes whereas a gated clock 2 flag is raised for the logic element in the logic cone, as having the output signal net of the semicyclic attributes, and the operation is ended.

Figure 12:
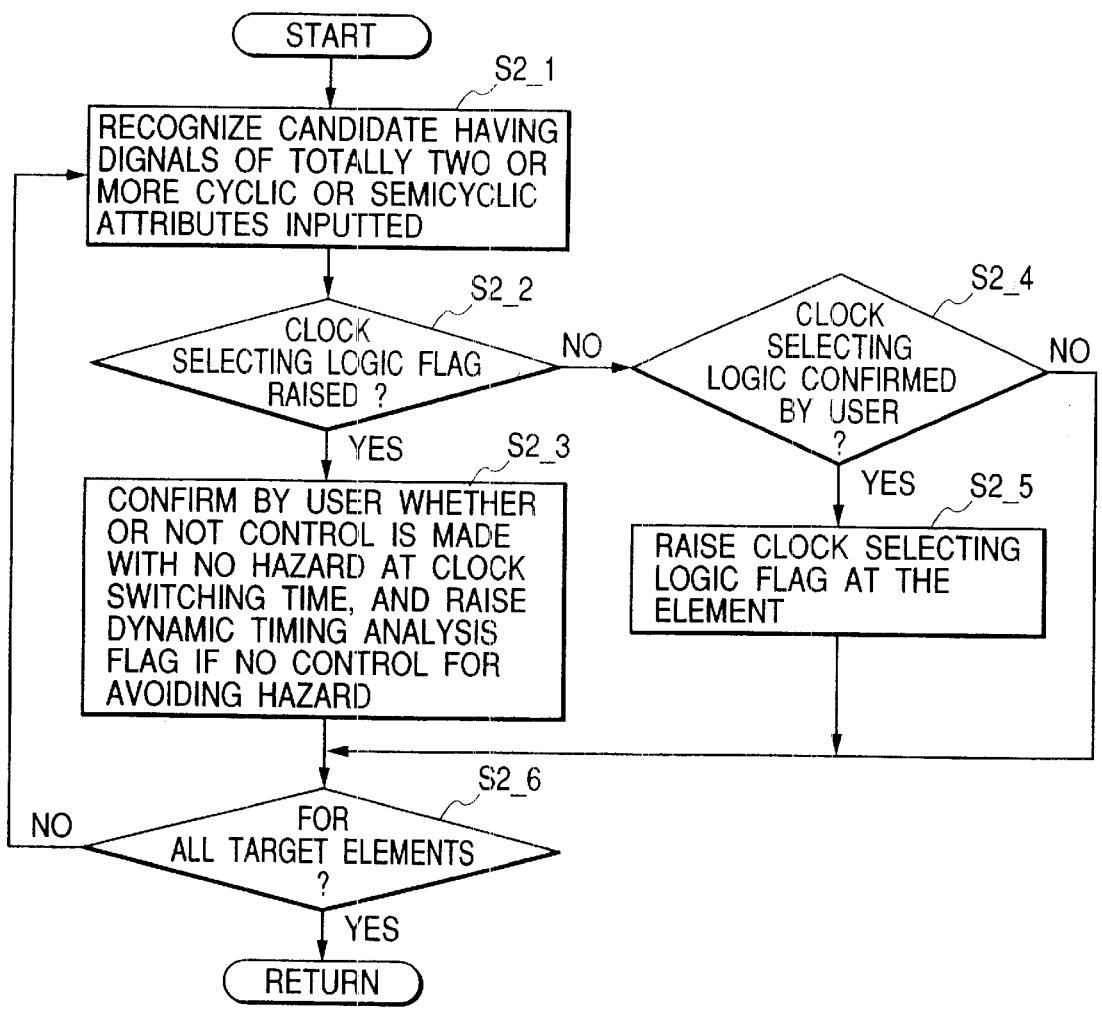
FIG. 12 is a flow chart showing one example of the internal operation of Step S2 of FIG. 4.

FIG. 12 is a flow chart showing a flow of the internal operation of Step S2. When the operation of Step S2 is started, at first Step S2_1, what has an input signal as totally two or more nets of the cyclic or semicyclic attributes is recognized from the object circuit.

Next, it is decided at Step S2_2 whether or not a clock selecting logic flag is raised at that element. The routine shifts to Step S2_3, if raised, but to Step S2_4 if not.

At Step S2_3, it is confirmed by the user whether or not the circuit is designed to act normally without any problem even if the element having the clock selecting logic flag raised outputs a hazard at the time of switching the clock. If not, the dynamic timing analysis flag is raised for that element.

At Step S2_4, it is confirmed by the user whether or not the element constructs the clock selecting logic. The routine shifts to Step S2_5, if constructed, but to Step S2_6 if not.

At Step S2_6, it is decided whether or not all the elements are checked. The routine shifts to Step S2_1, if not, but the operation is ended if checked.

Figure 13:
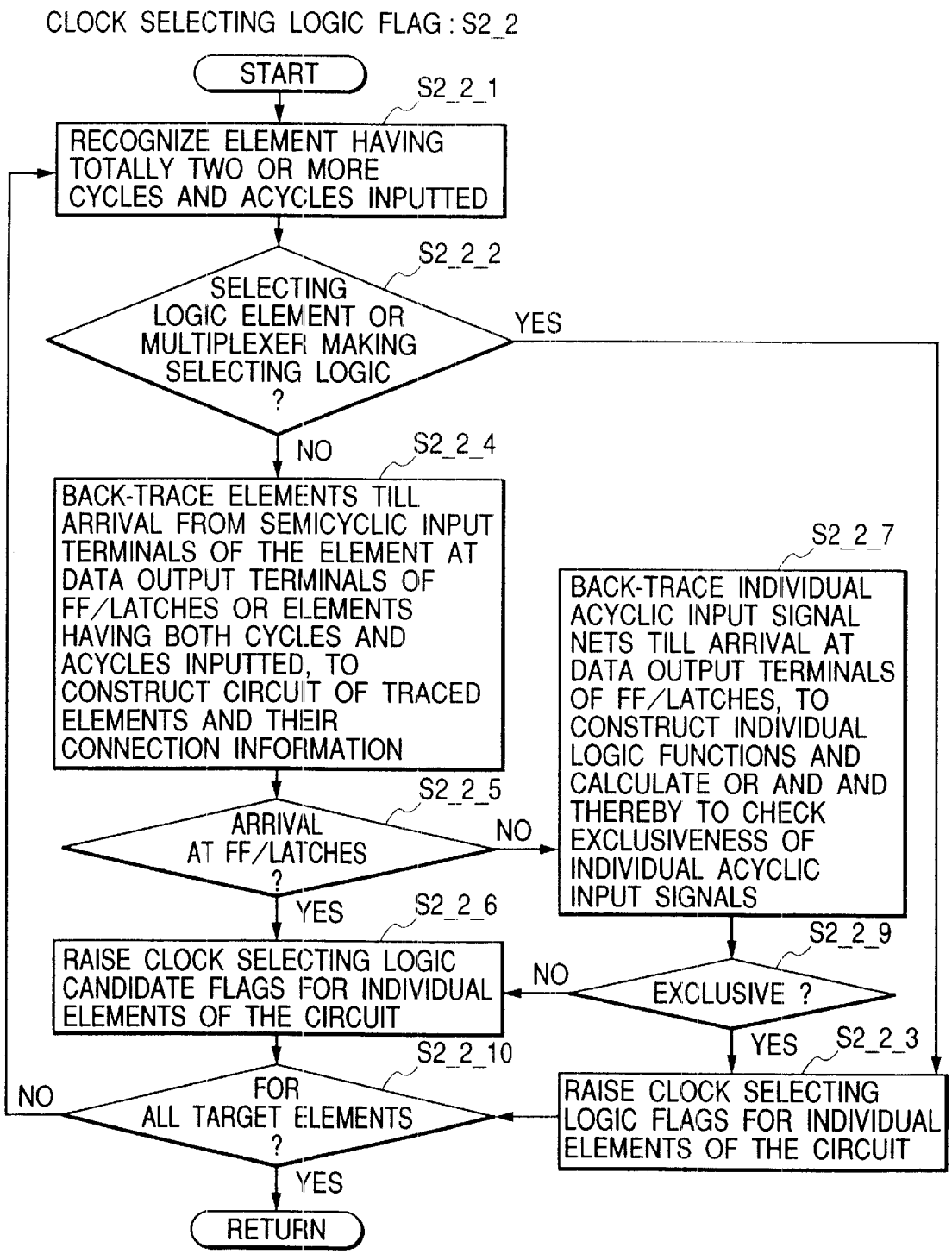
FIG. 13 is a flow chart showing one example of the internal operation of Step S2_2 of FIG. 12.

FIG. 13 is a flow chart showing a flow of the internal operation of Step S2_2. When the operation of Step S2_2 is started, at first Step S2_2_1, the element having totally two or more nets of the cyclic attributes or semicyclic attributes are inputted is recognized from the object circuit.

Next, at Step S2_2_2, it is decided whether or not the recognized element is the selecting logic element of a multiplexer or the like and whether or not the net of the cyclic attributes or semicyclic attributes constructs the selecting logic. The routine shifts to Step S2_2_3, if the selecting logic is constructed, but to Step S2_2_4 if not.

At Step S2_2_3, the clock selecting logic flag is raised for the element constructing the selecting logic.

At Step S2_2_4, the back trace is executed from the semicyclic input terminals of that element till arrival at the data output terminals of the flip-flops or the latches or the element having the nets of both the cyclic attributes and the acyclic attributes connected with their input terminals, to construct a circuit of the traced elements and their connection information.

At Step S2_2_5, it is decided whether or not the back trace arrives at the data output terminals of the flip-flops or the latches. The routine shifts to Step S2_2_6, if YES, but to Step S2_2_7 if NO.

Next, at Step S2_2_6, a clock selecting logic candidate flag is raised for the individual elements constructing that circuit.

Next, at Step S2_2_7, the individual acyclic input signal nets in that circuit are back-traced till arrival at the data output terminals of the flip-flops or the latches, to construct the individual logic functions and calculate the OR and AND thereby to check exclusiveness of the individual acyclic input signals.

At Step S2_2_9, it is decided whether or not the individual acyclic input signals are exclusive. The routine shifts to Step S2_2_6, if not, but to Step S2_2_3 if exclusive.

At Step S2_2_10, it is decided whether or not all the object elements are checked. The routine shifts to Step S2_2_1, if not, but is ended if checked.

Figure 14:
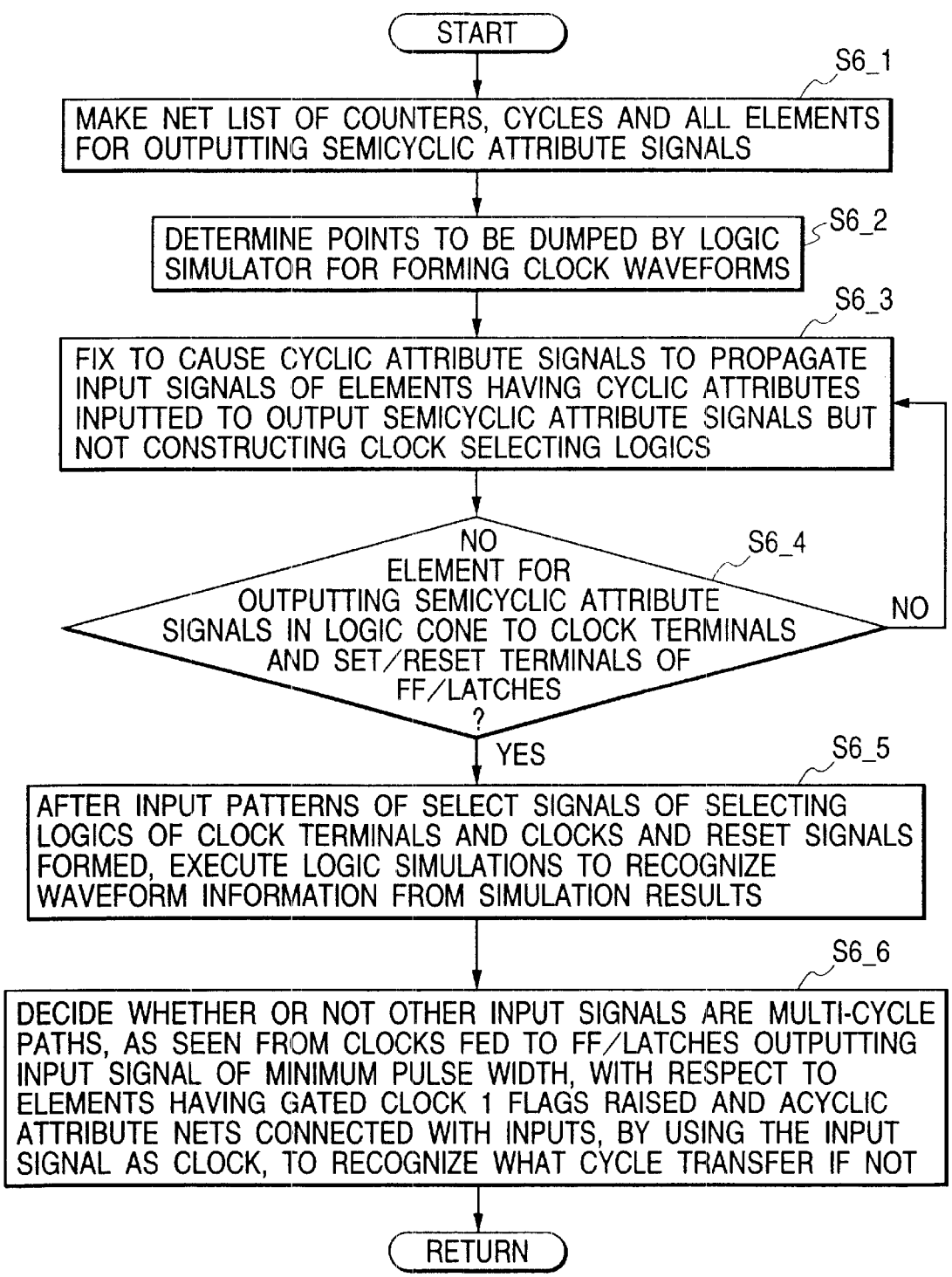
FIG. 14 is a flow chart showing one example of the internal operation of Step S6 of FIG. 4.

FIG. 14 is a flow chart showing a flow of the internal operation of Step S6. When the operation of step S6 is started, at first Step S6_1, there is constructed from the object circuit an element net list of elements constructing the counter, the elements having the gated clock 1 flag raised, and the elements having the gated clock 2 flag raised.

At next Step S6_2, there are determined points in the net list to be dumped by the logic simulator for forming the clock waveforms.

At Step S6_3, the input signals of the elements having the cyclic attribute net inputted and the semicyclic attribute net outputted, i.e., the elements having no clock selecting logic flag raised are so fixed as to propagate the cyclic attributes.

At Step S6_4, it is decided whether or not the elements having the cyclic attribute net inputted and the semicyclic attribute net outputted, i.e., the elements having no clock selecting logic flag disappear. The routine shifts to Step S6_5, if YES, but again to Step S6_4 if NO.

At Step S6_5, the external clock terminals, the set/reset signals and the input pattern to the elements having the clock selecting logic flag raised are used to execute the logic simulation thereby to prepare the waveform information from the simulation result at the points to be dumped.

At Step S6_6, it is decided by using the input signal of the minimum pulse width as the clock whether or not other input signals are multi-cycle paths, as seem from the clocks fed to the flip-flops or the latches outputting the input signal, with respect to the elements having the gated clock 1 flag raised and the acyclic attributes nets connected with the inputs. If, it is recognized what cycle transfers, and the operation is ended. Here, this Step S6_6 can be omitted. This is because the waveform information obtained in the simulation of the foregoing Step S6_5 may be utilized.

Figure 15:
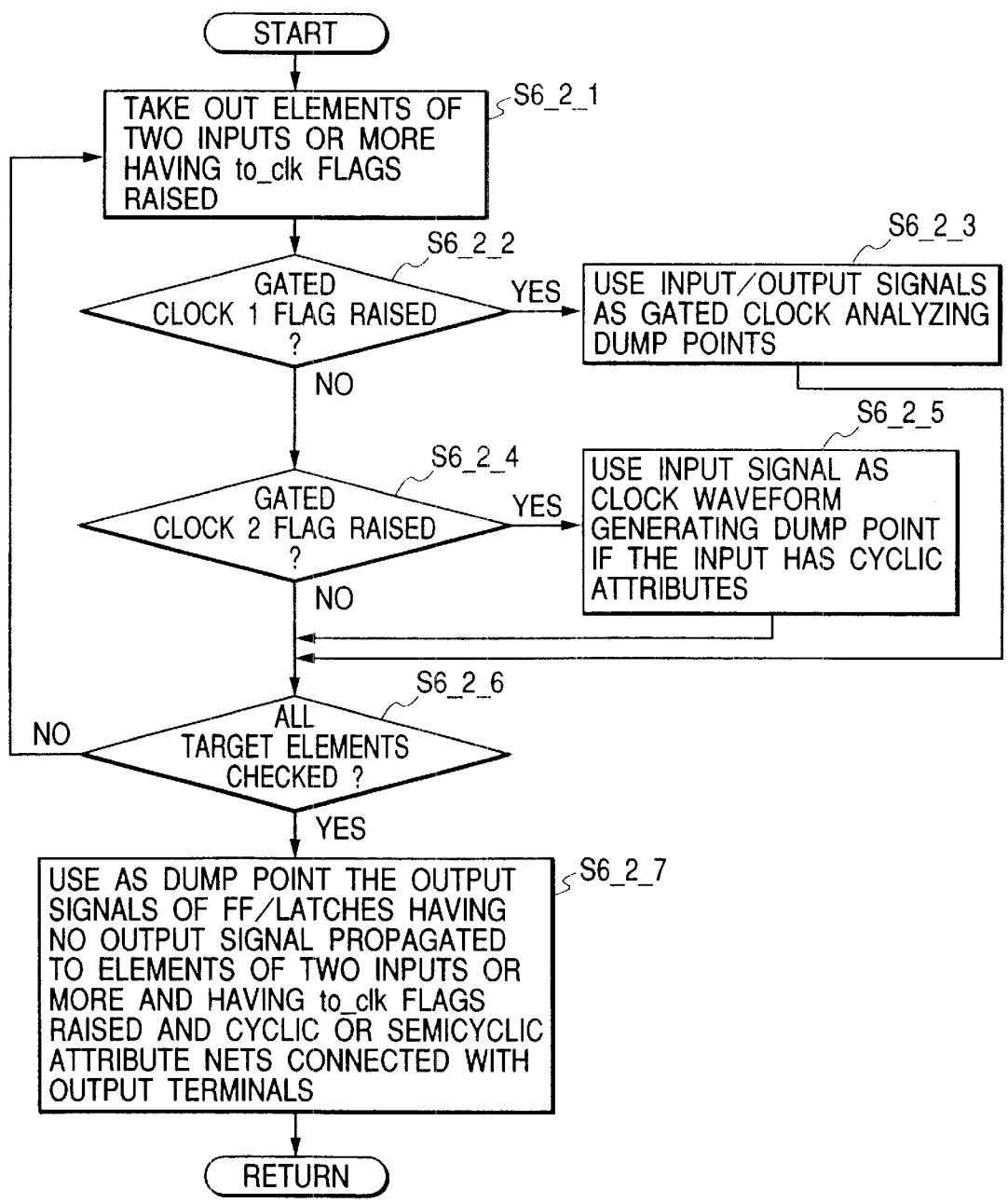
FIG. 15 is a flow chart showing one example of the internal operation of Step S6_2 of FIG. 13.

FIG. 15 is a flow chart showing a flow of the internal operation of Step S6_2. When the operation of Step S6_2 is started, the elements of two or more inputs having the to-clk flag raised is taken out at first Step S6_2_1.

At next Step S6_2_2, it is decided whether or not the gated clock 1 flag is raised for that element. The routine shifts to Step S6_2_3, if raised, but to the operation of Step S6_2_4 if not.

At Step S6_2_3, the input signals and the output signals of that element are used as the gated clock analyzing dump points, and the routine shifts to Step S6_2_7.

At Step S6_2_4, it is decided whether or not the gated clock 2 flag is raised for that element. The routine shifts to step S6_2_5, if raised, but to Step S6_2_6 if not.

At Step S6_2_5, if the input signal net of that element has cyclic attributes, the input signal of the cycle attributes is used as the dump point for generating the clock waveform, and the routine shifts to Step S6_2_6.

At Step S2_6_8, it is decided whether or not all the object elements are checked. The routine shifts to Step S6_2_7, if checked, but to Step S6_2_1 if not.

At Step S6_2_6, the routine is ended by using as the dump point the output signals of the flip-flops and the latches having no output signal propagated to the elements of two or more inputs and the to_clk flag raised and having the cyclic or semicyclic attribute nets connected with the output terminals.

Figure 16:
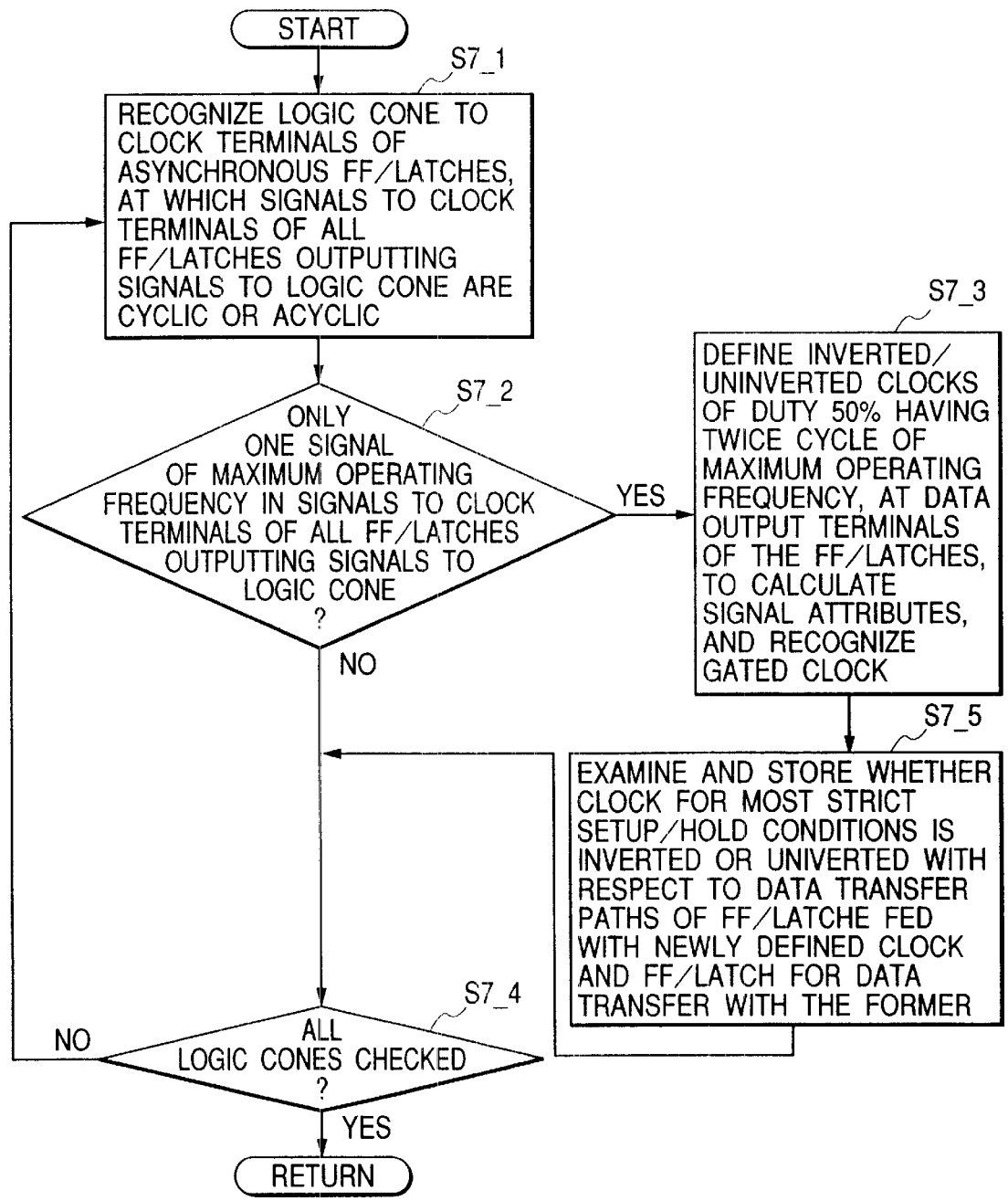
FIG. 16 is a flow chart showing one example of the internal operation of Step S7 of FIG. 4.

FIG. 16 is a flow chart showing a flow of the internal operation of Step S7. When the operation of Step S7 is started, at first Step S7_1, there is recognized the logic cone from the object circuit to the clock terminals and the set/reset terminals of the asynchronous flip-flops and the asynchronous latches which are connected with the clock terminals of all the flip-flops and the latches outputting signals to the logic cone and at which the signal net has the cyclic attributes or semicyclic attributes.

Next, at Step S7_2, it is decided whether or not only one signal of the maximum operating frequency is in the signals to the clock terminals of all the flip-flops and the latches outputting the signals to the logic cone. The routine shifts to Step S7_3, if only one, but to Step S7_4 if two or more.

At Step S7_3, the data output terminals of the flip-flops or the latches fed with the clock of the maximum operating frequency are set with the inverted/uninverted clocks of a duty of 50% having a twice cycle of the maximum operating frequency, and the signal attribute calculation S1_4 is executed. The recognition S4 of the clock gate is executed, and the routine then shifts to Step S7_5.

At Step S7_5, it is examined, with respect to the data transfer path between the flip-flops or the latches to be fed with a newly defined clock and the flip-flops or the latches for transferring data with the former flip-flops or the latches, whether the clock for the most strict setup/hold conditions is inverted or uninverted. The examination result is stored in the storage unit 6, and the routine shifts to Step S7_4.

At Step S7_4, it is decided whether or not all the logic cones to the clock terminals of the asynchronous flip-flops and the asynchronous latches are checked. The routine shifts to Step S7_1, if not checked, but is ended if checked.

Figure 17:
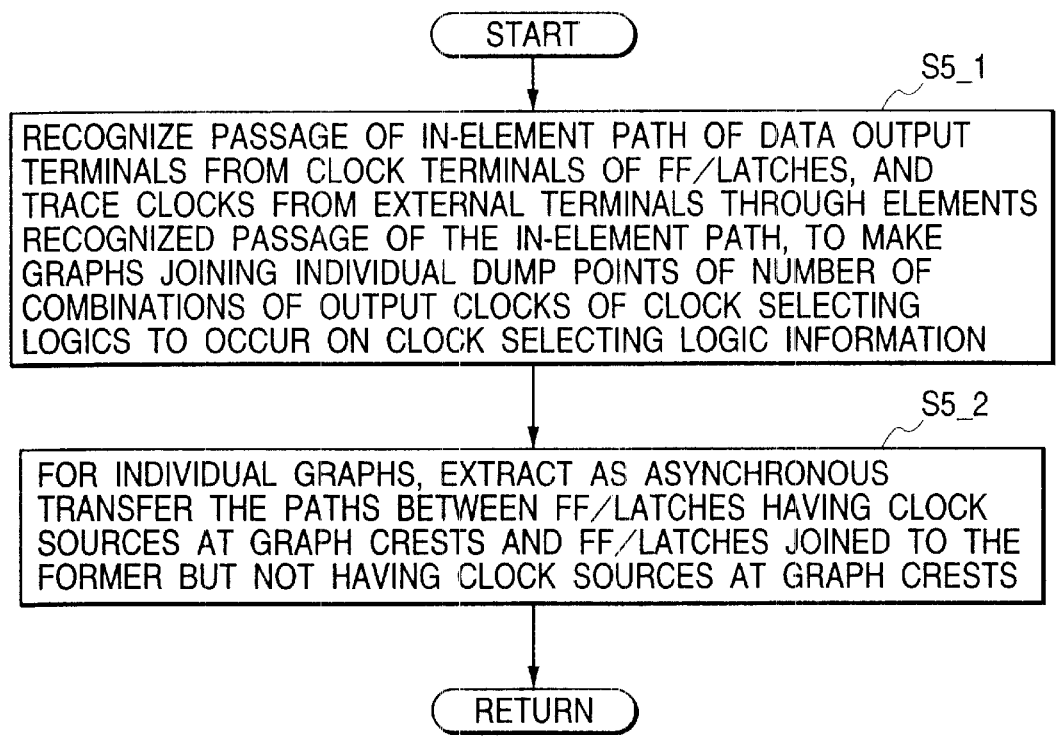
FIG. 17 is a flow chart showing one example of the internal operation of Step S5 of FIG. 4.

FIG. 17 is a flow chart showing a flow of the internal operation of Step S5. When the operation of Step S5 is started, at first Step S5_1, there is admitted the passage of an in-element path from the clock terminals of the flip-flops and the latches for which the data output signal net has the cyclic or semicyclic attributes. Then, the clock information is propagated from the external clock signals by tracing the elements for which the aforementioned in-element path has been recognized and for which the gated clock 1 flag and the gated clock 2 flag are raised. On the basis of the information of the clock selecting logic, graphs are made to join the individual dump points of the number of combinations of the output clocks of the possible clock selecting logic.

Next, at Step S5_2, for the individual graphs, the flip-flops and the latches, for which the graph apexes are the clock sources, are recognized, and the data transfer path with the flip-flops and the latches, for which the graph apexes are not the clock sources, if any, are extracted as the asynchronous transfer path. Then, the operation is ended.

Figure 18:
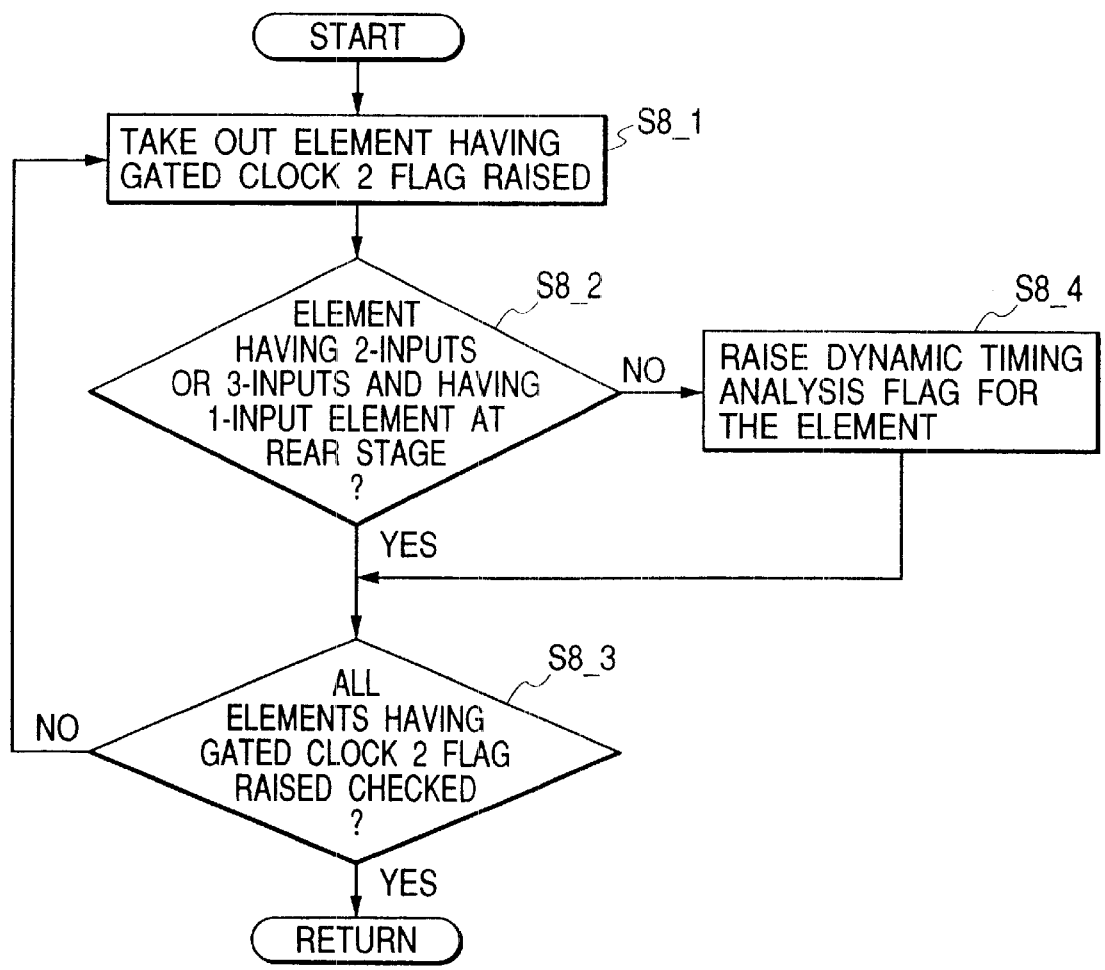
FIG. 18 is a flow chart showing one example of the internal operation of Step S8 of FIG. 4.

FIG. 18 is a flow chart showing a flow of the internal operation of Step S8. When the operation of Step S8 is started, the element having the gated clock 2 flag raised is taken out at first Step S8_1.

Next, at Step S8_2, it is decided whether the element has two inputs or three inputs or has the rear stage connected with the element having one input. The routine shifts to Step S8_4, if not any, but to Step S8_3 if any.

At Step S8_4, a dynamic timing analysis flag is raised for that element, and the routine shifts to Step S8_3.

At Step S8_3, it is decided whether or not all the elements having the gated clock 2 flag raised are checked. The routine shifts to Step S8_1, if not checked, but is ended if checked.

Here in the description thus far made, it is premised that the circuit restriction input unit 3 has such a circuit restriction on the circuit construction of the clock gate that the element having the gated clock 2 flag raised is the two-input element or the three-input element having a rear stage connected with the one-input element.

Figure 19:
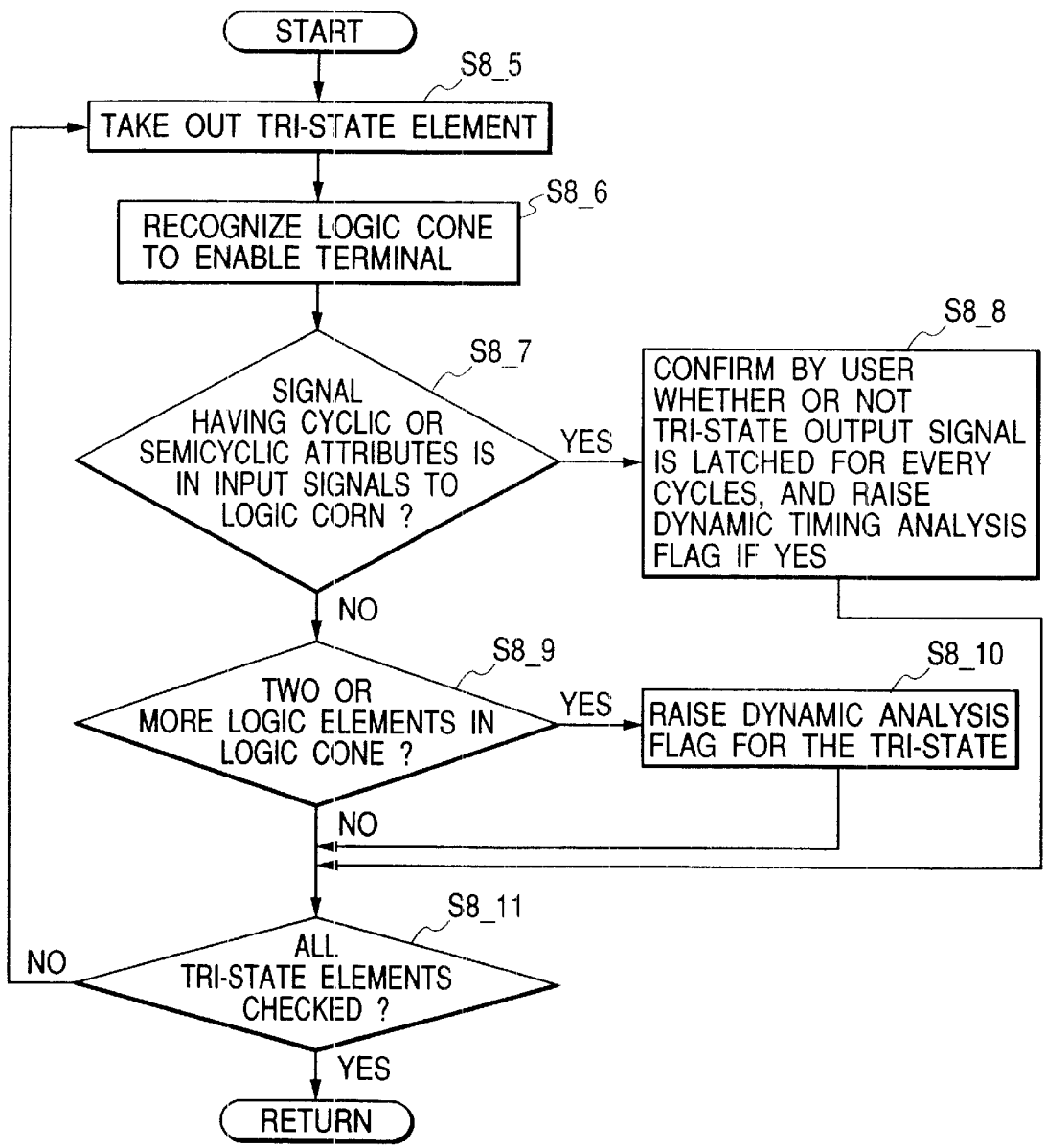
FIG. 19 is a flow chart showing another example of the internal operation of Step S8 of FIG. 4.

FIG. 19 is a flow chart showing another flow of the internal operation of Step S8. When the operation of Step S8 is started, the tristate element is taken out at first Step S8_5. Next, at Step S8_6, the logic cone to the enable terminal of that element is recognized.

At Step S8_7, it is decided whether or not a cyclic or semicyclic net is in the input signal net to that logic cone. The routine shifts to Step S8_8, if YES, but to Step S8_9 if NO.

At Step S8_8, it is confirmed by the user whether or not the output signal of the tristate element is latched for every cycles. If the circuit is constructed to latch for every cycles, the dynamic timing analysis flag is raised for that tristate element.

At Step S8_9, it is decided whether or not two or more logic elements are in that logic cone. The routine shifts to Step S8_10, if YES, but to Step S8_11 if NO.

At Step S8_10, the dynamic timing analysis flag is raised for the tristate element, and the routine shifts to Step S8_11.

At Step S8_11, it is decided whether or not all the tristate elements in the object circuit are checked. The routine shifts to Step S8_5, if not checked, but is ended if checked.

Here in the description thus far made, it is premised that the circuit restriction input unit 3 has such a circuit restriction on the circuit construction of the logic cone to the enable terminals of the tristate element that the logic element of two or more inputs must not be in the logic cone, and that the output signal of the tristate element does not take a high impedance even if the data are not held in the output signal net by a bus holder circuit (e.g., a bus repeater circuit such as a latch circuit constructed of two inverters).

Figure 39:
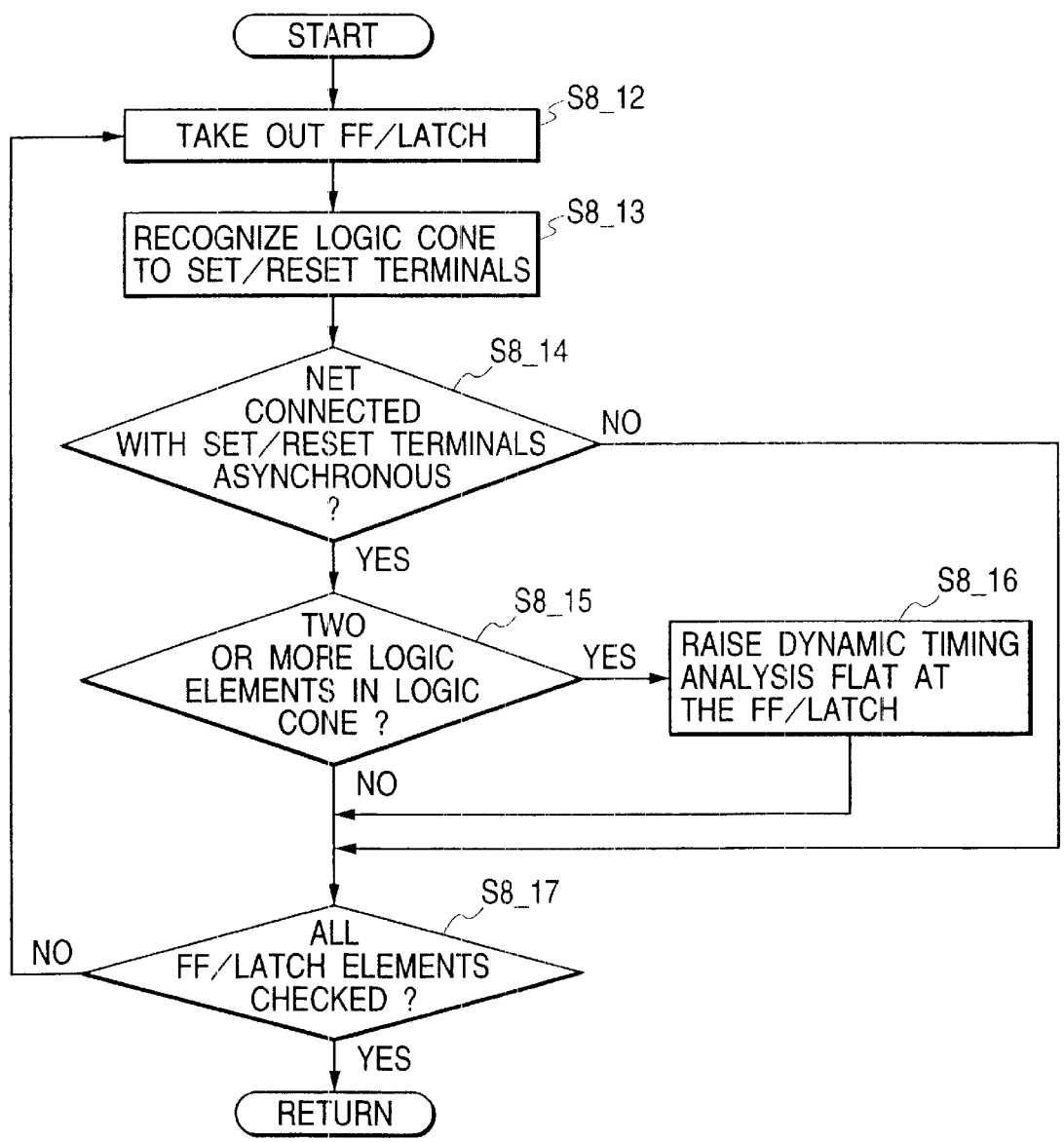
FIG. 39 is a flow chart showing still another example of the internal operation of Step S8 of FIG. 4.

FIG. 39 shows still another flow chart of the internal operation of the aforementioned Step S8. When the operation of Step S8 is started, the flip-flops and the latches are taken out at first Step S8_12. Next, at Step S8_13, the logic cone to the set/reset terminals of the element is recognized.

At Step S8_14, it is decided whether or not the attributes of the net connected with the set/reset terminals of the element are acyclic. The routine shifts to Step S8_15, if acyclic, but to Step S8_17 if not.

At Step S8_15, it is decided whether or not a logic element of two or more inputs is in the logic cone. The routine shifts to Step S8_17, if YES, but to Step S8_16 if NO.

At Step S8_16, the dynamic timing analysis flag is raised for the flip-flops or the latches, and the routine shifts to Step S8_17.

At Step S8_17, it is decided whether or not all the flip-flops and the latches in the object circuit are checked. The routine shifts to Step S8_12, if not, but is ended if checked.

Here in the description of the FIG. 39, it is premised that the circuit restriction input unit 3 has such a circuit restriction on the circuit construction of the logic cone to the set/reset terminals of the flip-flops and the latches either that the attributes of the net connected with the set/reset terminals of the element are not acyclic or that the logic cone is constructed of only zero or more one-input element.

Figure 20:
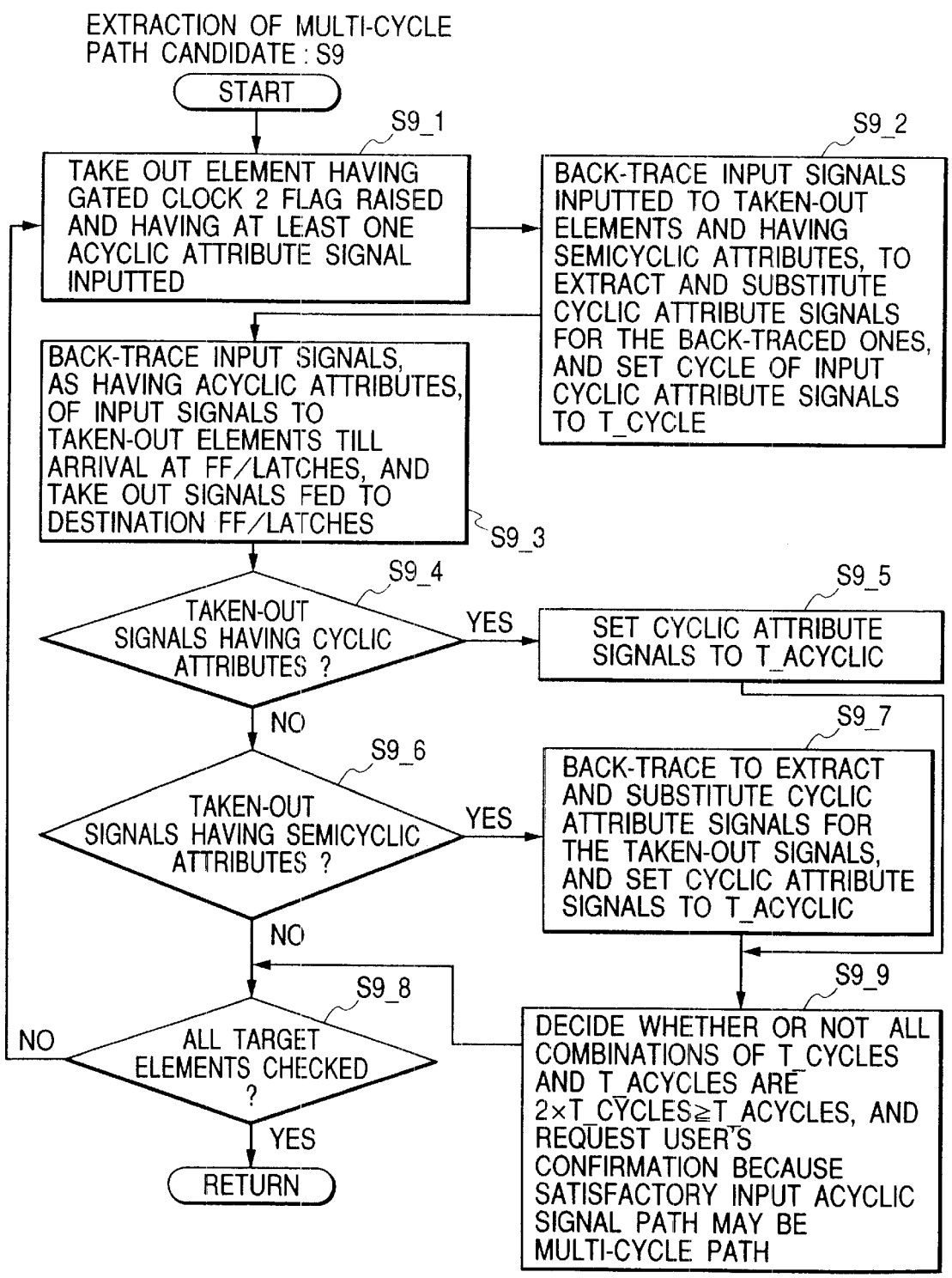
FIG. 20 is a flow chart showing an example of the internal operation of Step S9 of FIG. 4.

FIG. 20 is a flow chart showing a flow of the internal operation of Step S9. When the operation of step 9 is started, at first Step S9_1, there is taken out the element which has the gated clock 2 flag raised and at least one acyclic attribute signal connected with the input signal net.

At Step S9_2, such input signals to the element as have semicyclic attributes are back-traced to extract and substitute the net of the cyclic attributes for the cyclic attribute signals, and the cycle of the input cyclic attribute signals is set to a T_cycle.

At Step S9_3, such ones of the input signals to the element as have the acyclic attributes are back-traced till arrival at the data output terminals of the flip-flops and the latches to take out the signals to the clock terminals of the destination flip-flops and latches.

At Step S9_4, it is decided whether or not the taken-out signals have the cyclic attributes. The routine shifts to Step S9_5, if YES, but to Step S9_6 if NO.

At Step S9_5, the cycle of the signals of the cyclic attributes is set to the T_acycle, and the routine shift to Step S9_9. At Step S9_6, it is decided whether or not the taken-out signals have the semicyclic attributes. The routine shifts to Step S9_7, if YES, but to Step S9_8 if NO.

At Step S9_7, the semicyclic attributes are back-traced to extract the net of the cyclic attributes and to substitute it for the cyclic attribute signals. The cycle of these cyclic attribute signals is set to the T_acycle, and the routine advances to Step S9_9.

At Step S9_9, it is decided whether or not a relation of 2×T_acycles≧T_cycles holds for the combination of the T_cycles and the T_acycles. The input acyclic signal path defining the T_acycles for the relation, that is, the data transfer path between the acyclic attribute signals of the elements taken out at Step S9_1 and the flip-flops and the latches reached by the back trace of Step S9_3 may be a multicycle path. Therefore, the user's confirmation is requested, and the routine shifts to Step S9_8.

At Step S9_8, it is decided whether or not all the elements in the object circuit, in which at least one acyclic attribute signal having the gated clock 2 flag raised is inputted to the input signal net, are checked. The routine shifts to Step S9_1, if not checked, but is ended if checked.

Figure 21:
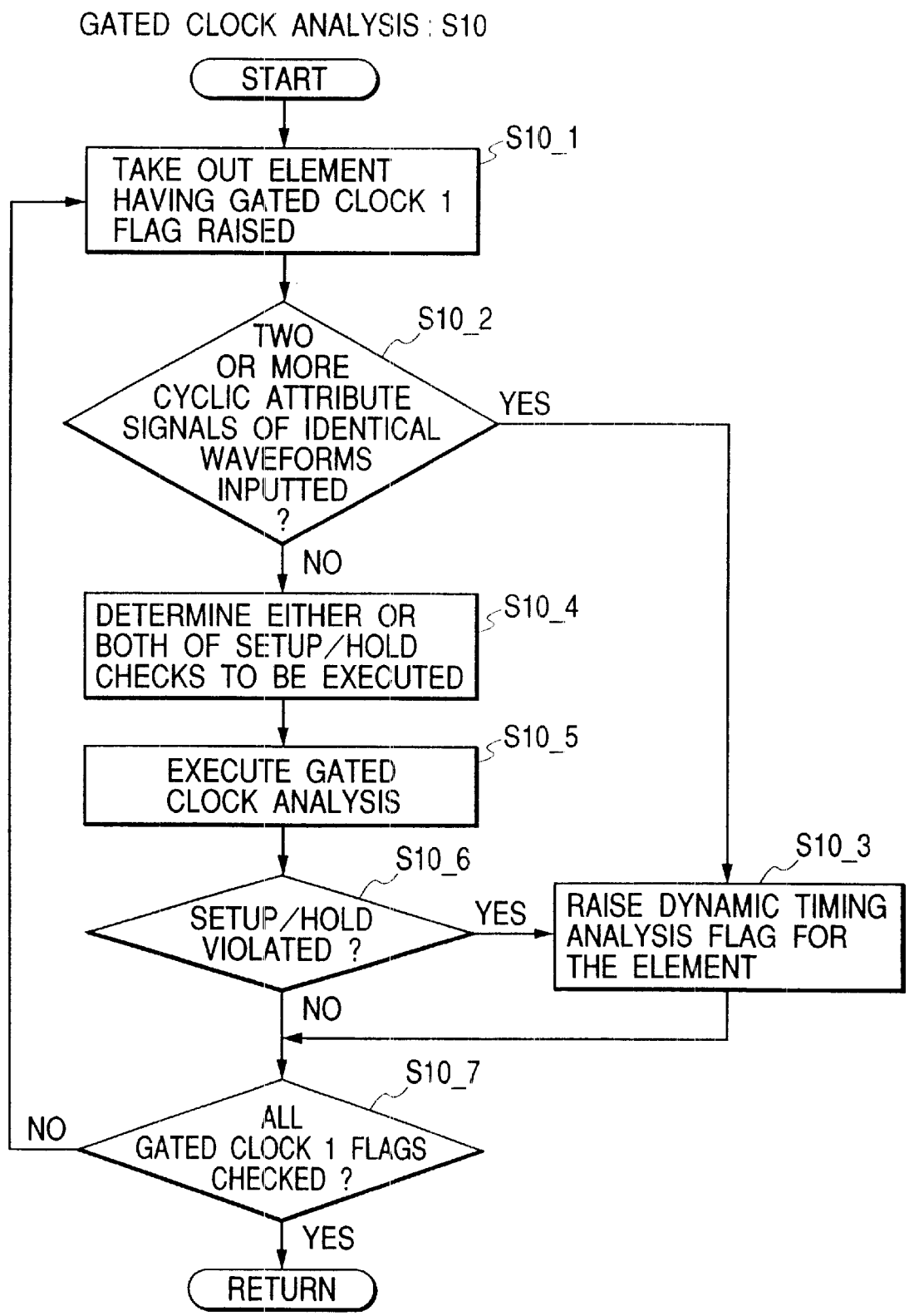
FIG. 21 is a flow chart showing an example of the internal operation of Step S10 of FIG. 4.

FIG. 21 is a flow chart showing a flow of the internal operation of Step S10. When the operation of Step S10 is started, the element having the gated clock 1 flag raised is taken out at first Step S10_1.

At Step S10_2, it is decided whether or not two or more cyclic attribute signals of the identical waveforms are inputted to the element. The routine shifts to Step S10_3, if inputted, but to Step S10_4 if not.

At Step S10_3, the dynamic timing analysis flag is raised for that element, and the routine shifts to Step S10_7. This is because there is a fear of hazard if it is decided at Step S10_2 that two or more cyclic attribute signals of the identical waveforms are inputted.

At Step S10_4, it is determined that either or both of the setup restriction check and the hold restriction check are to be executed on the basis of the logic simulation result of the gated clock analyzing dump points.

At Step S10_5, the gated clock analysis is executed by the static timing analysis. At Step S10_6, it is decided whether or not the setup restriction or the hold restriction is violated. The routine shifts to Step S10_3, if YES, but to Step S10_7 if NO.

At Step S10_7, it is decided whether or not all the elements having the gated clock 1 flag raised in the object circuit are checked. The routine shifts to Step S10_1, if not checked, but is ended if checked.

Figure 22:
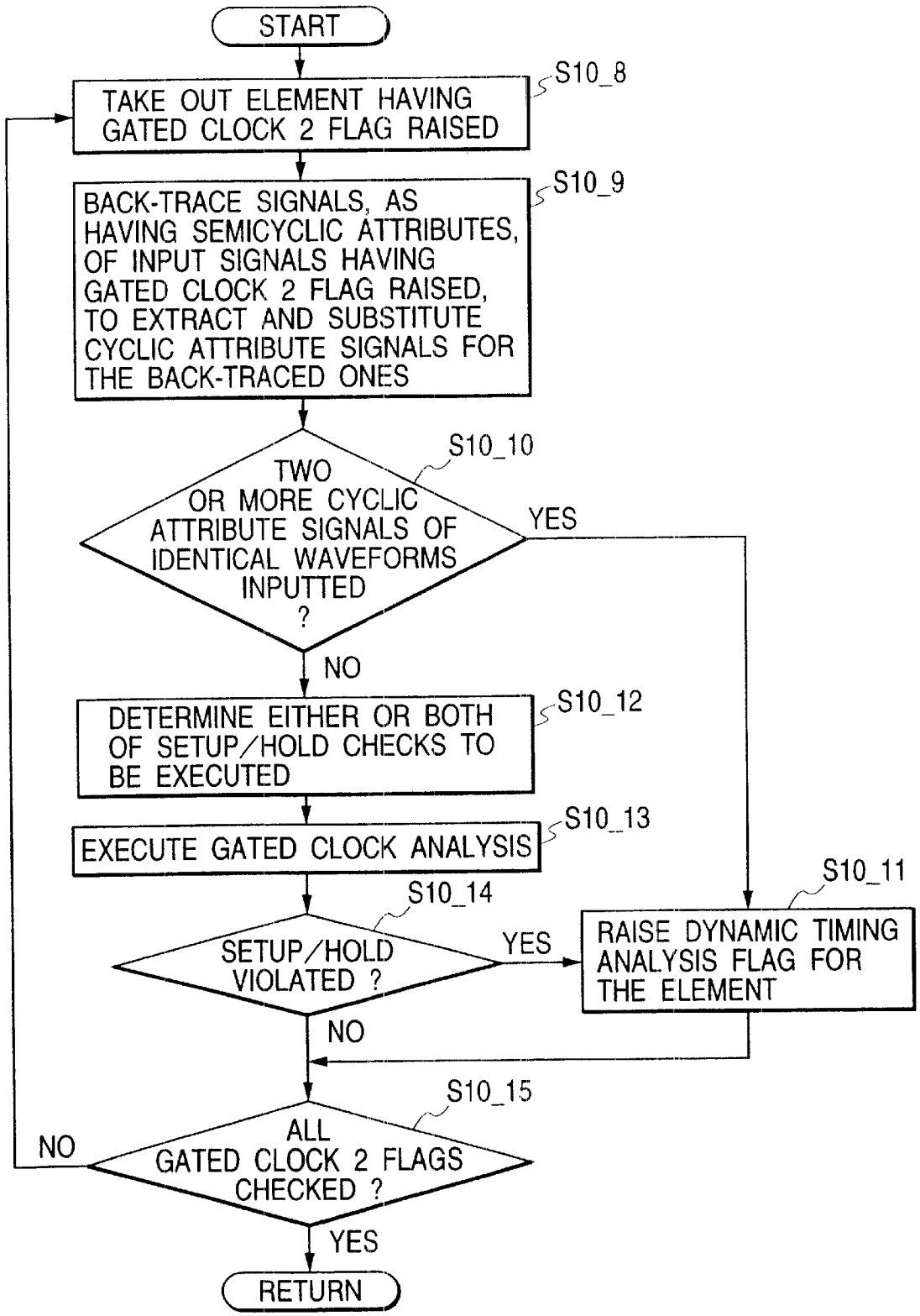
FIG. 22 is a flow chart showing another example of the internal operation of Step S10 of FIG. 4.

FIG. 22 is a flow chart showing another flow of the internal operation of Step S10. When the operation of Step S10 is started, the element having the gated clock 2 flag raised is taken out at first Step S10_8.

At Step S10_9, such ones of the input signals to that element as have the semicyclic attributes are back-traced to extract and substitute the cyclic attribute signals for the back-traced signals.

At Step S10_10, it is decided whether or not two or more cyclic attribute signals of the identical waveforms are inputted to that element. The routine shifts to Step S10_11, if inputted, but to Step S10_12 if not.

At Step S10_11, the dynamic timing analysis flag is raised for that element, and the routine shifts to Step S10_15. This is because there is a fear of hazard if it is decided at Step S10_10 that two or more cyclic attribute signals of the identical waveforms are inputted.

At Step S10_12, it is determined that either or both of the setup restriction check and the hold restriction check are to be executed on the basis of the logic simulation result of the gated clock analyzing dump points.

At Step S10_13, the gated clock analysis is executed by the static timing analysis device. At Step S10_14, it is decided whether or not the setup restriction or the hold restriction is violated. The routine shifts to Step S10_11, if YES, but to Step S10_15 if NO.

At Step S10_15, it is decided whether or not all the elements having the gated clock 2 flag raised in the object circuit are checked. The routine shifts to Step S10_8, if not checked, but is ended if checked.

At the forgoing Step S12, the following operations are executed, although their detailed steps are not shown.

Specifically, it is recognized that the circuit (logic) for feeding its output to the asynchronous reset terminal or the asynchronous set terminal of the flip-flop or the latch is controlled by the clock signal.

When the control by the clock signal is recognized, it is decided at Step S10 whether or not the dynamic timing analysis flag is raised. At this Step, therefore, it is not especially decided whether or not the dynamic timing analysis flag is raised.

On the other hand, it is recognized whether or not a signal at a fixed value is fed to the circuit (logic) for feeding its output to the asynchronous reset terminal or the asynchronous set terminal of the flip-flop or the latch, or whether or not a node to be fed with the signal of the fixed value is in that circuit.

When the signal of the fixed value is neither fed nor is in the circuit the node to be fed with the signal of the fixed value, the output of the circuit is determined by the input signal thereto so that the dynamic timing analysis flag is raised for that flip-flop or the latch.

When the signal of the fixed value is fed or when the node to be fed with the signal of the fixed value is in the circuit, it is recognized whether or not the fixed value is propagated to the asynchronous reset terminal or the asynchronous set terminal.

When it is recognized that the fixed value is propagated to the asynchronous reset terminal or the asynchronous set terminal, the dynamic timing analysis flag is not raised for that flip-flop or the latch. When it is recognized that the fixed value is not propagated to the asynchronous reset terminal or the asynchronous set terminal, on the contrary, the signal to be fed to the asynchronous reset terminal or the asynchronous set terminal is determined by the signal fed to that circuit. In this case, therefore, the dynamic timing analysis flag is raised for that flip-flop or the latch.

Figure 23:
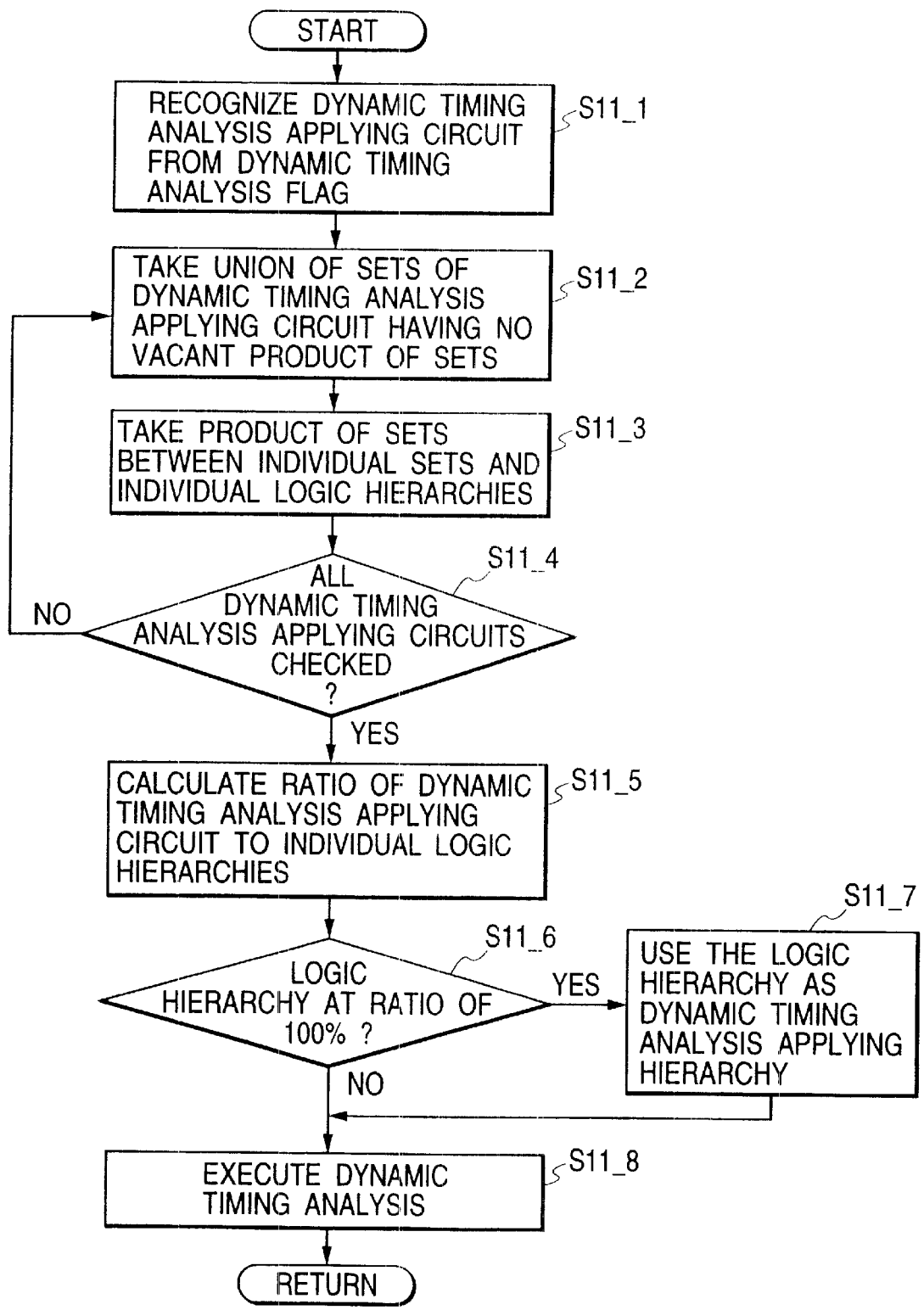
FIG. 23 is a flow chart showing an example of the internal operation of Step S11 of FIG. 4.

FIG. 23 is a flow chart showing a flow of the internal operation of Step S11. When the operation of the Step S11 is started, at first Step S11_1, the dynamic timing analysis applying circuit is recognized from the dynamic timing analysis flag.

Next, at step S11_2, there is constructed a sum of sets of dynamic timing analysis applying circuit having no empty product of sets. At Step S11_3, the product of sets between the individual unions and the individual logic hierarchies is calculated.

At Step S11_4, it is decided whether or not all the dynamic timing analysis applying circuits in the object circuit are checked. The routine shifts to Step S11_5, if checked, but to Step S11_1 if not.

At Step S11_5, the ratio of dynamic timing analysis applying circuits in the individual logic hierarchies is calculated. At Step S11_6, it is decided whether or not there is a logic hierarchy having a ratio of 100%. The routine shifts to Step S11_7, if YES, but to Step S11_8 if NO.

At Step S11_7, the logic hierarchy operation is used as the dynamic timing analysis applying hierarchy, and the routine shifts to Step S11_8.

At Step S11_8, the dynamic timing analysis is executed by the dynamic timing analyzing device, and the routine is then ended.

Here, FIG. 23 shows a processing flow of the case in which the operations of Steps S10_5 and S10_6 of FIG. 20 and Steps S10_12 and S10_13 of FIG. 21 are not executed. When these operations of Steps S10_5 and S10_6 of FIG. 20 and Steps S10_12 and S10_13 of FIG. 21 are to be executed, the operations of Steps S11_1_5, S11_1_6, S11_1_7 and S11_1_8 are not executed of FIG. 23.

Figure 24:
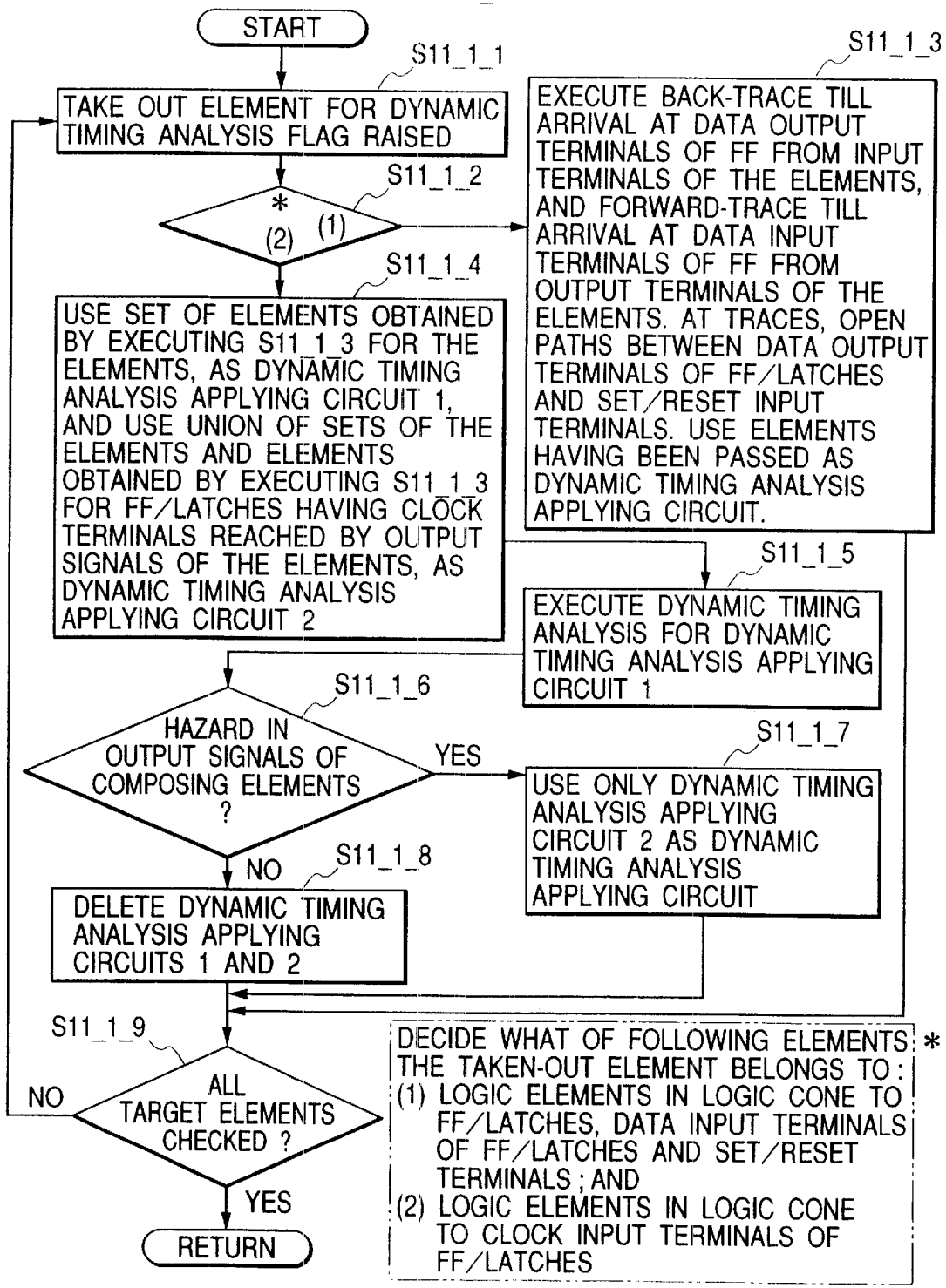
FIG. 24 is a flow chart showing an example of the internal operation of Step S11_1 of FIG. 23.

FIG. 24 is a flow chart showing a flow of the internal operation of Step S11_1. When the operation of Step S11_1 is started, at first Step S11_1_1, the element having the dynamic timing analysis flag raised is taken out.

At Step S11_1_2, it is decided what of the following elements that element belongs to: (1) the logic elements in the logic cone to the flip-flops or the latches or the data input terminals or the set/reset terminals of the flip-flops or the latches; and (2) the logic elements in the logic cone to the clock terminals of the flip-flops or the latches. The routine shifts to step S11_1_3, if (1), but to Step S11_1_4 if (2).

At Step S11_1_3, the path between the data output terminals and the set/reset terminals, i.e., the path in the flip-flop and the latch is made passable at the trace executing time so that the back trace is executed till arrival from the input terminals of the element to the data output element of the flip-flop and so that the forward trace is executed till arrival at the data input terminal of the flip-flop from the output terminal of the element. 10 The elements having been passed by those traces and the destination flip-flop are used as the dynamic timing analysis applying circuit, and the routine shifts to Step S11_1_9.

At Step S11_1_4, the elements obtained by executing Step S11_1_3 are used as the dynamic timing analysis applying circuit 1, and the sum of sets of those elements and the elements obtained by executing the Step S11_1_3 for the flip-flops and the latches having the clock terminals reached by tracing and propagating the output signals of the elements is used as the dynamic timing analysis applying circuit 2.

At Step S11_1_5, the dynamic timing analysis is executed for the dynamic timing analysis applying circuit 1. At Step S11_1_6, it is decided whether or not a hazard has occurred in the output signals of the element in the dynamic timing analysis applying circuit 1. The routine shifts to Step S11_1_7, if YES, but to Step S11_1_8 if NO.

At Step S11_1_7, only the dynamic timing analysis applying circuit 2 is used as the dynamic timing analysis applying circuit, and the routine shifts to Step S11_1_9.

At Step S11_1_8, the dynamic timing analysis applying circuits 1 and 2 are deleted.

At Step S11_1_9, it is decided whether or not all the elements, for which the dynamic timing analysis flag is raised, in the object circuit are checked. The routine shifts to Step S11_1_1, if not checked, but is ended if checked.

Figure 25:
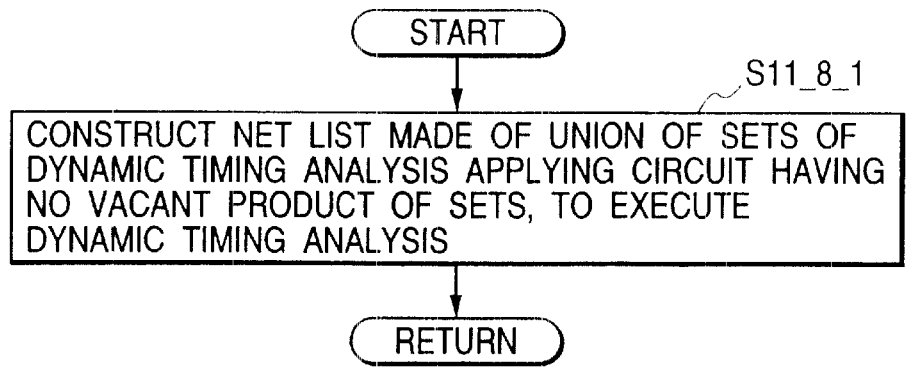
FIG. 25 is a flow chart showing an example of the internal operation of Step S11_8 of FIG. 23.

FIG. 25 is a flow chart showing a flow of the internal operation of Step S11_8. When the operation of Step S11_8 is started, at Step S11_8_1, the elements composing the union of the dynamic timing analysis applying circuit having no empty product of set and their connection information are constructed to execute the dynamic timing analysis by using the input pattern, and the routine is ended.

Figure 26:
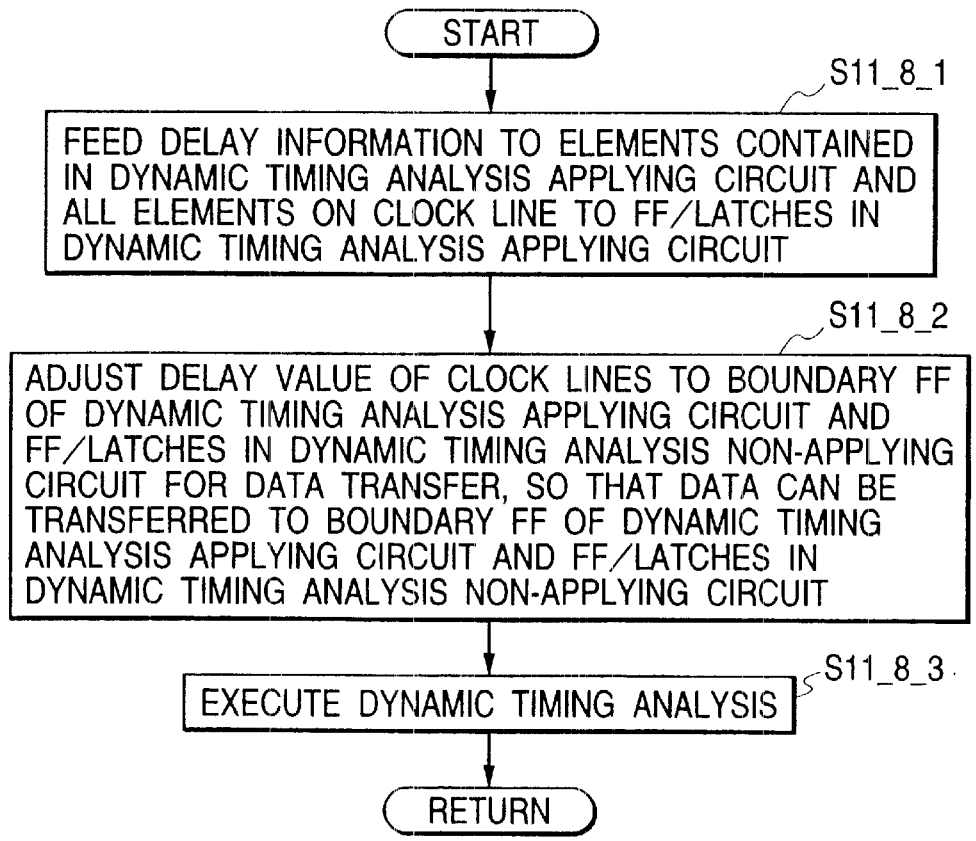
FIG. 26 is a flow chart showing an example of the internal operation of Step S11_8 of Embodiment 2.

FIG. 26 is a flow chart showing another example of the flow of the internal operation of Step S11_8. At Step S11_8_1, delay information is fed to the elements and net constructing the dynamic timing analysis applying circuit and all the elements and nets on the clock tree to the clock terminals of the flip-flops and the latches in the dynamic timing analysis applying circuit.

Next, at Step S11_8_2, in order to transfer data to the flip-flops and the latches in the dynamic timing analysis non-applying circuit for transferring data with the flip-flops constructing the boundary of the dynamic timing analysis applying circuit, there is adjusted the delay value of all the elements of the nets on the clock tree to the flip-flops and the latches in the dynamic timing analysis non-applying circuit for transferring data with the flip-flops constructing the boundary of the dynamic timing analysis applying circuit. The routine is ended after the dynamic timing analysis was executed at Step S11_8_3.

<<Example of Processing Specific Object circuit>>

Figure 27:
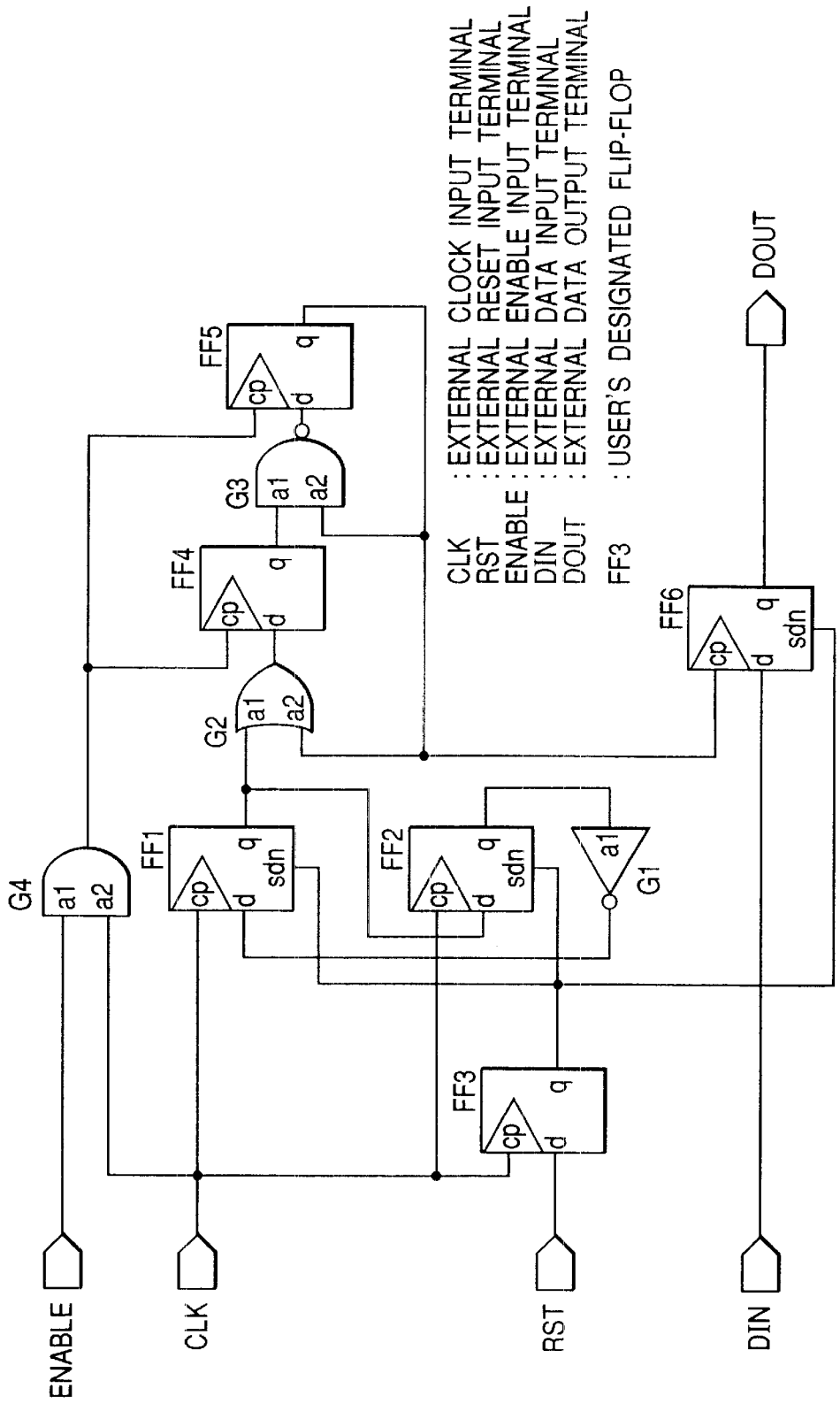
FIG. 27 is a circuit diagram of a counter candidate circuit as an example of an object circuit.

A specific example of the operation by the counter candidate recognition S1_3 will be described by taking up one example of the object circuit. FIG. 27 is a circuit diagram showing one example of the object circuit. This object circuit is provided with: an external input pin DIN to be fed with a data signal from the outside; an external input pin ENABLE to be fed with an enable signal from the outside; an external input pin RST to be fed with a reset signal from the outside; an external input pin CLK to be fed from a clock signal from the outside; and an external output pin DOUT for outputting the data signal to the outside.

Elements G1, G2, G3 and G4 are all the logic elements, and elements FF1, FF2, FF3, FF4, FF5 and FF6 are all flip-flops. At first Step S1_3_1, the storage unit 5 is stored with the table of the set of F={FF1, FF2, FF3, FF4, FF5 and FF6} of the flip-flops and the latches in the object circuit.

Next, at Step S1_3_2, the flip-flop FF1 is taken out from the set F. At step S1_3_3, the set of the flip-flops and the latches traced at and after Step S1_3_4 is designated by T_f, and the set of the logic elements is designated by T_c. These individual sets are emptied and stored in the storage unit 5.

When the back trace is executed at Step S1_3_5 from the data input terminal d of the FF1, the data output terminals q of the element G1 and the flip-flops FF2 and FF1 are reached. When the back trace is executed from a reset terminal sdn of the FF1, the flip-flop FF3 designated by the user is reached.

When the branching is made at Step S1_3_6 by the aforementioned reached net attributes, the attributes are neither those of the counter nor those of the uncounter, so that the routine shifts to Step S1_3_7.

When the branching by the destination is executed at Step S1_3_7, the destination is the data output terminal q of the FF1 and the flip-flop FF3 designated by the user so that the routine shifts to Step S1_3_8.

Next, at Step S1_3_8, T_f={FF1, FF2} and T_c={G1}, and these are stored in the storage unit 5.

At Step S1_3_10, F={FF3, FF4, FF5, FF6}, and the counter attributes are set for the net of T_f and T_c and stored in the storage unit 5. At Step S1_3_11, the set F is not empty so that the routine shifts to Step S1_3_2.

Next, at Step S1_3_2, the set F is taken out from the FF5. At Step S1_3_3, the set of the flip-flops and the latches to be traced at and after Step S1_3_5 is designated by T_f, and the set of the logic elements is designated by T_c. These sets are made empty and stored in the storage unit 5.

When the back trace is executed at Step S1_3_5 from the data input terminal d of the FF5, there are recognized: the path to reach the element G3 and the data output terminals q of the FF5, the path to reach the element G3, the FF4, the G2 and the data output terminal q of the FF5, and the path to reach the counter attribute net connected with the output terminals of the elements G3, FF4, G2 and FF1.

The branching is executed at Step S1_3_6 and Step S1_3_7, and the routine shifts to Step S1_3_7. At Step S1_3_8, T_f={FF4, FF5} and T_c={G3, G2}, and these sets are stored in the storage unit 5.

At Step S1_3_10, F={FF3, FF6}, and the counter attributes are set for the net of T_f and T_c and stored in the storage unit 5. At Step S1_3_11, the set F is not empty so that the routine shifts to Step S1_3_2.

When the operation of Step S1_3 is executed for the FF3 and the FF6, the destinations of the individual back traces are the external terminals. Thus, the routine shifts to Step S1_3_10 through Step S1_3_9 to set the uncounter attributes, and the routine is ended.

Figure 28:
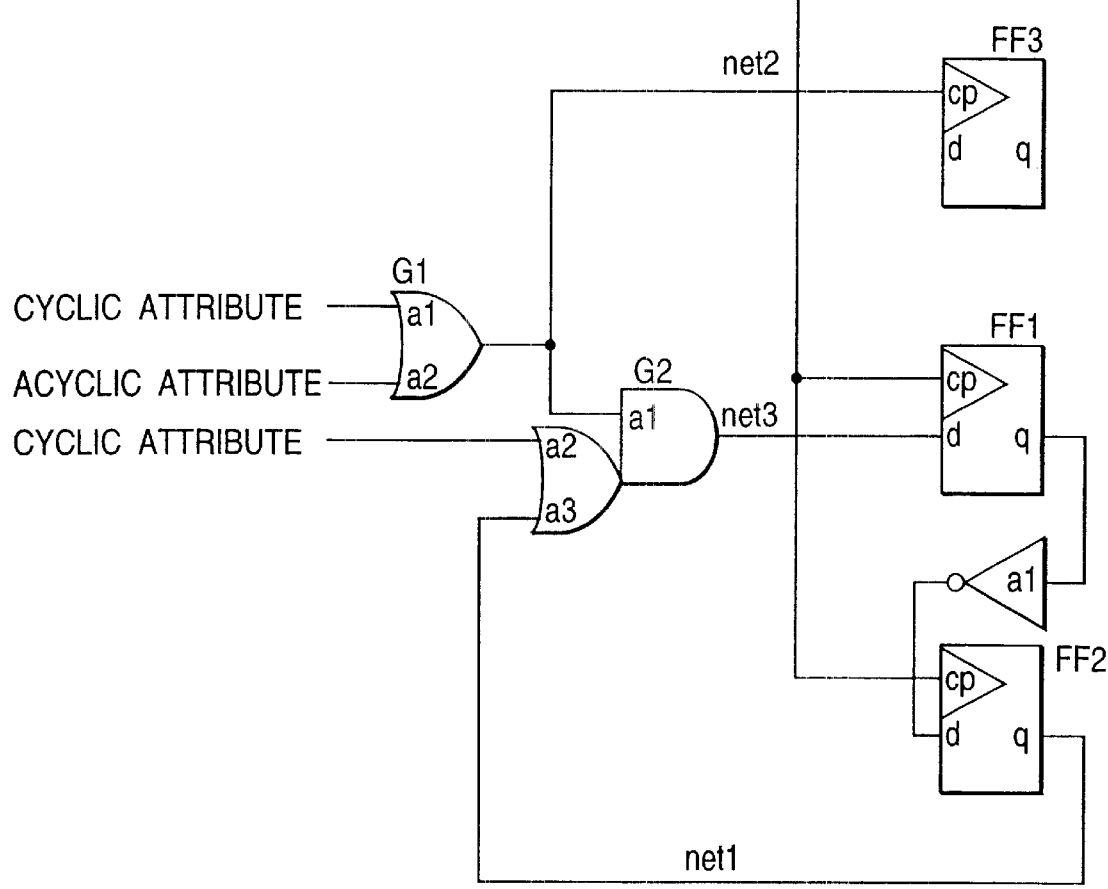
FIG. 28 is a circuit diagram of an attribute calculating circuit as an example of the object circuit.

A specific example of the operation by the attribute calculation S1_4 will be described by taking up another example of the object circuit. FIG. 28 is a circuit diagram showing one example of the object circuit. In this object circuit: the net connected with the cp terminals of the elements FF1 and FF2 has the cyclic attributes; the net connected with the al terminal of the element G1 has the cyclic attributes; the net connected with the a2 terminal of the element G1 has acyclic attributes; and the net connected with the a2 terminal of the element G2 has the cyclic attributes.

Both the elements G1 and G2 are the logic elements, and all the elements FF1, FF2 and FF3 are the flip-flops. The to_clk flag is raised for the element G1, and the to_data flag is raised for the element G2. On the other hand, it is assumed that the attributes of the input signals to the a1 terminal of the element G1 and the a2 terminal of the element G2 are changed.

At first Step S1_4_1, the elements G1 and G2 having the input signal attributes changed are recognized and stored in the storage unit 5. At Step S1_4_2, it is decided whether or not the elements G1 and G2 are the one-input element. The routine shifts to Step S1_4_4 because they are not the one-input element.

At Step S1_4_4, the flags of the elements G1 and G2 are judged. The element Gi has the to_clk flag raised so that the routine shifts to Step S1_4_6, and the element G2 has the to_data flag raised so that the routine shifts to Step S1_4_5.

At Step S1_4_5, it is decided whether or not the input signal of the element G2 forms a feedback path. Since the signal to the a3 terminal of the element G2 forms the feedback path, the routine shifts to Step S1_4_7.

Next at Step S1_4_7, the net net1 connected with the a3 terminal of the element G2 forming the feedback path is set to the acyclic attributes at the first Step S1_1 of the recognition S1 of the clock information so that the routine shifts to Step S1_3_8.

At Step S1_3_8, the net net3 connected with the output signal of the element G2 is set to have the acyclic attributes, which are stored in the storage unit 5, and the routine shifts to Step S1_4_9.

At Step S1_4_6, on the other hand, the net connected with the a1 input terminal of the element G1 has the cyclic attributes, and the net connected with the a2 input terminal has the acyclic attributes.

Therefore, the net net2 connected with the output signal of the element G1 is set to have the duasi-periodic attributes, which are stored in the storage unit 5, and the routine shifts to Step S1_4_9.

At Step S1_4_9, it is decided whether or not there is an element having changed the attributes of the data input signal net. In the case of this circuit example, no element has changed the attributes of the data input signal net so that the routine is ended.

Figure 29:
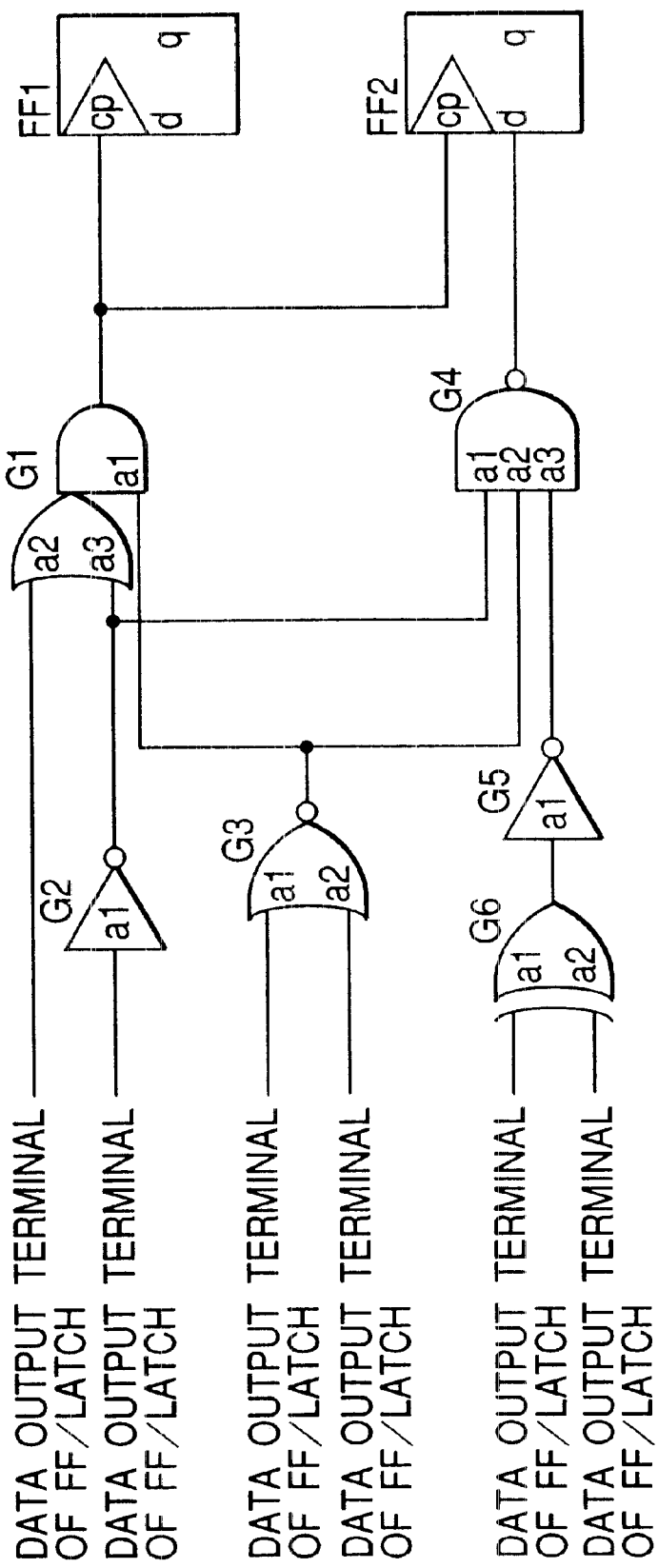
FIG. 29 is a circuit diagram of a sorting circuit as an example of the object circuit.

A specific example of the operation by the attribute calculation S1_4 will be described by taking up another example of the object circuit. FIG. 29 is a circuit diagram showing one example of the object circuit. In this object circuit, the signals to the a2 terminal of the element G1, the a1 terminal of the element G2, the a1 and a2 terminals of the element G3, and the a1 and a2 terminals of the element G6 are those from the data output terminals of the flip-flops or the latches.

All the elements G1, G2, G3, G4, G5 and G6 are the logic elements, and both the elements FF1 and FF2 are the flip-flops.

At first Step S1_4_4_1, the logic cone to the cp terminals of the FF1 and FF2 is recognized and stored in the storage unit 5. In the case of this circuit diagram, the logic cone to the cp terminals of the FF1 and FF2 is a circuit composed of the elements G1, G2 and G3.

At Step S1_4_4_2, the to_clk flag is raised for the elements G1, G2 and G3 and stored in the storage unit 5.

At Step S1_4_4_3, it is decided whether or not all the flip-flops and the latches in the object circuit are processed. Since all of these are processed, the routine shifts to Step S1_4_4_4.

At Step S1_4_4_5, the logic cone to the d terminals of the FF2 is recognized and stored in the storage unit 5. In the case of this circuit diagram, the logic cone to the d terminal of the FF2 is a circuit composed of the elements G3, G4, G5 and G6.

Next, at Step S1_4_4_6, the to_data flag is raised for the elements G4, G5 and G6 having no to_clk flag raised and is stored in the storage unit 5.

At Step S1_4_4_3, it is decided whether or not all the flip-flops and the latches in the object circuit are processed. Since this answer is YES, the routine is ended.

Figure 30:
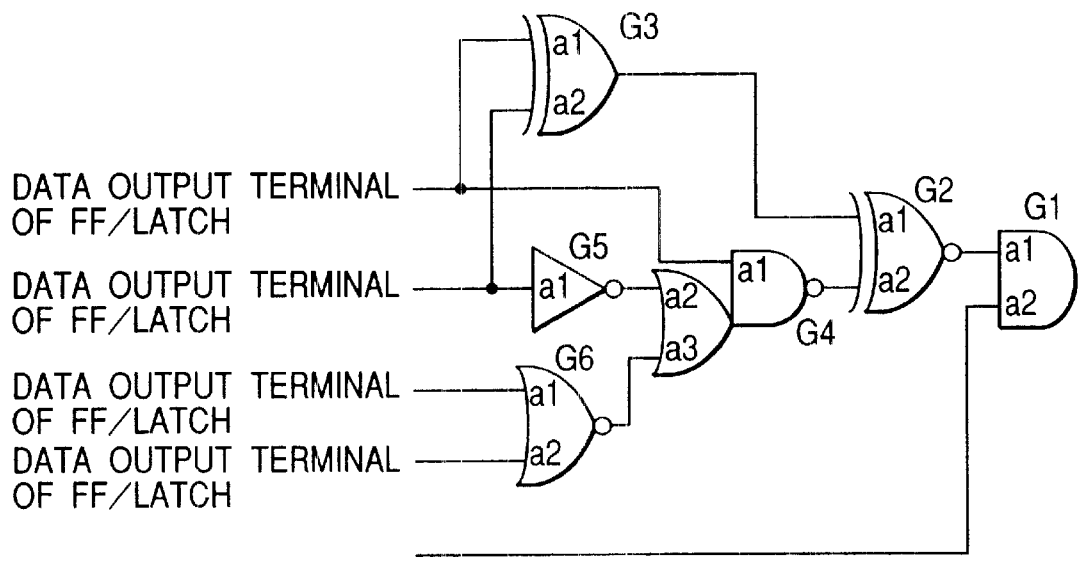
FIG. 30 is a circuit diagram of a logic cone circuit as an example of the object circuit.

A specific example of the operation by the attribute calculation S1_4_4_1 will be described by taking up another example of the object circuit. FIG. 30 is a circuit diagram showing one example of the object circuit. In this object circuit, the signals to the a1 and a2 terminals of the element G3, the a1 terminal of the element G5, the a1 and a2 terminals of the element G6 are those coming from the data output terminals of the flip-flops or the latches.

All the elements G1, G2, G3, G4, G5 and G6 are the logic elements. At first Step S1_4_4_1_1, the a1 terminal of the element G1 is recognized and stored in the storage unit 5.

At Step S1_4_4_1_2, the element G2 connected with the a1 terminal of the element G1 is recognized and stored in the storage unit 5.

At Step S1_4_4_1_3, the back trace is executed from the a1 terminal of the element G2 to take out the element G3. Since the signals to the a1 and a2 terminals of the element G3 are those coming from the data output terminals of the flip-flops or the latches, the back trace is executed from the a2 terminal of the element G2 to take out the element G4. Since the signal to the a1 terminal of the element G4 is that coming from the data output terminal of the flip-flop or the latch, the back trace is executed from the a2 terminal of the element G4 to take out the element G5. Since the signal to the a1 terminal of the element G5 is that coming from the data output terminal of the flip-flop or the latch, the back trace is executed from the a3 terminal of the element G4 to take out the element G6. Since the signal to the a1 terminal of the element G6 is that coming from the data output terminal of the flip-flop or the latch, the back trace is ended to construct the circuit composed of the elements G2, G3, G4, G5 and G6 obtained by the trace result. This circuit is stored in the storage unit 5 as the logic cone to the a1 terminal of the element G1, and the routine is ended.

Figure 31:
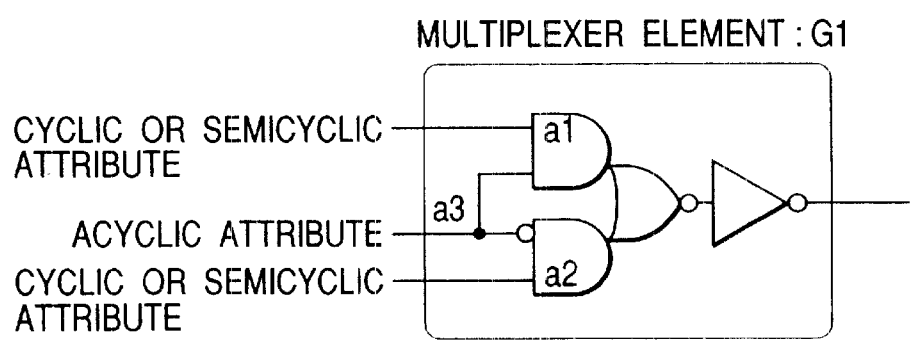
FIG. 31 is a circuit diagram of a clock selecting circuit as an example of the object circuit.

A specific example of the operation by the clock selecting logic flag S2_2 will be described by taking up another example of the object circuit. FIG. 31 is a circuit diagram showing one example of the object circuit. In this object circuit, the cyclic or semicyclic attribute net is connected with the a1 and a2 terminals of the element G1, and the acyclic attribute net is connected with the a3 terminal of the element G1.

The element G1 is the logic element. At first Step S2_2_1, the element G1 having two or more input terminals connected with the cyclic and semicyclic attribute nets is recognized and stored in the storage unit 5.

Next, at Step S2_2_2, the element G1 is the multiplexer element so that the routine shifts to Step S2_2_3.

At Step S2_2_3, the clock selecting logic flag is raised for the element G1. At Step S2_2_10, the routine is ended.

Figure 32:
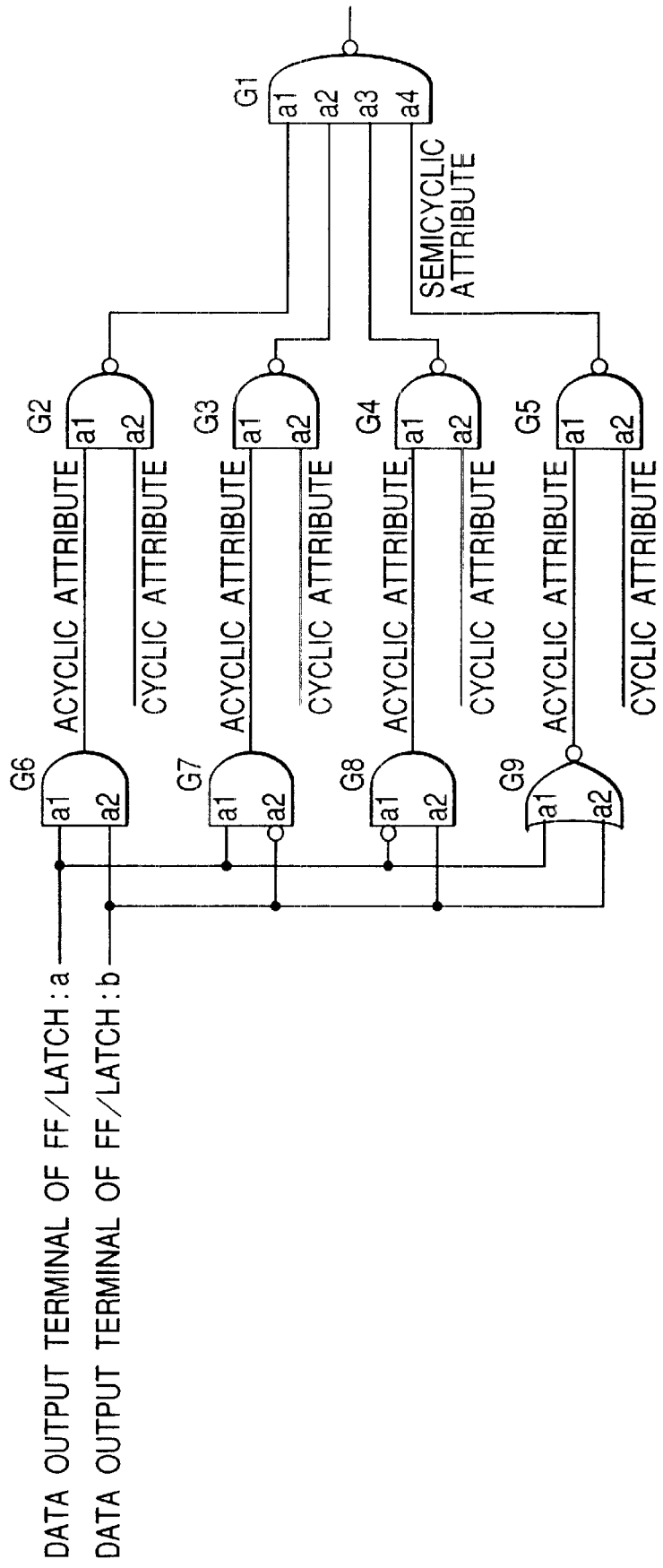
FIG. 32 is a circuit diagram of another clock selecting circuit as an example of the object circuit.

On the other hand, FIG. 32 is a circuit diagram showing still another example of the object circuit. In this object circuit: the semicyclic attribute net is connected with the a1, a2, a3 and a4 terminals of the element G1; the acyclic attribute net is connected with the a1 terminals of the elements G2, G3, G4 and G5; the cyclic attribute net is connected with the a2 terminals of the elements G2, G3, G4 and G5; and the signals from the data output terminals of the flip-flops or the latches are connected with the a1 and a2 terminals of the elements G6, G7, G8 and G9.

The elements G1, G2, G3, G4, G5, G6, G7, G8 and G9 are the logic elements. At first Step S2_2_1, the element G1 having an input terminal connected with two or more cyclic and semicyclic attribute nets is recognized and stored in the storage unit 5.

Next, at Step S2_2_2, the element G1 is not the multiplexer element so that the routine shifts to Step S2_2_4.

At Step S2_2_4, the back trace is executed from the a1, a2, a3 and a4 terminals of the element G1, and the elements G2, G3, G4 and G5 having input terminals connected with the cyclic and acyclic attribute nets are recognized and stored together with the connection information with the remaining elements in the storage unit 5.

At Step S2_2_5, the back traces fails to reach the data output terminals of the flip-flops or the latches so that the routine shifts to Step S2_2_7.

At Step S2_2_7, the back trace is executed from the a1 terminals of the elements G2, G3, G4 and G5, and the elements G6, G7, G8 and G9 having input terminals connected with the signals coming from the data output terminals of the flip-flops or the latches to construct input logic functions to the a1 terminals of the elements G2, G3, G4 and G5 thereby to calculate the logic product and the logic sum and to store the results in the storage unit 5. In the case of this circuit diagram: the input logic function to the a1 terminal of the element G2 is a·b; the input logic function to the a1 terminal of the element G3 is a·/b (wherein slash "/" means the logical inversion of the slashed signal); the input logic function to the a1 terminal of the element G4 is /a·b; and the input logic function to the a1 terminal of the element G5 is /a·/b.

The logic product of the outputs of the elements G2 to G5 is:

$$(a\cdot b)\cdot(a\cdot /b)\cdot(/a\cdot b)\cdot(/a\cdot /b)=0;$$

and
the logic sum is:

$$(a\cdot b)+(a\cdot /b)+(/a\cdot b)+(/a\cdot /b)=1.$$

At Step S2_2_9, the logic product is 0, and the logic sum is 1. Because of this exclusiveness, the routine shifts to Step S2_2_3.

At Step S2_2_3, the clock selecting logic flag is raised for the elements G1, G2, G3, G4 and G5. At Step S2_2_10, the routine is ended.

Figure 33:
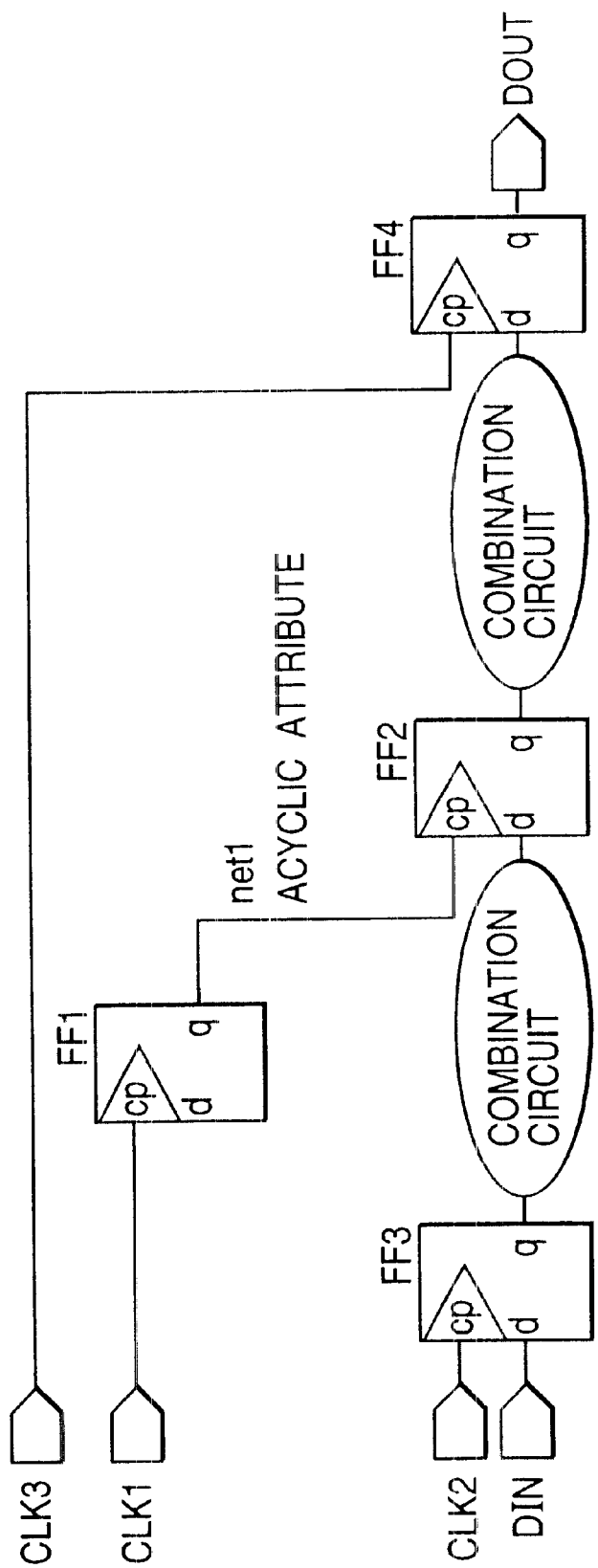
FIG. 33 is a circuit diagram of an asynchronous flip-flop/latch circuit as an example of the object circuit.

A specific example of the operation by the extraction S7 of the clock waveform candidates for the acyclic flip-flops and the acyclic latches by taking up another example of the object circuit. FIG. 33 is a circuit diagram showing one example of the object circuit. This object circuit is provided with: external input pins CLK1, CLK2 and CLK3 to be fed with three kinds of clock signals from the outside; an external input pin DIN to be fed with the data signal from the outside; and an external output pin DOUT for outputting the data signal to the outside.

All the elements FF1, FF2, FF3 and FF4 are the flip-flops, and the combination circuit has one having no feedback path therein. On the other hand, the net1 is an acyclic attribute net.

At first Step S7_1, the net1 and the element FF1 having a cyclic attribute signal to the clock terminal cp and an output terminal connected with the net1 are recognized and stored in the storage unit 5.

Next, at Step S7_2, the element connected with the cp terminal of the element FF2 is only the FF1 so that the routine shifts to Step S7_3.

Figure 34:
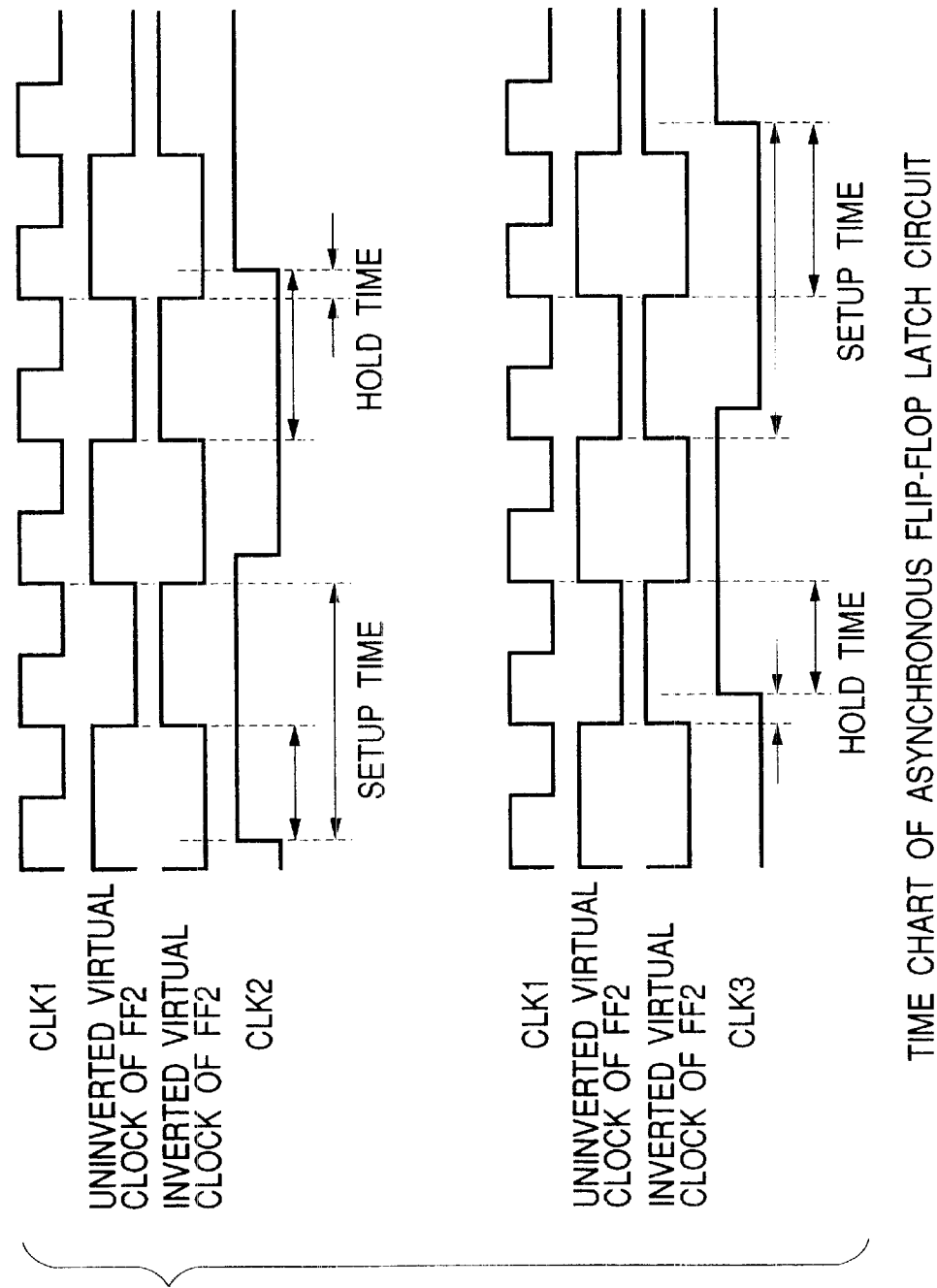
FIG. 34 is a timing chart showing the operations of the circuit diagram of FIG. 33.

At Step S7_3, with respect to the data output terminal q of the element FF1, an inverted virtual clock of the FF2, i.e., the inverted clock of a duty of 50% having a cycle twice as long as that of the CLK1, as shown in FIG. 34, and an uninverted virtual clock of the FF2, that is, the uninverted clock of a duty of 50% having a cycle twice as long as that of the CLK1 are defined and stored in the storage unit 5.

At Step S7_5, the timing chart shown in FIG. 34 is prepared, and it is stored in the storage unit 5 that the use of the inverted virtual clock of the FF2 for the setup analysis in the data transfer from the FF3 and the use of the uninverted virtual clock of the FF2 for the hold analysis are the most strict condition, and that the use of the uninverted virtual clock for the setup analysis in the data transfer to the FF4 and the use of the inverted virtual clock of the FF2 for the hold analysis are the most strict condition. At Step S7_4, the routine is ended.

Figure 35:
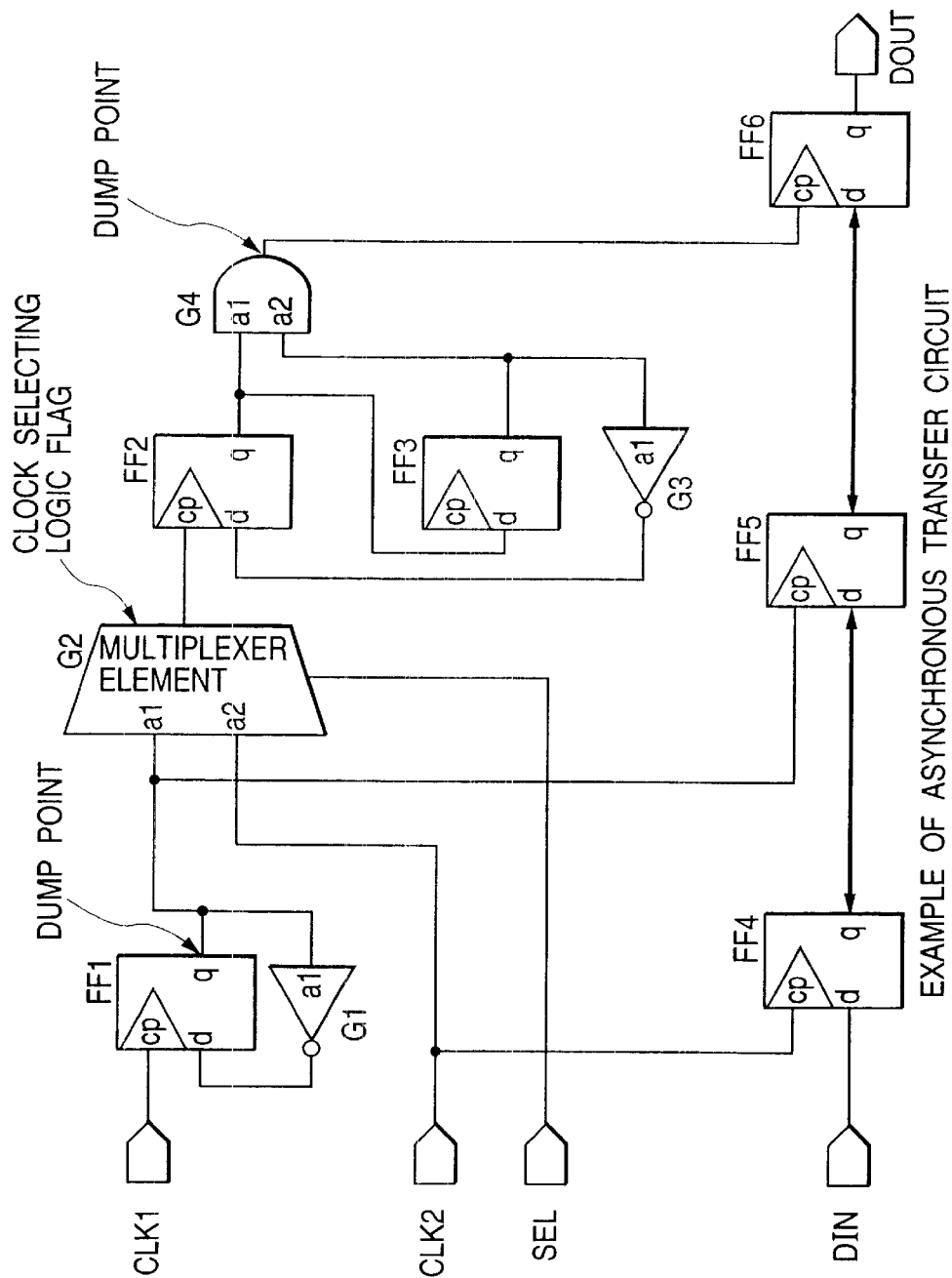
FIG. 35 is a circuit diagram of an asynchronous transfer circuit as an example of the object circuit.

A specific example of the operation by the asynchronous transfer extraction S7 by taking up another example of the object circuit. FIG. 35 is a circuit diagram showing one example of the object circuit. This object circuit is provided with: external input pins CLK1 and CLK2 to be fed with two kinds of clock signals from the outside; an external input pin SEL to be fed with a clock switching signal from the outside; an external input pin DIN to be fed with the data signal from the outside; and an external output pin DOUT for outputting the data signal to the outside.

All the elements FF1, FF2, FF3, FF4, FF5 and FF6 are the flip-flops, and the elements G1, G2, G3 and G4 are the logic elements, of which the element G2 has a clock selecting logic element flag raised. on the other hand, the data output terminal q of the FF1 and the output terminal of the element G4 are dump points for generating clock waveforms.

At first Step S5_1, an oriented graph (V1, A1) having a set of apexes V1={CLK1, FF1, G4} and a set of sides A1={(CLK1, FF1), (FF1, G4)}, and an oriented graph (V2, A2) having a set of apexes V2={CLK2, G4} and a set of sides A2={(CLK2, G4)} are constructed and stored in the storage unit-5.

Next at Step S5_2: the set F1={FF5, FF6} of the flip-flops and the latches using the apexes of the oriented graph (V1, A1) as the clock source and the set F2={FF4, FF6} of the flip-flops and the latches using the apexes of the oriented graph (V2, A2) as the clock source are recognized and stored in the storage unit 5; a set P={(FF4, FF5), (FF5, FF6)} of pairs transferring data at the elements FF4, FF5 and FF6 is recognized and stored in the storage unit 5; the data transfers (FF4, FF5) between the flip-flops and the latches contained in the F1 and the flip-flops and the latches not using the apexes of the oriented graph (V1, A1) as the clock source are recognized as the asynchronous transfers; and the data transfers (FF4, FF5) and (FF5 and FF6) between the flip-flops and the latches contained in the F2 and the flip-flops and the latches not using the apexes of the oriented graph (V2, A2) as the clock source are recognized as the asynchronous transfers. From these results, it is recognized and stored in the storage unit 5 that the data transfers (FF4, FF5) are the asynchronous transfers irrespective of the state of the clock selecting logic element G2, and that the data transfers (FF5, FF6) are the asynchronous transfers only when the oriented graph (V2, A2) is selected by the clock selecting logic element G2. Then, the routine is ended.

Thus, in order to recognize the asynchronous transfer path or the elements constructing this path, the passage of the in-element path from the clock terminal to the data output terminal is admitted, and the elements having admitted the aforementioned passage from the external terminals and the clock path passing through the clock selecting element such as the multiplexer are expressed by the graph jointing the clock sources to grasp the set of the elements using the clock sources of the graph. Moreover, the data transfer between the element using the clock source of an i-th graph as the clock source and the element not using the clock source of the i-th graph as the clock source is recognized as the asynchronous transfer. If the element of the path recognized as the asynchronous transfer is one using the apexes of the graphs different before and after the selecting logic, the path is always the asynchronous transfer. If the element of the path recognized as the asynchronous transfer is one using the apexes of the graphs identical before and after the selecting logic, the path is the asynchronous transfer in accordance with the selected state of the selecting logic. This asynchronous transfer path recognizing method (or the asynchronous transfer path extracting operation) has less data to be processed by the computer than that of the method of grasping the clock path by dividing the clock selecting logic as in the multiplexer. Therefore, the memory capacity necessary for the operations by the computer and for making the table can be reduced to complete the data processing quickly.

A specific example of the operation by the extraction S9 of the multi-cycle path candidates by taking up another example of the object circuit. FIG. 36 is a circuit diagram showing one example of the object circuit. This object circuit is provided with: external input pins CLK1 and CLK2 to be fed with two kinds of clock signals from the outside; an external input pin DIN to be fed with the data signal from the outside; and an external output pin DOUT for outputting the data signal to the outside.

The element FF1 is a flip-flop; the element G1 is a logic element, for which the gated clock 2 flag is raised; and the net1 has the acyclic attributes.

At first Step S9_1, the element G1 having the gated clock 2 flag raised is taken out and stored in the storage unit 5.

Next, at Step S9_2, the cycle of the CLK1 is set to the T_cycle and stored in the storage unit 5 because the attributes of the net connected with the a1 terminal of the element G1 are cyclic.

At Step S9_3, the back trace is executed because the attributes of the net connected with the a2 terminal of the element G1 are acyclic, and the flip-flop FF1 is recognized to store the storage unit 5 with the attributes of the net connected with the cp terminal of the FF1.

At Step S9_4, the routine shifts to Step S9_5 because the attributes of the net connected with the cp terminal of the FF1 are cyclic.

At Step S9_5, the cycle of the CLK2 is set to the T_acycle and stored in the storage unit 5, and the routine shifts to Step S9_9.

At Step S9_9, a relation of 2×T_cycles>T_acycles holds, and the path from the clock terminal cp of the element FF1 to the input terminal a2 of the element G1 is stored as the multi-cycle path candidate in the storage unit 5 to present the information to the user from the output unit 10. The result having decided whether or not that path is the multi-cycle path is inputted by the user from the delay information input unit 2. If the user judges that the path is the multi-cycle path, the path is stored as the multi-cycle path together with the number of cycles of the setup and the hold, as instructed by the user from the delay information input unit 2, in the storage unit 5. If the user judges that the path is not the multi-cycle path, the path is stored as the single path in the storage unit 5, and the routine shifts to Step S9_8. The routine is ended at Step S9_8.

The static-dynamic timing analysis method thus far described is executed by the computer executing the program. This static-dynamic timing analysis program is the machine program (object program) which is made by compiling the content processed by the static-dynamic timing analysis method on the basis of the source program described in a high-level language such as the C-language and by transforming the compiled program into the object code intrinsic to the target computer.

This static-dynamic timing analysis program is so stored in a recording medium such as the magnetic tape, the floppy disk, the hard disk, the CD-ROM or the MO (Magnet-Optical Disk), although not especially limitative thereto, as can be read by the computer.

Figure 40:
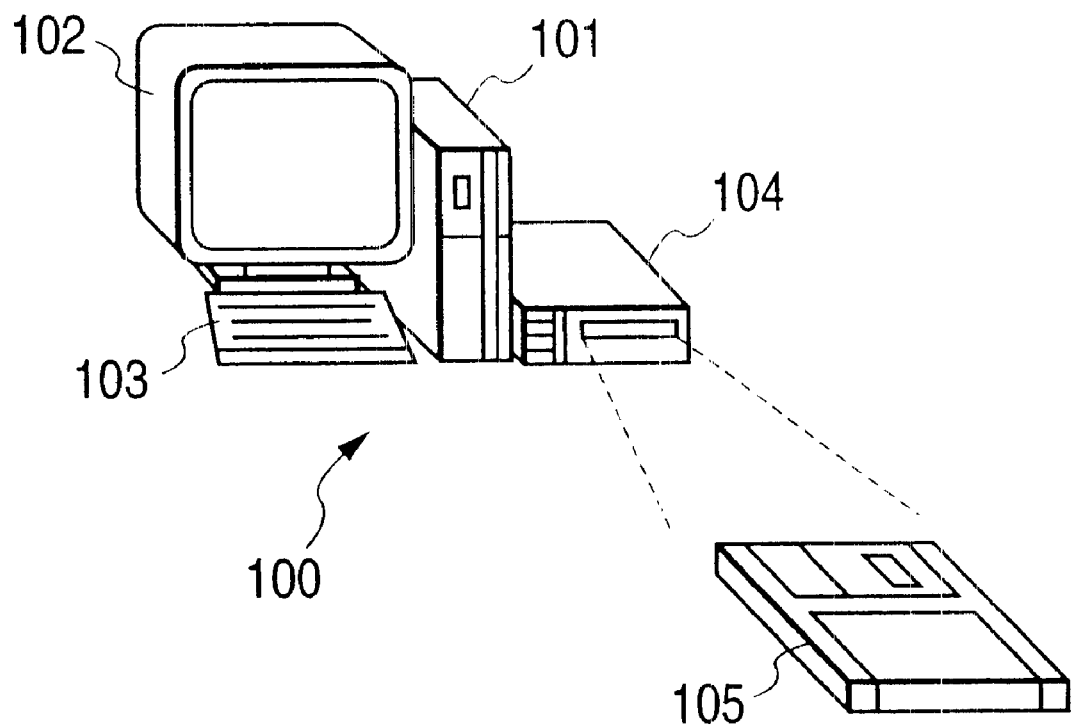
FIG. 40 is a perspective view showing one example of a computer for reading and executing the static-dynamic timing analysis programs from a storage medium.

FIG. 40 shows one example of the computer for reading and executing the static-dynamic timing analysis program from the recording medium.

A computer 100, as shown, is exemplified by an engineering work station or a personal computer and is constructed by connecting peripheral devices, as represented by a display 102, a keyboard 103 and a disk drive 104, with a body 101 having mounted thereon a processor board packaging a processor and a memory and a variety of interface boards.

The aforementioned static-dynamic timing analysis program is stored in a storage medium 105. This storage medium 105 is mounted on the aforementioned disk drive 104, although not especially limitative thereto, and the static-dynamic timing analysis program stored therein is read in the body 101 of the computer. For example, the read static-dynamic timing analysis program is loaded in the memory of the computer body 101 and is sequentially decoded to perform the aforementioned static-dynamic timing analyses. On the other hand, the static-dynamic timing analysis program thus read from the storage medium may be installed in the magnetic storage medium of the hard disk device attached to the computer body 101 and may be loaded in the memory and executed at any time. In this case, the static-dynamic timing analysis program may be stored in a data-compressed state in the storage medium 105 so that it may be decompressed when it is installed in the aforementioned hard disk. In these cases or the like, the computer-readable storage medium storing the static-dynamic timing analysis program may be exemplified by any of the magnetic recording media such as the aforementioned storage medium 105, which is stored with the static-dynamic timing analysis program in the executable state or in the data-compressed state, or the hard disk device packaged in the computer body 101.

Although our invention has been specifically described on the basis of its embodiments, it should not be limited thereto but can naturally modified in various modes without departing from the gist thereof.

The effects to be obtained from a representative of the invention disclosed herein will be briefly described in the following.

With the clock information recognition unit, more specifically, the information of the clock generated inside can be automatically recognized from the information of the clock information to the external input pin to be fed with the clock signal, from the information of the external input pin to be fed with the set or reset signal, and from the information of the flip-flop or latch element to be diverted for the synchronous/asynchronous set/reset or synchronous/asynchronous load of the counter in the object circuit.

As a result, the circuits that are asynchronous with the object circuit and those which are asynchronous with the object circuit can be easily distinguished.

Since the asynchronous transfer path (the circuit portion constructing the path) requiring no timing analysis is recognized, the data transfer path through the flip-flops and the latches fed with the acyclic signal in the object circuit as the clock and the data transfer path between the flip-flops and the latches fed with each asynchron ous signal, that is the signal, for which the phase difference between the signals when the power is ON cannot be defined, as the clock can be recognized as separate asynchronous transfer paths.

The setup/hold analysis can be executed on the gated clock circuit (clock gate) in the object circuit.

Since the multi-cycle path of the input signal having no clock attribute to the logic elements constructing the gated clock circuit is recognized, it is possible to execute the setup/hold analysis of the gated clock circuit by the static timing analysis excluding the pseudo errors in advance.

In the recognition of the data transfer path between the flip-flops and the latches, it is possible to analyze in advance the combination of the clocks to be fed to the flip-flops or the latches at the two ends of the aforementioned data transfer path.

For the flip-flops and the latches fed with the signals other than the clocks at their clock terminals, the virtual clock is decided on its definability and is set, so that the static timing analysis can also be applied to the asynchronous circuit. In other words, the asynchronous circuit is divided into the cyclic circuit and the acyclic circuit so that the static timing analysis can be made on the cyclic circuit. As a result, it is possible to expect a drastic reduction in the number of analyzing steps.

The static timing analysis applying circuit portion and the dynamic timing analysis applying circuit portion can be discriminated to recognize the circuit portion requiring the hazard analysis at the synchronous circuit portion and to execute the dynamic timing analysis to that circuit portion.

By causing the dynamic timing analysis applying circuit portion to cover the appearance of the flip-flops along the transmission path of the signals, the dynamic timing analysis of the dynamic timing analysis applying circuit portion can be executed without considering the signal delay time on the data transfer path to the dynamic timing analysis applying circuit portion from the static timing analysis applying circuit portion.

The correspondence between the dynamic timing analysis applying circuit portion and the logic hierarchy in the object circuit is discriminated so that the logic hierarchy to execute the dynamic timing analysis can be recognized. As a result, the dynamic timing analysis can be executed by using the input signal information to each logic hierarchy prepared at the logic analysis, thereby to make it possible to expect a reduction in the number of analyzing steps.

Along the transmission path of the signals from the flip-flops, as the closest to the input terminals and the output terminals of the static timing analysis applying circuit portion, in the aforementioned dynamic timing analysis applying circuit portion, the flip-flops and the latches outside of the dynamic timing analysis applying circuit portion are discriminated to adjust the propagation delay of the clock signals to the discriminated flip-flops and latches such that the dynamic timing analysis can be made merely by giving only the propagation delay of the clock signals to the aforementioned dynamic timing analysis applying circuit portion and to the flip-flops and the latches in the dynamic timing analysis applying circuit portion at the time of feeding the object circuit with the delay information. As a result, by feeding only the dynamic timing analysis applying circuit portion with the delay information, the dynamic timing analysis of the entire object circuit can be executed, and the input signal information of the entire object circuit, as prepared at the logic analyzing time, can be diverted. This makes it possible to expect the reductions in the time periods and the steps for the analyses.

What is claimed is:

1. A timing analysis method for analyzing the timing of a circuit, comprising
   a static-dynamic timing analysis dividing operation to decide which of a static timing analysis or a dynamic timing analysis is to be applied to said circuit,
   wherein said static-dynamic timing analysis dividing operation includes a clock information recognizing operation to discriminate counter means in said circuit and to discriminate the clock information in said circuit on the basis of the information of the discriminated counter means.

2. A timing analysis method according to claim 1,
   wherein said clock information recognizing operation has an operation to discriminate an asynchronous transfer path between a synchronous circuit portion and an asynchronous circuit portion in said circuit and an asynchronous transfer path between synchronous circuit portions on the basis of said discriminated information.

3. A timing analysis method according to claim 1, wherein said clock information recognizing operation has a deciding operation based on said discriminated information: to discriminate logic elements constructing a clock gate in said circuit; to decide whether or not it is necessary to execute a setup analysis and a hold analysis of the clock gate when a plurality of signals having clock attributes are inputted to the logic elements, as discriminated by said clock information recognizing operation and constructing the clock gate; and to decide what signal of the input signals having said clock attributes the setup analysis and the hold analysis of the clock gates are to be executed with reference to.

4. A timing analysis method according to claim 1, wherein, said clock information recognizing operation further discriminates logic elements constructing a clock gate in said circuit on the basis of said discriminated information, and wherein said static-dynamic timing analysis dividing operation further includes a recognizing operation to discriminating whether or not the input signal with no clock attribute and to the logic elements constructing said clock gate belongs to a multi-cycle path.

5. A timing analysis method according to claim 1, wherein said clock information recognizing operation further discriminates logic elements constructing a clock selecting logic in said circuit on the basis of said discriminated information.

6. A timing analysis method according to claim 1, wherein said static-dynamic timing analysis dividing operation further includes a setting operation based on said information, as discriminated by said clock information recognizing operation: to decide whether or not a virtual clock can be defined with respect to flip-flops and latches which are fed at clock terminals thereof with a signal other than the clock; and to set the virtual clock with respect to such flip-flops and latches fed at their clock terminals with the signal other than the clock as decided capable to define the virtual clock.

7. A timing analysis method according to claim 1, wherein said static-dynamic timing analysis dividing operation further includes an applying circuit portion recognizing operation to discriminate a static timing analysis applying circuit portion and a dynamic timing analysis applying circuit portion in said circuit on the basis of the information discriminated by said clock information recognizing operation.

8. A timing analysis method according to claim 7, wherein said applying circuit portion recognizing operation recognizes the dynamic timing analysis applying circuit portion so far as to cover the appearance of flip-flop along transmission paths of signals to the discriminated dynamic timing analysis applying circuit portion.

9. A timing analysis method according to claim 7, wherein said applying circuit portion recognizing operation recognizes the correspondence between said discriminated dynamic timing analysis applying circuit portion and a logic hierarchy in said circuit.

10. A timing analysis method according to claim 7, wherein said applying circuit portion recognizing operation: discriminates flip-flops and latches outside of said dynamic timing analysis applying circuit portion along transmission paths of the signal from the flip-flop, as the closest to the input terminals and the output terminals of the discriminated static timing analysis applying circuit portion, in the dynamic timing analysis applying circuit portion; and adjusts propagation delay of the clock signal to the flip-flop and latch discriminated by said discriminating operation, such that the dynamic timing analysis can be made merely by applying it as the propagation delay of the clock signal to said dynamic timing analysis applying circuit portion and the flip-flops and latches in said dynamic timing analysis applying circuit portion at a time of feeding said circuit with the delay information.

11. A timing analysis method comprising:

a first operation to discriminate a counter unit in an object circuit;

a second operation to discriminate clock information in the object circuit on the basis of the information of the discriminated counter unit;

a third operation to discriminate a static timing analysis applying circuit portion and a dynamic timing analysis applying circuit portion in the object circuit on the basis of the discriminated clock information;

a fourth operation to perform the static timing analysis on the basis of the result of said third operation; and a fifth operation to perform the dynamic timing analysis on the basis of the result of said third operation.

12. A storage medium capable of being read by a computer and stored with a program for causing the computer to execute:

a first operation to discriminate a counter unit in an object circuit to be subjected to a timing analysis;

a second operation to discriminate clock information in the object circuit on the basis of the information of the discriminated counter unit;

a third operation to discriminate a static timing analysis applying circuit portion and a dynamic timing analysis applying circuit portion in the object circuit on the basis of the discriminated clock information;

a fourth operation to perform the static timing analysis on the basis of the result of said third operation; and a fifth operation to perform the dynamic timing analysis on the basis of the result of said third operation.

* * * * *